(12) United States Patent
Asmussen et al.

(10) Patent No.: US 9,890,457 B2
(45) Date of Patent: Feb. 13, 2018

(54) MICROWAVE PLASMA REACTORS

(75) Inventors: Jes Asmussen, East Lansing, MI (US);
Yajun Gu, Okemos, MI (US); Timothy A. Grotjohn, Okemos, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 583 days.

(21) Appl. No.: 14/117,213

(22) PCT Filed: May 11, 2012

(86) PCT No.: PCT/US2012/037555
§ 371 (c)(1),
(2), (4) Date: Nov. 12, 2013

(87) PCT Pub. No.: WO2012/158532
PCT Pub. Date: Nov. 22, 2012

(65) Prior Publication Data
US 2014/0220261 A1    Aug. 7, 2014

Related U.S. Application Data

(63) Continuation-in-part of application No. 12/456,388, filed on Jun. 16, 2009, now Pat. No. 8,316,797.
(Continued)

(51) Int. Cl.
*C23C 16/00* (2006.01)
*C23F 1/00* (2006.01)
(Continued)

(52) U.S. Cl.
CPC .......... *C23C 16/517* (2013.01); *C23C 16/511* (2013.01); *C30B 25/105* (2013.01);
(Continued)

(58) Field of Classification Search
USPC ............ 118/723 MW, 728–730; 156/345.41, 156/345.51–345.55
See application file for complete search history.

(56) References Cited

U.S. PATENT DOCUMENTS 3,762,794 A   10/1973 Arnaud
4,777,336 A   10/1988 Asmussen
(Continued)

FOREIGN PATENT DOCUMENTS

WO   WO-2012/084655 A2   6/2012
WO   WO-2012/084660 A1   6/2012

OTHER PUBLICATIONS

Asmussen et al., "Microwave Plasma Reactor Design for Diamond Synthesis at High Pressures and High Power Densities," 37th IEEE International Conference on Plasma Science, Norfolk, Jun. 20-24 (2010).
(Continued)

*Primary Examiner* — Rakesh Dhingra
(74) *Attorney, Agent, or Firm* — Marshall, Gerstein & Borun LLP

(57) ABSTRACT

Microwave plasma assisted reactors, for example chemical vapor deposition (MPCVD) reactors, are disclosed. The disclosed reactors operate at high pressures (>180-320 Torr) and high power densities (>150 W/cm3), and thereby enable high deposition rate CVD processes that rapidly deposit materials. In particular, reactor design examples are described that, when operating in the 180-320 Torr pressure regime, rapidly CVD synthesize high quality polycrystalline (PCD) and single crystal diamond (SCD). The improved reactors include a radial contraction in the vicinity of the plasma chamber (and optionally a combined expansion in the vicinity of the electromagnetic wave source, followed by the contraction) in the main microwave chamber as electro-
(Continued)

magnetic energy propagates from an electromagnetic wave source to a plasma/deposition chamber.

11 Claims, 31 Drawing Sheets

Related U.S. Application Data

(60) Provisional application No. 61/518,900, filed on May 13, 2011, provisional application No. 61/132,179, filed on Jun. 16, 2008, provisional application No. 61/268,061, filed on Jun. 8, 2009.

(51) Int. Cl.
| | |
|---|---|
| *H01L 21/306* | (2006.01) |
| *C23C 16/517* | (2006.01) |
| *C23C 16/511* | (2006.01) |
| *H01J 37/32* | (2006.01) |
| *C30B 25/10* | (2006.01) |

(52) U.S. Cl.
CPC .. *H01J 37/32192* (2013.01); *H01J 37/32229* (2013.01); *H01J 37/32256* (2013.01); *H01J 37/32807* (2013.01); *H01J 2237/32* (2013.01)

(56) References Cited

U.S. PATENT DOCUMENTS

| | | | | |
|---|---|---|---|---|
| 4,876,983 | A | * | 10/1989 | Fukuda ................ C23C 16/511 118/500 |
| 4,940,015 | A | | 7/1990 | Kobashi et al. |
| 4,943,345 | A | | 7/1990 | Asmussen et al. |
| 5,134,965 | A | * | 8/1992 | Tokuda ............. C23C 16/45502 118/715 |
| 5,311,103 | A | | 5/1994 | Asmussen et al. |
| 5,571,577 | A | | 11/1996 | Zhang et al. |
| 5,603,771 | A | | 2/1997 | Seiberras et al. |
| 5,611,864 | A | | 3/1997 | Kimura et al. |
| 5,645,645 | A | | 7/1997 | Zhang et al. |
| 5,736,818 | A | | 4/1998 | Ulczynski et al. |
| 5,804,033 | A | | 9/1998 | Kanai et al. |
| 5,861,601 | A | * | 1/1999 | Sato .................. H01J 37/32192 204/298.37 |
| 5,954,882 | A | | 9/1999 | Wild et al. |
| 6,057,645 | A | | 5/2000 | Srivastava et al. |
| 6,072,167 | A | | 6/2000 | Lewis et al. |
| 6,077,787 | A | | 6/2000 | Reinhard et al. |
| 6,622,650 | B2 | | 9/2003 | Ishii et al. |
| 6,646,224 | B2 | | 11/2003 | Ishii et al. |
| 7,166,170 | B2 | | 1/2007 | Fink |
| 7,171,919 | B2 | | 2/2007 | Sohn et al. |
| 8,316,797 | B2 | | 11/2012 | Asmussen et al. |
| 8,668,962 | B2 | | 3/2014 | Asmussen et al. |
| 2002/0122757 | A1 | | 9/2002 | Chung et al. |
| 2003/0152700 | A1 | | 8/2003 | Asmussen et al. |
| 2003/0178143 | A1 | * | 9/2003 | Perrin ................ H01J 37/32192 156/345.41 |
| 2004/0134431 | A1 | | 7/2004 | Sohn et al. |
| 2005/0202173 | A1 | | 9/2005 | Mills |
| 2008/0011232 | A1 | | 1/2008 | Rius et al. |
| 2009/0239078 | A1 | | 9/2009 | Asmussen et al. |
| 2010/0034984 | A1 | * | 2/2010 | Asmussen ............ C23C 16/274 427/575 |
| 2013/0069531 | A1 | | 3/2013 | Asmussen et al. |

OTHER PUBLICATIONS

Asmussen et al., "The Design of a Microwave Plasma Cavity," Proceedings of the IEEE 62:109-117 (1974).
Brandenburg et al., "The Microwave Electro-Thermal (MET) Thruster Using Water Vapor Propellant," IEEE Transaction on Plasma Sci., 33(2): 776-782 (2005).
Diament et al., "Microwave Electrothermal Thruster Performance," J. of Propulsion and Power, 23:27-34 (2007).
Füner et al., "Novel microwave Plasma Reactor for Diamond Synthesis," Appl. Phys. Lett., 72:1149-1151 (1998).
Grotjohn et al., "Electron Density in Moderate Pressure Diamond Deposition Discharges," Diamond & Related Mater., 9:322-327 (2000).
Grotjohn et al., "Microwave Plasma—Assisted Diamond Synthesis over Large Areas at High Rates," Invited Paper, presented at the 7th International Workshop, Strong Microwaves: Sources and Applications Jul. 27-Aug. 2 (2008).
Gu et al., "Microwave Plasma Reactor Design for High Pressure and High Power Density Diamond Synthesis," 2011 International Conference on New Diamond and Nano Carbons, Japan, May 16-20, 2011.
Gu et al., "Microwave Plasma Reactor Design for High Pressure and High Power Density Diamond Synthesis," Diamond & Related Mater., 24:210-214 (2012).
Gu et al., "Microwave Plasma-assisted Reactor Design for High Power Densities, Large Deposition," Presented at the New Diamond and Nano Carbons Conference, Traverse City, Michigan, Jun. 7-11, 2009.
Hemawan et al., "High Pressure Microwave Plasma Assisted CVD Synthesis of Diamond," 35th IEEE International Conference on Plasma Science, ICOPS (2008).
Hemawan et al., "High Pressure Microwave Plasma Assisted CVD Synthesis of Diamond," Presented at the New Diamond and Nano Carbons Conference, Traverse City, Michigan, Jun. 7-11 (2009).
Hemawan et al., "Improved Microwave Plasma Cavity Reactor for Diamond Synthesis at High-Pressure and High Power Density," Diamond & Related Mater., 19(12):1446-1452 (2010).
Kamo et al., "Epitaxial Growth of Diamond on Diamond Substrate by Plasma Assisted CVD," Appl. Surf. Sci. 33/44:553-560 (1988).
King et al., "Scaling the Microwave Plasma-Assisted Chemical Vapor Diamond Deposition Process to 150-200 mm Substrates,", Diamond & Related Materials 17:520-524 (2008).
Kuo et al., "An Experimental Study of High Pressure Synthesis of Diamond Films Using a Microwave Cavity Plasma Reactor," Diamond & Related Mater. 6:1097-1105 (1997).
Lu et al., "High Pressure Single Crystal Diamond Synthesis With Nitrogen Addition by MPACVD," Presented at the New Diamond and Nano Carbons Conference, Traverse City, Michigan, Jun. 7-11, 2009.
Mallavarpu et al., "Behavior of a Microwave Cavity Discharge Over a Wide Range of Pressures and Flow Rates," IEEE Transaction on Plasma Sci., PS-6(4):341-354 (1978).
McCauley et al., "Homoepitaxial Diamond Film Deposition on a Brilliant Cut Diamond Anvil," Appl. Physics. Lett. 66:1486-1488 (1995).
Mokuno et al., "Synthesizing Single-Crystal Diamond by Repetition of High Rate Homoepitaxial Growth by Microwave Plasma CVD," Diamond & Related Mater., 14:1743-1746 (2005).
Offermans, "Electrodeless High-power Microwave Discharges", J Appl Phys. 67(1):115-123 (1990).
Silva et al., "Microwave engineering of plasma-assisted CVD reactors for diamond deposition," J. Phys.: Condensed Matter, vol. 21, p. 1-16 (Aug. 19, 2009).
Sternschulte et al., "Comparison of MWPCVD Diamond Growth at Low and High Process Gas Pressures," Diamond & Related Mater., 15:542-547 (2006).
Tallaire et al., "Homoepitaxial Deposition of High-Quality Thick Diamond Films: Effect of Growth Parameters," Diamond & Related Mater., 14:249-254 (2005).
Teraji et al., "Chemical Vapor Deposition of Homoepitaxial Diamond Films," Phys. Stat. Sol.(A) 203:3324-3357 (2006).
Vikharev et al., "Microcrystalline Diamond Growth in Presence of Argon in Millimeter-Wave Plasma-Assisted CVD Reactor," Diamond & Related Mater., 17:1055-1061 (2008).
Whitehair et al., "Microwave Electrothermal Thruster Performance in Helium Gas," J. Propulsion and Power, 3:136-144 (1987).
Yamada et al., "Numerical Analyses of a Microwave Plasma Chemical Vapor Deposition Reactor for Thick Diamond Synthesis," Diamond & Related Mater., 15:1389-1394 (2006).

(56) References Cited

OTHER PUBLICATIONS

Yamada et al., "Numerical and Experimental Studies of High Growth-Rate Over Area with 1-inch in Diameter under Moderate Input-Power by Using MWPCVD," Diamond & Related Mater., 17:1062-1066 (2008).
Yamada et al., "Predominant Physical Quantity Dominating Macroscopic Surface Shape of Diamond Synthesized by Microwave Plasma CVD," Diamond & Related Mater., 16:576-580 (2007).
Yamada et al., "Simulation of Temperature and Gas Flow Distributions in Region Close to a Diamond Substrate with Finite Thickness," Diamond & Related Mater., 15:1738-1742 (2006).
Yan et al., "Very High Growth Rate Chemical Vapor Deposition of Single-Crystal Diamond," Proc. Natl. Acad. Sci. U. S. A. 99:12523 (2002).
Zuo et al., "Investigation of Diamond Deposition Uniformity and Quality for Freestanding Film and Substrate Applications," Diamond & Related Mater., 17:300-305 (2008).
International Search Report and Written Opinion for Application No. PCT/US2012/037555, dated Jul. 27, 2012.
Supplementary European Search Report for European Application No. EP 12785030.3 dated Sep. 30, 2014.

\* cited by examiner

C D E (a)                  (b)

MICROWAVE PLASMA REACTORS

CROSS-REFERENCE TO RELATED APPLICATIONS

This application is a national stage entry of International Application No. PCT/US2012/037555, filed May 11, 2012, which claims the priority benefit of U.S. Provisional Application No. 61/518,900, filed May 13, 2011, which is incorporated herein by reference in its entirety. This application further is a continuation-in-part of U.S. application Ser. No. 12/456,388, filed Jun. 16, 2009 now U.S. Pat. No. 8,316,797, which in turn claims the priority benefit of U.S. Provisional Application Nos. 61/132,179, filed Jun. 16, 2008 and 61/268,061, filed Jun. 8, 2009, all of which are incorporated herein by reference in their entireties.

BACKGROUND OF THE DISCLOSURE

Field of the Disclosure

The disclosure relates to the development of new and improved microwave plasma assisted reactors, for example chemical vapor deposition (MPCVD) reactors. Relative to conventional microwave plasma assisted reactors, the reactors according to the disclosure operate over larger substrate areas, operate at higher pressures, and operate at higher discharge absorbed power densities with the goal toward increased diamond synthesis rates (carats per hour) and increased deposition uniformity.

Brief Description of Related Technology

Early investigations of chemical vapor deposition (CVD) of diamond employed low power density microwave discharges/reactors (i.e., <5 W/cm$^3$) that were operated within the low-pressure regime (i.e., 20 Torr to 100 Torr) and used 1% -5% $CH_4/H_2$ input gas mixtures [1, 2]. Both polycrystalline and single crystal films were synthesized with deposition rates that increased from less than 1 µm/h at very low methane concentrations (<1%) to a maximum of a few micron/hour as methane concentrations were increased to 5%. However, high-quality films could only be produced under low methane input conditions (<1%) and, as a result, diamond growth rates were very low (i.e., less than about 1 µm/h). Attempts to increase the growth rate by increasing the input methane concentrations led to the development of defects such as secondary nucleation and unepitaxial crystallites. While these results were of scientific interest [2], the very low growth rates limited the commercial potential of microwave plasma assisted CVD (MPCVD) synthesis of diamond. Thus, in the mid 1990's, an important scientific and engineering challenge and opportunity that remained unsolved was to discover and develop diamond synthesis methods that dramatically increase the deposition rates while still producing excellent crystalline quality.

During the mid 1990's and early 2000's, several research groups [3, 5-7] searched for improved diamond synthesis methods. Their experiments, which synthesized both polycrystalline and single crystalline materials, utilized high power density (i.e., 50 W/cm$^3$ to 100 W/cm$^3$) microwave discharges operating at moderate pressures between 100 Torr and 180 Torr. Good quality polycrystalline diamond (PCD) was deposited at 4 µm/h to 10 µm/h [6-7] and single crystalline diamond (SCD) was produced at rates of 50 µm/h to 100 µm/h with the addition of nitrogen to enhance the deposition rate [3, 5]. These growth rates were higher by a factor of 5 to 100 times than the growth rates for good quality CVD-synthesized diamond that was obtained in the early 1990's using low pressure microwave discharges.

Asmussen et al. U.S. Pat. Nos. 5,311,103, 5,571,577, and 6,077,787, incorporated herein by reference in their entireties relate to microwave cavity plasma reactors (MCPRs) and related methods. Asmussen et al. U.S. Publication No. 2009/0239078, incorporated herein by reference in its entirety, relates to a microwave plasma deposition process and apparatus for producing diamond, preferably as single crystal diamond (SCD). The process and apparatus enables the production of multiple layers of the diamond by the use of an extending device to increase the length and the volume of a recess in a holder containing a SCD substrate as layers of diamond are deposited.

Objects

One of the objects is to provide an apparatus and methods for the microwave plasma assisted deposition of diamond that are able to provide both increased deposition rates and excellent crystalline quality for polycrystalline and single crystal diamond.

These and other objects may become increasing apparent by reference to the following description.

SUMMARY

The disclosure generally relates to apparatus for providing microwaves confined in a series of cavities (e.g., whether having a circular, elliptical, or other cross section in a plane perpendicular to the general direction of microwave propagation). The apparatus can be used in any environment where it is desirable to provide a focused, high-intensity source of electromagnetic microwave energy, for example as an applicator in a microwave plasma assisted reactor.

In one aspect, the disclosure relates to a microwave plasma assisted reactor comprising: (a) a first microwave chamber having a reference plane at a reference axial location $Z_0$, extending in an axial direction $z>Z_0$, and having a circular cross section with a radius $R1(z)$ that varies as a function of the axial position z, wherein the first microwave chamber comprises: (i) a first waveguide portion positioned adjacent the reference axial location $Z_0$, (ii) a second waveguide portion positioned adjacent the first waveguide portion such that the first waveguide portion is positioned between the second waveguide portion and the reference axial location $Z_0$, where the radius $R1(z)$ of the first microwave chamber in the first waveguide portion is less than the radius $R1(z)$ of the first microwave chamber in the second waveguide portion; (iii) a third waveguide portion positioned adjacent the second waveguide portion such that the second waveguide portion is positioned between the third waveguide portion and the first waveguide portion, where the radius $R1(z)$ of the first microwave chamber in the third waveguide portion is less than the radius $R1(z)$ of the first microwave chamber in the second waveguide portion; and (iv) an electromagnetic wave source; wherein at least one of the first waveguide portion and the third waveguide portion comprises a cylindrical waveguide section with the radius $R1(z)$ as a constant value in the cylindrical waveguide section; (b) a plasma chamber having an outer wall, the plasma chamber extending into the first waveguide portion of the first microwave chamber such that at least a portion of the plasma chamber is located at $z>Z_0$ and optionally at least a portion of the plasma chamber is located at $z<Z_0$; (c) a conductive stage having a reference surface extending into the plasma chamber and optionally defining a second microwave chamber in the plasma chamber (i) at $z<Z_0$ and (ii) between the plasma chamber outer wall and the conductive stage; and (d) optionally a conducting short disposed in the second microwave chamber and in electrical contact with the plasma chamber outer wall and the conductive stage, the axial distance between the conducting short and $Z_0$ being L2, and the axial distance between the conducting short and the reference surface of the conductive stage being L1.

Various refinements and embodiments of the microwave plasma assisted reactor are possible.

In another aspect, the disclosure relates to a microwave plasma assisted reactor comprising: (a) a first microwave chamber having a reference plane at a reference axial location $Z_0$ and extending in an axial direction $z>Z_0$, wherein the first microwave chamber comprises: (i) a first cylindrical waveguide section positioned adjacent the reference axial location $Z_0$, extending in the axial direction $z>Z_0$ away from the reference axial location $Z_0$, and having a radius of R1$a$; (ii) a second cylindrical waveguide section positioned adjacent the first cylindrical waveguide section, extending in the axial direction $z>Z_0$ away from the first cylindrical waveguide section, and having a radius of R1$b$ such that R1$b$/R1$a$ is greater than 1; and (iii) an electromagnetic wave source; (b) a plasma chamber having an outer wall defining a cylindrical cross section with radius of R2, the plasma chamber extending into the first cylindrical waveguide section of the first microwave chamber such that at least a portion of the plasma chamber is located at $z>Z_0$ and optionally at least a portion of the plasma chamber is located at $z<Z_0$; (c) a conductive stage defining a cylindrical cross section with radius of R3 and having a reference surface extending into the plasma chamber, the conductive stage optionally defining a second microwave chamber in the plasma chamber (i) at $z<Z_0$ and (ii) between the plasma chamber outer wall and the conductive stage; and (d) optionally a conducting short disposed in the second microwave chamber and in electrical contact with the plasma chamber outer wall and the conductive stage, the axial distance between the conducting short and $Z_0$ being L2, and the axial distance between the conducting short and the reference surface of the conductive stage being L1; wherein R3/R2 is 0.5 or less.

Various refinements and embodiments of the microwave plasma assisted reactor are possible. For example, the first microwave chamber can comprise a curved waveguide section such that the radius R1($z$) varies as a continuous function of the axial position z in the curved waveguide section. In an embodiment, the first microwave chamber comprises a plurality of interconnected cylindrical waveguide sections such that the radius R1($z$) varies as a stepwise function of the axial position z. In another embodiment, the plasma chamber and the conductive stage have cylindrical cross sections with radii of R2 and R3, respectively, such that R3/R2 is 0.5 or less.

In a refinement, the geometry of the first microwave chamber including the first waveguide portion, the second waveguide portion, and the third waveguide portion is selected such that during operation of the reactor: (A) electromagnetic energy from the electromagnetic wave source is defocused and directed radially outwardly from the third waveguide portion and into the second waveguide portion, thereby reducing or preventing the occurrence of a plasma discharge in the first microwave chamber and outside the plasma chamber; and (B) the electromagnetic energy from the electromagnetic wave source is refocused and directed radially inwardly from the second waveguide portion and into the first waveguide portion and into the plasma chamber, thereby forming a higher intensity plasma discharge relative to a microwave plasma assisted reactor without a refocusing contraction, the plasma discharge being spatially focused in the vicinity of the reference axial location $Z_0$ and the reference surface of the conductive stage.

In another refinement, the (i) first microwave chamber further comprises an upper conducting short in electrical contact with the third waveguide portion and disposed in an upper portion of the third waveguide portion at an axial distance $L_s$ above $Z_0$, the upper conducting short having a central opening and defining an upper boundary of the first microwave chamber; and (ii) the electromagnetic wave source comprises a coaxial excitation probe extending through the central opening of the upper conducting short and into the third waveguide portion by an axial distance $L_p$ relative to the upper boundary of the first microwave chamber.

In another aspect, the disclosure relates to an apparatus for providing microwaves confined in a series of cavities, the apparatus comprising: (a) a first microwave cavity comprising an electromagnetic wave source for providing focused microwaves to the first microwave cavity; (b) a second microwave cavity mounted adjacent the first microwave cavity, wherein the second microwave cavity defocuses the focused microwaves in the first microwave cavity to provide defocused microwaves in the second microwave cavity; and (c) a third microwave cavity mounted adjacent the second microwave cavity, wherein the third microwave cavity refocuses the defocused microwaves in the second microwave cavity to provide focused microwaves in the third microwave cavity; wherein at least one of the first microwave cavity and the third microwave cavity has a cylindrical shape defining an axial direction corresponding to a direction of microwave propagation through the apparatus. In a refinement, the apparatus further comprises (d) a microwave-transparent chamber positioned within the third microwave cavity and adapted to contain a substrate to be treated by the focused microwaves in the third microwave cavity, for example where the apparatus is adapted to generate a plasma adjacent a surface of a substrate positioned in the microwave-transparent chamber.

Various refinements and embodiments of the microwave plasma assisted reactor are possible. In a refinement, (i) the first cylindrical waveguide section has a height H1$a$ and the second cylindrical waveguide section has a height H1$b$; and (ii) the radii R1$a$, R1$b$ and the heights H1$a$, H1$b$ are selected such that during operation of the reactor: (A) electromagnetic energy from the electromagnetic wave source is defocused and directed radially outwardly in the second cylindrical waveguide section, thereby reducing or preventing the occurrence of a plasma discharge in the first microwave chamber and outside the plasma chamber; and (B) the electromagnetic energy from the electromagnetic wave source is refocused and directed radially inwardly in the first cylindrical waveguide section and in the plasma chamber, thereby forming a higher intensity plasma discharge relative to a microwave plasma assisted reactor without a refocusing contraction, the plasma discharge being spatially focused in the vicinity of the reference axial location $Z_0$ and the reference surface of the conductive stage. In another refinement, geometric scales of the reactor are configured such that, during operation of the reactor, electromagnetic fields are produced in the vicinity of $Z_0$ and in the plasma chamber, the electromagnetic fields comprising one or more of a $TM_{01}$ mode, a $TM_{02}$ mode, a TEM mode, and evanescent modes symmetric about the axial direction z.

In another aspect, the disclosure relates to a reactor kit comprising a microwave plasma assisted reactor according to any of the various reactor embodiments, wherein the first microwave chamber comprises a plurality of separate, interconnected chamber sections each having a different radius and corresponding to a waveguide portion or section of the first microwave chamber (e.g., where the kit can include a plurality of chamber sections (of varying height and radius) in excess of that required to assemble the first microwave chamber such that the first microwave chamber can be disassembled and reassembled using interchangeable chamber sections to have a desired focusing/defocusing geometry for a given application).

In another aspect, the disclosure relates to a process for depositing a component on a substrate, the process comprising: (a) providing a microwave plasma assisted reactor according to any of the various reactor embodiments, the reactor further comprising a deposition substrate mounted above an upper surface of the conductive stage; (b) operating the reactor at a pressure ranging from about 10 Torr to about 3 atm to generate a plasma discharge in the plasma chamber; and (c) depositing a component on the substrate.

Various refinements and embodiments of the deposition process are possible. In a refinement, (i) operating the reactor comprises feeding a source gas comprising a hydrogen source gas and a carbon source gas to the plasma chamber; and (ii) the component is selected from the group consisting of single-crystal diamond, microcrystalline polycrystalline diamond, nanocrystalline polycrystalline diamond, and combinations thereof. In another refinement, during parts (b) and (c) of operating the reactor and depositing the component on the substrate, electromagnetic fields are produced in the vicinity of $Z_0$ and the deposition substrate in the plasma chamber, the electromagnetic fields comprising one or more of a $TM_{01}$ mode, a $TM_{02}$ mode, a TEM mode, and evanescent modes symmetric about the axial direction z.

Microwave plasma assisted synthesis of diamond is disclosed using high purity input gas chemistries (e.g., about 2 mol. % to about 5 mol. % $CH_4$ relative to $H_2$) and high operating pressures (e.g., about 180 Torr to about 260 Torr). A microwave cavity plasma reactor (MCPR) was designed to be experimentally adaptable and tunable to enable operation with high input microwave plasma absorbed power densities within the higher pressure regime. The reactor design produced intense microwave discharges with variable absorbed power densities of about 150 W/cm$^3$ to about 550 W/cm$^3$ and allowed the control of the plasma discharge (e.g., size, shape), thereby allowing for process optimization. Uniform polycrystalline diamond films were synthesized on 2.54 cm-diameter silicon substrates at substrate temperatures ranging from about 800° C. to about 1200° C. The deposition rates ranged from about 3 µm/h to about 21 µm/h (and higher) and increased as the operating pressure and the methane feed concentrations increased. Thick, transparent, freestanding diamond films were synthesized, and Raman and FTIR measurements indicated the synthesis of high quality diamond. Optical quality films were produced with methane concentrations as high as 4% and at growth rates of about 12 µm/h to about 14 µm/h. In particular, the experimental methane feed concentration range (or "methane window") in which high quality optical diamond films could be synthesized increased as pressure and power density increased, resulting in the synthesis of high quality diamond films at rates that were about 6 to about 7 times faster than the equivalent optical films grown at lower pressures and with lower absorbed power densities. Single crystal diamond films also were synthesized on 3.5 mm×3.5 mm single crystal diamond seed substrates at substrate temperatures ranging from about 950° C. to about 1250° C. and at deposition rates ranging from about 8 µm/h to about 13 µm/h with a 3% $CH_4/H_2$ feed. With the addition of small amounts of a nitrogen source gas to 5% $CH_4/H_2$ feed, deposition rates increase up to about 75 µm/h and beyond.

Growth rates can be increased by carrying out the deposition process at operating pressures above 100 Torr and by using high power density microwave discharges [8-12]. It is speculated that by increasing the deposition pressure beyond 180 Torr and by increasing the discharge power density, that diamond growth rates can be increased considerably further while yielding good quality diamond. Research groups [11-16] are exploring new designs and process methods for higher pressure and higher power density MPACVD machines.

The apparatus and methods disclosed herein are directed to the MPCVD diamond synthesis at high pressures (e.g., about 180 Torr and above) and at high discharge power densities (e.g., about 150 W/cm$^3$ and above). A specific generic reactor geometry [6, 21] is identified as the microwave cavity plasma reactor (MCPR). When operated in the 100 Torr to 160 Torr pressure regime this reactor has synthesized high quality and high growth rate CVD polycrystalline diamond material [6, 7, 20, 21]. In this disclosure, an improved reactor is designed to operate with high power densities at pressures of about 180 Torr and above. The improved reactor is experimentally characterized over a high pressure regime by synthesizing PCD and SCD films.

Disclosed herein is a microwave plasma assisted reactor comprising: (a) a first microwave chamber having a reference plane at a reference axial location $Z_0$, the first microwave chamber comprising an electromagnetic wave source and extending in an axial direction $z>Z_0$; (b) a plasma chamber having an outer wall, the plasma chamber extending into the first microwave chamber such that at least a portion of the plasma chamber is located at $z>Z_0$ and at least a portion of the plasma chamber is located at $z<Z_0$ (e.g., the microwave chamber and a base portion of the plasma chamber are structurally coupled at the $Z_0$ plane); (c) a conductive stage having a reference surface extending into the plasma chamber and defining a second microwave chamber in the plasma chamber (i) at $z<Z_0$ (or at axial positions below the reference surface) and (ii) between the plasma chamber outer wall and the conductive stage; (d) a conducting short disposed (e.g., adjustably disposed) in the second microwave chamber and in electrical contact with the plasma chamber outer wall and the conductive stage, the axial distance between the conducting short and $Z_0$ being L2, and the axial distance between the conducting short and the reference surface of the conductive stage being L1; wherein L2 and L1 are capable of adjustment in the reactor by moving the conducting short, such that different microwave modes are produced in the first microwave chamber (e.g., at $z>Z_0$) and in the second microwave chamber (e.g., at $z<Z_0$) during operation of the reactor. During operation of the reactor, evanescent microwave fields generally are produced in the vicinity of $Z_0$, and the evanescent microwave fields are distinct from the microwave modes in the first microwave chamber and in the second microwave chamber. In a refinement, the conductive stage is movable such that both L1 and L2 are capable of independent adjustment during operation of the reactor by moving one or both of the conducting short and the conductive stage. For example, one or both of the conducting short and the conductive stage can be slidable in an axial direction. In an embodiment, the first microwave chamber, the plasma chamber, and the conductive stage have a cylindrical cross section (e.g., with radii of R1, R2, and R3, respectively), although other geometric cross sections are possible (e.g., square, rectangular). The ratio R3/R2 is suitably about 0.5 (or 0.4, 0.3, or 0.2) or less and/or about 0.05 (or 0.1 or 0.2) or more. The reactor is capable of producing a plasma having a power density ranging from about 160 W/cm$^3$ to about 600 W/cm$^3$ in the plasma chamber when the electromagnetic wave source provides an excitation frequency of about 2.45 GHz and an operating pressure in the plasma chamber ranges from about 180 Torr to about 260 Torr.

In another embodiment, a microwave plasma assisted reactor comprises: (a) a cylindrical chamber defining an interior cylindrical microwave chamber of radius R1 and having (i) a central axis, (ii) a lower boundary at a reference axial location $Z_0$, and (iii) a upper boundary at an axial location $Z_U > Z_0$; and (b) a base defining an interior base cavity of radius R2 and having (i) an upper boundary adjacent the cylindrical chamber at $Z_0$ and (ii) a lower portion extending axially downwardly in a direction $z < Z_0$; (c) an upper conducting short in electrical contact with the cylindrical chamber and disposed in an upper portion of the cylindrical chamber at an axial distance $L_s$ above $Z_0$, the upper conducting short having a central opening and defining the upper boundary of the cylindrical chamber; (d) an excitation probe extending through the central opening of the upper conducting short and into the upper portion of the cylindrical microwave chamber by an axial distance $L_p$ relative to the upper boundary of the cylindrical chamber; (e) a coaxial stage having a radius R3 and an upper surface extending at least into the base cavity and optionally into a bottom portion of the cylindrical microwave chamber, the coaxial stage defining a coaxial microwave chamber between R3 and R2 in the base cavity; (f) a lower conducting short adjustably disposed in the coaxial microwave chamber below $Z_0$ and in electrical contact with the base and the coaxial stage, the axial distance between the lower conducting short and $Z_0$ being L2 and the axial distance between the lower conducting short and the upper surface of the coaxial stage being L1; (g) a quartz bell jar mounted on the base and defining a plasma chamber in the bottom portion of the cylindrical microwave chamber and the coaxial microwave chamber; (h) a feed gas inlet in fluid connection with the plasma chamber; and, (i) an effluent gas outlet in fluid connection with the plasma chamber; wherein L2 and L1 are capable of adjustment in the reactor by moving the lower conducting short. The ratio R3/R2 is suitably about 0.5 (or 0.4, 0.3, or 0.2) or less and/or about 0.05 (or 0.1 or 0.2) or more.

Various refinements to the reactor are possible. In an embodiment, the coaxial stage is movable such that both L1 and L2 are capable of independent adjustment during operation of the reactor by moving one or both of the lower conducting short and the coaxial stage. In another embodiment, the lower conducting short has an annular disk shape and is slidable in an axial direction; suitably, the coaxial stage is movable and slidable in the axial direction as well. The reactor can additionally comprise (h) one or more shim inserts axially interposed between the base and the lower conducting short; wherein the lower conducting short has a disk shape and is adjustably located in an axial direction based on the number and size of shim inserts interposed between the base and the lower conducting short. Thus, both L1 and L2 can be independently adjusted in the reactor by independently selecting the number of shim inserts and the axial height of the coaxial stage (e.g., by selecting cylindrical stages of varying height, by selecting substrate holders of varying thickness). In an embodiment, at least one of the upper conducting short and the excitation probe (preferably both) is movable (e.g., slidable) and capable of (independent) adjustment during operation of the reactor.

In a suitable 2.45 GHz reactor, R1 ranges from about 6 cm to about 12 cm or 15 cm (e.g., about 6 cm to about 18 cm, about 8.9 cm); R2 ranges from about 5 cm to about 10 cm or 12 cm (e.g., about 5 cm to about 15 cm, about 7.0 cm); R3 ranges from about 0.5 cm to about 5 cm or 7 cm (e.g., about 0.5 cm to about 8 cm, about 0.95 cm, about 1.9 cm, or about 4.1 cm); $L_s$ ranges from about 15 cm to about 25 cm; $L_p$ ranges from about 2 cm to about 5 cm; and/or L1 and L2 independently range from about 4 cm to about 8 cm. At 2.45 GHz operating pressure can range from about 100 Torr to about 400 Torr (e.g., about 180 Torr to about 260 Torr) and the reactor power density can range from about 100 W/cm$^3$ to about 1000 W/cm$^3$ (e.g., about 160 W/cm$^3$ to about 600 W/cm$^3$) Alternatively, the operating pressure can range from about 50 Torr to about 150 Torr and the deposition area of the substrate having a deposition non-uniformity of 15% or less can range from about 6 cm to about 9 cm in diameter.

In a suitable 915 MHz reactor, R1 ranges from about 15 cm to about 25 cm (e.g., about 15 cm to about 40 cm, about 30 cm); R2 ranges from about 5 cm to about 30 cm (e.g., about 15 cm); R3 ranges from about 2 cm to about 20 cm (e.g., about 9.5 cm); $L_s$ ranges from about 40 cm to about 80 cm; and/or L1 and L2 independently range from about 10 cm to about 20 cm. At 915 MHz, the operating pressure can range from about 20 Torr to about 100 Torr and the deposition area of the substrate having a deposition non-uniformity of 15% or less can range from about 14 cm to about 20 cm in diameter. Alternatively, the operating pressure can range from about 100 Torr to about 160 Torr and the deposition area of the substrate having a deposition non-uniformity of 15% or less can range from about 10 cm to about 14 cm in diameter.

Also disclosed is a reactor kit including any of the above microwave plasma assisted reactors and at least one of: (a) a plurality of cylindrical chambers, each defining an interior cylindrical microwave cavity of a different radius $R_1$; (b) a plurality of bases, each defining an interior base cavity of a different radius $R_2$; and, (c) a plurality of coaxial stages, each having a different radius $R_3$; wherein the reactor can be assembled with any combination of the cylindrical chambers, the bases, and the coaxial stages such that at least one of $R_1$, $R_2$, and $R_3$ can be varied in a selected reactor assembly.

Also disclosed is a process for depositing a component on a substrate. The process comprises: (a) providing a microwave plasma assisted reactor according to any of the various embodiments, the reactor further comprising a deposition substrate mounted above an upper surface of the coaxial/conductive stage; (b) operating the reactor at a pressure ranging from about 10 Torr to about 760 Torr; (c) adjusting the axial position of the lower conducting short and optionally the coaxial stage the reactor to optimize at least one deposition property or condition (e.g., (i) a deposition area of the substrate having a deposition non-uniformity of 15% or less, (ii) a reactor power density, (iii) a component deposition rate, and/or (iv) substrate temperature); and, (d) depositing a component (e.g., single-crystal diamond or polycrystalline diamond (including microcrystalline or nanocrystalline)) on the substrate. Preferably, step (c) comprises adjusting the axial position of the (lower) conducting short and/or the conductive stage, for example during the operation of the reactor. When operating the reactor, a first electromagnetic mode $M_1$ (e.g., $TM_{013}$) in is generated in the first microwave chamber (e.g., cylindrical microwave chamber) of the reactor, a second electromagnetic mode $M_2$ (e.g., $TEM_{001}$) in is generated in the second microwave chamber (e.g., coaxial microwave chamber) of the reactor, and associated evanescent fields are formed in the vicinity of the deposition substrate, thereby forming a hybrid electromagnetic mode $M_3$ in the plasma chamber and in the vicinity of the deposition substrate. When the deposition component includes diamond, operating the reactor suitably includes feeding a source gas comprising hydrogen, methane, and optionally nitrogen, wherein the methane is present in the source gas in an amount ranging from about 1 mol. % to about 10 mol. % relative to hydrogen.

Also disclosed is a process for tuning a microwave plasma assisted reactor. The process comprises: (a) providing a microwave plasma assisted reactor according to any of the disclosed embodiments, the reactor further comprising a deposition substrate mounted above an upper surface of the conductive stage; (b) selecting a plurality of combinations of L1 and L2; (c) operating the reactor at each of the plurality of combinations of L1 and L2 and at a (pre-selected) pressure ranging from about 10 Torr to about 760 Torr to deposit a component on the substrate; (d) measuring one or more deposition properties (e.g., microwave power density, substrate temperature, deposition rate, and deposition uniformity) resulting from the operation of the reactor at each of the plurality of combinations of L1 and L2; and, (e) selecting a set of tuned L1 and L2 values based on the measured deposition properties in part (d). The plurality of combinations of L1 and L2 can be defined in various ways, for example such that L1 is held constant and L2 is parametrically varied over a plurality of values, L2 is held constant and L1 is parametrically varied over a plurality of values, and L1 and L2 are both parametrically varied over a plurality of values.

The disclosure also relates to apparatus for providing microwaves confined in a series of cavities (e.g., whether having a circular, elliptical, or other cross section in a plane perpendicular to the general direction of microwave propagation). While the apparatus are specifically described in the context of microwave plasma assisted reactors, the apparatus can be more generally used in any environment where it is desirable to provide a focused, high-intensity source of electromagnetic microwave energy. In one embodiment, the apparatus comprises (a) a first microwave cavity comprising an electromagnetic wave source for providing defocused microwaves to the first microwave cavity; (b) a second microwave cavity mounted adjacent the first microwave cavity (e.g., connected thereto), wherein the second microwave cavity refocuses the defocused microwaves in the first microwave cavity to provide focused microwaves in the second microwave cavity; and optionally (c) a microwave-transparent chamber positioned within the second microwave cavity and adapted to contain a substrate to be treated by the focused microwaves in the second microwave cavity. In another embodiment, the apparatus comprises: (a) a first microwave cavity comprising an electromagnetic wave source for providing focused microwaves to the first microwave cavity; (b) a second microwave cavity mounted adjacent the first microwave cavity (e.g., connected thereto), wherein the second microwave cavity defocuses the focused microwaves in the first microwave cavity to provide defocused microwaves in the second microwave cavity; (c) a third microwave cavity mounted adjacent the second microwave cavity (e.g., connected thereto), wherein the third microwave cavity refocuses the defocused microwaves in the second microwave cavity to provide focused microwaves in the third microwave cavity; and optionally (d) a microwave-transparent chamber positioned within the third microwave cavity and adapted to contain a substrate to be treated by the focused microwaves in the third microwave cavity. In either embodiment, the electromagnetic wave source can be an excitation probe mounted between a sliding short in electrical connection with an upper portion of the first microwave cavity opposing the second and/or third microwave cavities. In a refinement of either embodiment, the apparatus can be adapted to generate a plasma adjacent a surface of a substrate positioned in the microwave-transparent chamber (e.g., wherein the microwave-transparent chamber is configured to produce vapor-deposited diamond on the substrate).

In one aspect, the disclosure relates to a microwave plasma assisted reactor comprising: (a) a first microwave chamber having a reference plane at a reference axial location $Z_0$ and extending in an axial direction $z>Z_0$, wherein the first microwave chamber comprises: (i) a first cylindrical waveguide section positioned adjacent the reference axial location $Z_0$, extending in the axial direction $z>Z_0$ away from the reference axial location $Z_0$, and having a radius of R1$a$; (ii) a second cylindrical waveguide section positioned adjacent the first cylindrical waveguide section, extending in the axial direction $z>Z_0$ away from the first cylindrical waveguide section, and having a radius of R1$b$ such that R1$b$/R1$a$ is greater than 1; and (iii) an electromagnetic wave source; (b) a plasma chamber having an outer wall, the plasma chamber extending into the first cylindrical waveguide section of the first microwave chamber such that at least a portion of the plasma chamber is located at $z>Z_0$ and at least a portion of the plasma chamber is located at $z<Z_0$; (c) a conductive stage having a reference surface extending into the plasma chamber and defining a second microwave chamber in the plasma chamber (i) at $z<Z_0$ and (ii) between the plasma chamber outer wall and the conductive stage; and (d) a conducting short disposed in the second microwave chamber and in electrical contact with the plasma chamber outer wall and the conductive stage, the axial distance between the conducting short and $Z_0$ being L2, and the axial distance between the conducting short and the reference surface of the conductive stage being L1. In an embodiment, the second cylindrical waveguide section comprises a plurality of cylindrical waveguide sections each having a radius of R1$b_i$ (e.g., wherein R1$b_i$/R1$a$ is greater than 1 for each cylindrical waveguide section in the plurality of cylindrical waveguide sections). In another embodiment, (i) the first cylindrical waveguide section has a height H1$a$ and the second cylindrical waveguide section has a height H1$b$; and (ii) the radii R1$a$, R1$b$ and the heights H1$a$, H1$b$ are selected such that during operation of the reactor: (A) electromagnetic energy from the electromagnetic wave source is defocused and directed radially outwardly in the second cylindrical waveguide section, thereby reducing or preventing the occurrence of a plasma discharge in the first microwave chamber and outside the plasma chamber; and (B) the electromagnetic energy from the electromagnetic wave source is refocused and directed radially inwardly in the first cylindrical waveguide section and in the plasma chamber, thereby forming a higher intensity plasma discharge relative to a microwave plasma assisted reactor without a refocusing contraction, the plasma discharge being spatially focused in the vicinity of the reference axial location $Z_0$ and the reference surface of the conductive stage. In another embodiment, during operation of the reactor, hybrid electromagnetic modes are produced in the vicinity of $Z_0$ and in the plasma chamber, the hybrid electromagnetic modes comprising a $TM_{01}$ mode, a $TM_{02}$ mode, a cylindrical waveguide mode, a TEM mode, and evanescent modes symmetric about the axial direction z. In another embodiment, L2 and L1 are capable of adjustment in the reactor by moving the conducting short, such that different microwave modes are produced in the first microwave chamber and in the second microwave chamber during operation of the reactor. In another embodiment, the plasma chamber and the conductive stage have cylindrical cross sections with radii of R2 and R3, respectively, such that R3/R2 is 0.8 or 0.5 or less.

In a refinement, (i) the first microwave chamber further comprises a third coaxial waveguide section positioned adjacent the second cylindrical waveguide section, extending in the axial direction $z>Z_0$ away from the second cylindrical waveguide section, and having a radius of R1c such that R1b/R1c is greater than 1; (ii) the first microwave chamber further comprises an upper conducting short in electrical contact with the third coaxial waveguide section and disposed in an upper portion of the third coaxial waveguide section at an axial distance $L_s$ above $Z_0$, the upper conducting short having a central opening and defining an upper boundary of the first microwave chamber; and (iii) the electromagnetic wave source comprises a coaxial excitation probe extending through the central opening of the upper conducting short and into the third coaxial waveguide section by an axial distance $L_p$ relative to the upper boundary of the first microwave chamber. In an embodiment, the third coaxial waveguide section comprises a plurality of coaxial waveguide sections each having a radius of $R1c_i$ (e.g., wherein $R1b/R1c_i$ is greater than 1 for each coaxial waveguide section in the plurality of coaxial waveguide sections). For example, (i) $R1c_{i+1}/R1c_i$ is greater than 1 for each coaxial waveguide section i to n−1 in a plurality of n coaxial waveguide sections; and (ii) coaxial waveguide section i+1 having the radius $R1c_{i+1}$ is positioned closer to the reference axial location $Z_0$ relative to coaxial waveguide section i having the radius $R1c_i$. In another embodiment, (i) the first cylindrical waveguide section has a height H1a, the second cylindrical waveguide section has a height H1b, and the third coaxial waveguide section has a height H1c; and (ii) the radii R1a, R1b, R1c and the heights H1a, H1b, H1c are selected such that during operation of the reactor: (A) electromagnetic energy from the electromagnetic wave source is defocused and directed radially outwardly from the third coaxial waveguide section and into the second cylindrical waveguide section, thereby reducing or preventing the occurrence of a plasma discharge in the first microwave chamber and outside the plasma chamber; and (B) the electromagnetic energy from the electromagnetic wave source is refocused and directed radially inwardly in the first cylindrical waveguide section and in the plasma chamber, thereby forming a higher intensity plasma discharge relative to a microwave plasma assisted reactor without a refocusing contraction, the plasma discharge being spatially focused in the vicinity of the reference axial location $Z_0$ and the reference surface of the conductive stage.

In another aspect, the disclosure relates to a microwave plasma assisted reactor comprising: (a) a multi-sectioned cylindrical chamber defining an interior microwave chamber having (i) a central axis z, (ii) a lower boundary at a reference axial location $Z_0$, and (iii) a upper boundary at an axial location $Z_U>Z_0$ wherein the multi-sectioned cylindrical chamber comprises: (i) a first cylindrical waveguide section positioned adjacent the reference axial location $Z_0$, extending in the axial direction $z>Z_0$ away from the reference axial location $Z_0$, and having a radius of R1a; (ii) a second cylindrical waveguide section positioned adjacent the first cylindrical waveguide section, extending in the axial direction $z>Z_0$ away from the first cylindrical waveguide section, and having a radius of R1b such that R1b/R1a is greater than 1; (b) a base defining an interior base cavity of radius R2 and having (i) an upper boundary adjacent the multi-sectioned cylindrical chamber at $Z_0$ and (ii) a lower portion extending axially downwardly in a direction $z<Z_0$; (c) an upper conducting short in electrical contact with the multi-sectioned cylindrical chamber and disposed in an upper portion of the multi-sectioned cylindrical chamber at an axial distance $L_s$ above $Z_0$, the upper conducting short having a central opening and defining the upper boundary of the multi-sectioned cylindrical chamber; (d) an excitation probe extending through the central opening of the upper conducting short and into the upper portion of the multi-sectioned cylindrical microwave chamber by an axial distance $L_p$ relative to the upper boundary of the multi-sectioned cylindrical chamber; (e) a coaxial stage having a radius R3 and an upper surface extending at least into the base cavity and optionally into the first cylindrical waveguide section of the cylindrical microwave chamber, the coaxial stage defining a coaxial microwave chamber between R3 and R2 in the base cavity; (f) a lower conducting short adjustably disposed in the coaxial microwave chamber below $Z_0$ and in electrical contact with the base and the coaxial stage, the axial distance between the lower conducting short and $Z_0$ being L2 and the axial distance between the lower conducting short and the upper surface of the coaxial stage being L1; (g) a quartz bell jar mounted on the base and defining a plasma chamber in at least the first cylindrical waveguide section of the multi-sectioned cylindrical microwave chamber and the coaxial microwave chamber; (h) a feed gas inlet in fluid connection with the plasma chamber; and, (i) an effluent gas outlet in fluid connection with the plasma chamber. In an embodiment, the second cylindrical waveguide section comprises a plurality of cylindrical waveguide sections each having a radius of $R1b_i$ (e.g., $R1b_i/R1a$ is greater than 1 for each cylindrical waveguide section in the plurality of cylindrical waveguide sections). In another embodiment, (i) the first cylindrical waveguide section has a height H1a and the second cylindrical waveguide section has a height H1b; and (ii) the radii R1a, R1b and the heights H1a, H1b are selected such that during operation of the reactor: (A) electromagnetic energy from the excitation probe is defocused and directed radially outwardly in the second cylindrical waveguide section, thereby reducing or preventing the occurrence of a plasma discharge in the multi-sectioned cylindrical chamber and outside the plasma chamber; and (B) the electromagnetic energy from the excitation probe is refocused and directed radially inwardly in the first cylindrical waveguide section and in the plasma chamber, thereby forming a higher intensity plasma discharge relative to a microwave plasma assisted reactor without a refocusing contraction, the plasma discharge being spatially focused in the vicinity of the reference axial location $Z_0$ and the upper surface of the conductive stage. In another embodiment, during operation of the reactor, hybrid electromagnetic modes are produced in the vicinity of $Z_0$ and in the plasma chamber, the hybrid electromagnetic modes comprising a $TM_{01}$ mode, a $TM_{02}$ mode, a cylindrical waveguide mode, a TEM mode, and evanescent modes symmetric about the central axis z. In another embodiment, the coaxial stage is movable such that both L1 and L2 are capable of independent adjustment during operation of the reactor by moving one or both of the lower conducting short and the coaxial stage. In another embodiment, at least one of the upper conducting short and the excitation probe is movable and capable of adjustment during operation of the reactor. In another embodiment, R3/R2 is 0.5 or less. In another embodiment, the excitation probe generates waves of about 2.45 GHz or 915 MHz.

In a refinement, (i) the multi-sectioned cylindrical microwave chamber further comprises a third coaxial waveguide section positioned adjacent the second cylindrical waveguide section, extending in the axial direction $z>Z_0$ away from the second cylindrical waveguide section, and having a radius of $R1c$ such that $R1b/R1c$ is greater than 1; (ii) the upper conducting short is in electrical contact with the third coaxial waveguide section; and (iii) the excitation probe extends through the central opening of the upper conducting short and into the third coaxial waveguide section by the axial distance $L_p$ relative to the upper boundary of the first microwave chamber. In an embodiment, the third coaxial waveguide section comprises a plurality of coaxial waveguide sections each having a radius of $R1c_i$ (e.g., wherein $R1b/R1c_i$ is greater than 1 for each coaxial waveguide section in the plurality of coaxial waveguide sections). For example, (i) $R1c_{i+1}/R1c_i$ is greater than 1 for each coaxial waveguide section i to n−1 in a plurality of n coaxial waveguide sections; and (ii) coaxial waveguide section i+1 having the radius $R1c_{i+1}$ is positioned closer to the reference axial location $Z_0$ relative to coaxial waveguide section i having the radius $R1c_i$. In another embodiment, (i) the first cylindrical waveguide section has a height H1a, the second cylindrical waveguide section has a height H1b, and the third coaxial waveguide section has a height H1c; and (ii) the radii R1a, R1b, R1c and the heights H1a, H1b, H1c are selected such that during operation of the reactor: (A) electromagnetic energy from the electromagnetic wave source is defocused and directed radially outwardly from the third coaxial waveguide section and into the second cylindrical waveguide section, thereby reducing or preventing the occurrence of a plasma discharge in the multi-sectioned cylindrical chamber and outside the plasma chamber; and (B) the electromagnetic energy from the electromagnetic wave source is refocused and directed radially inwardly in the first cylindrical waveguide section and in the plasma chamber, thereby forming a higher intensity plasma discharge relative to a microwave plasma assisted reactor without a refocusing contraction, the plasma discharge being spatially focused in the vicinity of the reference axial location $Z_0$ and the upper surface of the conductive stage.

In another aspect, the disclosure relates to a microwave plasma assisted reactor comprising: (a) a first microwave chamber having a reference plane at a reference axial location $Z_0$, extending in an axial direction $z>Z_0$, and having a circular cross section with a radius $R1(z)$ that varies as a function of the axial position z, wherein the first microwave chamber comprises: (i) a first waveguide portion positioned adjacent the reference axial location $Z_0$, (ii) a second waveguide portion positioned adjacent the first waveguide portion such that the first waveguide portion is positioned between the second waveguide portion and the reference axial location $Z_0$, where the radius $R1(z)$ of the first microwave chamber in the first waveguide portion is less than the radius $R1(z)$ of the first microwave chamber in the second waveguide portion; and (iii) an electromagnetic wave source; (b) a plasma chamber having an outer wall, the plasma chamber extending into the first waveguide portion of the first microwave chamber such that at least a portion of the plasma chamber is located at $z>Z_0$ and at least a portion of the plasma chamber is located at $z<Z_0$; (c) a conductive stage having a reference surface extending into the plasma chamber and defining a second microwave chamber in the plasma chamber (i) at $z<Z_0$ and (ii) between the plasma chamber outer wall and the conductive stage; and (d) a conducting short disposed in the second microwave chamber and in electrical contact with the plasma chamber outer wall and the conductive stage, the axial distance between the conducting short and $Z_0$ being L2, and the axial distance between the conducting short and the reference surface of the conductive stage being L1. In a refinement, the first microwave chamber further comprises a third waveguide portion positioned adjacent the second waveguide portion such that the second waveguide portion is positioned between the third waveguide portion and the first waveguide portion, where the radius $R1(z)$ of the first microwave chamber in the third waveguide portion is less than the radius $R1(z)$ of the first microwave chamber in the second waveguide portion. In an embodiment, the first microwave chamber has a curved profile in an r-z plane defined by the first microwave chamber such that the radius $R1(z)$ varies as a continuous function of the axial position z. In another embodiment, the first microwave chamber comprises a plurality of interconnected cylindrical waveguide sections such that the radius $R1(z)$ varies as a stepwise function of the axial position z. In another embodiment, the first microwave chamber comprises (i) a cylindrical waveguide section such that the radius $R1(z)$ varies is a constant function of the axial position z in the cylindrical waveguide section and (ii) a curved waveguide section interconnected with the cylindrical waveguide section, such that the radius $R1(z)$ varies as a continuous function of the axial position z in the curved waveguide section. In another embodiment, the geometry of the first microwave chamber including the first waveguide portion and the second waveguide portion is selected such that during operation of the reactor: (A) electromagnetic energy from the electromagnetic wave source is defocused and directed radially outwardly in the second waveguide portion, thereby reducing or preventing the occurrence of a plasma discharge in the first microwave chamber and outside the plasma chamber; and (B) the electromagnetic energy from the electromagnetic wave source is refocused and directed radially inwardly in the first waveguide portion and in the plasma chamber, thereby forming a higher intensity plasma discharge relative to a microwave plasma assisted reactor without a refocusing contraction, the plasma discharge being spatially focused in the vicinity of the reference axial location $Z_0$ and the reference surface of the conductive stage. In another embodiment, the geometry of the first microwave chamber including the first waveguide portion, the second waveguide portion, and the third waveguide portion is selected such that during operation of the reactor: (A) electromagnetic energy from the electromagnetic wave source is defocused and directed radially outwardly from the third waveguide portion and into the second waveguide portion, thereby reducing or preventing the occurrence of a plasma discharge in the first microwave chamber and outside the plasma chamber; and (B) the electromagnetic energy from the electromagnetic wave source is refocused and directed radially inwardly in the first waveguide portion and in the plasma chamber, thereby forming a higher intensity plasma discharge relative to a microwave plasma assisted reactor without a refocusing contraction, the plasma discharge being spatially focused in the vicinity of the reference axial location $Z_0$ and the reference surface of the conductive stage.

In another aspect, the disclosure relates to a reactor kit comprising a microwave plasma assisted reactor according to any of the variously disclosed embodiments, wherein the first microwave chamber comprises a plurality of separate, interconnected chamber sections each having a different radius and corresponding to a waveguide section of the first microwave chamber (e.g., where the kit can include a plurality of chamber sections (of varying height and radius) in excess of that required to assemble the first microwave chamber such that the first microwave chamber can be disassembled and reassembled using interchangeable chamber sections to have a desired focusing/defocusing geometry for a given application.

In another aspect, the disclosure relates to a process for depositing a component on a substrate, the process comprising: (a) providing a microwave plasma assisted reactor according to any of the variously disclosed embodiments, the reactor further comprising a deposition substrate mounted above an upper surface of the conductive stage; (b) operating the reactor at a pressure ranging from about 10 Torr to about 760 Torr; and (c) depositing a component on the substrate. In an embodiment, the component comprises single-crystal diamond, microcrystalline polycrystalline diamond, or nanocrystalline polycrystalline diamond, for example where operating the reactor comprises feeding a source gas comprising hydrogen, methane, and optionally nitrogen to the plasma chamber, wherein the methane is present in the source gas in an amount ranging from about 1 mol. % to about 10 mol. % relative to hydrogen. In another embodiment, (i) operating the reactor comprises feeding a source gas comprises feeding a hydrogen source gas and a carbon source gas to the plasma chamber in the absence of nitrogen or other gas additive; and (ii) depositing a component on the substrate comprises depositing single-crystal diamond as the component at a rate of about 40 μm/hr to about 150 μm/hr or about 50 μm/hr to about 130 μm/hr. In another embodiment, the process further comprises varying one or more of (i) the axial distance L1, (ii) the axial distance L2, (iii) an axial distance Ls representing a total height of the first microwave chamber, and (iv) an axial distance Lp representing an extent to which the electromagnetic wave source extends into the first microwave chamber, before and/or during part (b) of operating the reactor. In another embodiment, during parts (b) and (c) of operating the reactor and depositing the component on the substrate, hybrid electromagnetic modes are produced in the vicinity of $Z_0$ and the deposition substrate in the plasma chamber, the hybrid electromagnetic modes comprising a $TM_{01}$ mode, a $TM_{02}$ mode, a cylindrical waveguide mode, a TEM mode, and evanescent modes symmetric about the axial direction z. In another embodiment, the process further comprises operating the reactor at an excitation frequency of about 2.45 GHz, wherein (i) the operating pressure ranges from about 200 Torr to about 500 Torr and (ii) the reactor power density ranges from about 160 W/cm$^3$ to about 800 W/cm$^3$. In another embodiment, the process further comprises operating the reactor at an excitation frequency of about 2.45 GHz, wherein (i) the operating pressure ranges from about 200 Torr to about 400 Torr and (ii) the reactor power density ranges from about 200 W/cm$^3$ to about 700 W/cm$^3$ or about 1100 W/cm$^3$. In another embodiment, the process further comprises operating the reactor at an excitation frequency of about 2.45 GHz, wherein (i) the operating pressure ranges from about 200 Torr to about 300 Torr or about 400 Torr and (ii) the reactor power density ranges from about 400 W/cm$^3$ to about 600 W/cm$^3$ or about 500 W/cm$^3$ to about 600 W/cm$^3$.

All patents, patent applications, government publications, government regulations, and literature references cited in this specification are hereby incorporated herein by reference in their entirety. In case of conflict, the present description, including definitions, will control.

Additional features of the disclosure may become apparent to those skilled in the art from a review of the following detailed description, taken in conjunction with the examples, drawings, and appended claims, with the understanding that the disclosure is intended to be illustrative, and is not intended to limit the claims to the specific embodiments described and illustrated herein.

BRIEF DESCRIPTION OF THE DRAWINGS

The patent or application file contains at least one drawing executed in color. Copies of this patent with color drawing(s) will be provided by the Patent and Trademark Office upon request and payment of necessary fee.

For a more complete understanding of the disclosure, reference should be made to the following detailed description and accompanying drawings wherein.

Figure 1A:
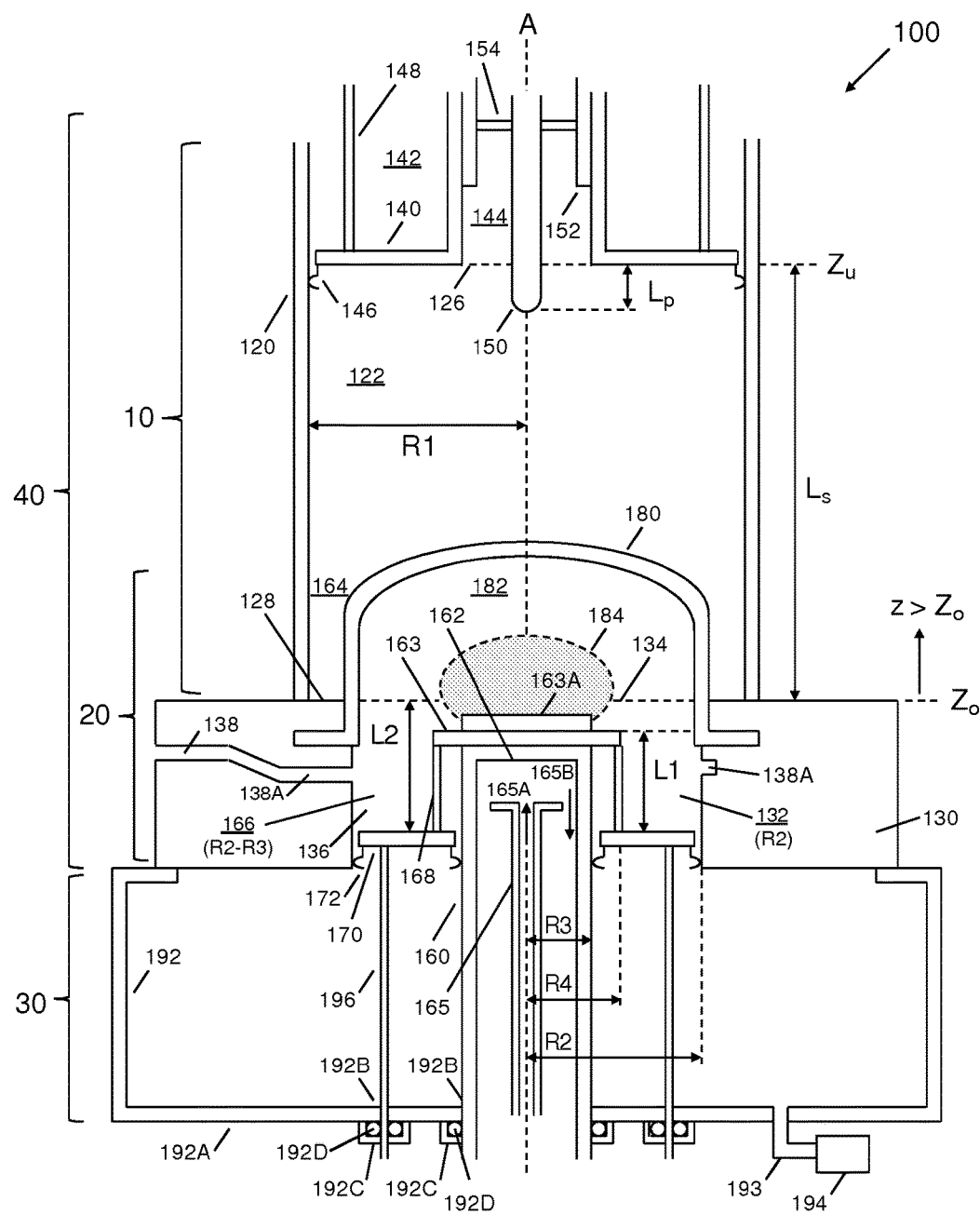
FIG. 1 illustrates cross-sectional views of microwave plasma assisted reactor (or microwave cavity plasma reactor; "MCPR") embodiments according to the disclosure (a, b).

While the disclosed compositions, apparatus, and methods are susceptible of embodiments in various forms, specific embodiments of the disclosure are illustrated in the drawings (and will hereafter be described) with the understanding that the disclosure is intended to be illustrative, and is not intended to limit the claims to the specific embodiments described and illustrated herein.

DETAILED DESCRIPTION

The present disclosure relates to improved microwave plasma assisted reactors, for example chemical vapor deposition (MPCVD) reactors. The disclosed microwave plasma assisted reactors operate over wide pressure ranges (e.g., ranging from about 10 Torr to about 760 Torr), in particular including elevated pressures (e.g., above about 100 Torr or about 200 Torr). The disclosed reactors include an axially adjustable lower sliding short and/or a reduced diameter conductive stage in a coaxial cavity of a plasma chamber. For a particular application, the lower sliding short position and/or the conductive stage diameter can be variably selected such that, relative to conventional reactors, the reactors can be tuned to operate over larger substrate areas, to operate at higher pressures, and to higher discharge absorbed power densities with increased deposition rates (e.g., carats per hour for diamond synthesis) and increased deposition uniformity.

The disclosure also relates MPACVD reactor technologies that can operate at high pressures (>180-320 Torr) and high power densities (>150 $W/cm^3$), and thereby enable high deposition rate CVD processes that rapidly deposit materials. In particular, reactor design examples are described that, when operating in the 180-320 Torr pressure regime, rapidly CVD synthesize high quality polycrystalline (PCD) and single crystal diamond (SCD). The disclosed reactors relate to a further improvement in which the reactors include a radial contraction in the vicinity of the plasma chamber (and optionally a combined expansion in the vicinity of the electromagnetic wave source, followed by the contraction) in the main microwave chamber as electromagnetic energy propagates from an electromagnetic wave source to a plasma/deposition chamber. The larger radius of the main microwave chamber defocuses electromagnetic energy in the main microwave chamber to reduce unwanted discharges therein, and the radial contraction then refocuses the defocused electromagnetic energy in the plasma/deposition chamber to generate a high intensity, high power density, spatially focused plasma discharge in the vicinity of the deposition substrate, leading to substantially increased operation pressures and material (e.g., diamond) deposition rates.

High Pressure Microwave Discharges

At high pressures and high power densities, microwave discharges in hydrogen gas have neutral gas temperatures in excess of 2500 K, contract and separate from the surrounding discharge chamber walls, and become a very non-uniform, intense and "arc like" discharge. As pressure is increased, the gas temperature and discharge power density increase, resulting in a floating discharge with increased active radical plasma species having the potential for increased growth rates. The formation of contracted and floating microwave discharges at high pressures, which are identified herein as microwave arcs, has been observed and studied in many experiments [17-19, 22]. The microwave arc, like lower frequency arcs, is a thermally inhomogeneous discharge. It has a hot central core, and sharp thermal gradients exist between the discharge center and the surrounding walls. Microwave energy is readily coupled into the electron gas in the hot discharge center because of its reduced gas density, and neutral gas species are also readily ionized, dissociated, and excited in the hot central discharge core. These high pressure microwave discharges have been applied as discharges in electrothermal thruster space engines [22, 25-26] and as high pressure, high power microwave discharge light sources [23].

An important difference between high pressure and low pressure microwave discharges is that the microwave discharge entirely fills the discharge chamber at low pressures and produces a diffusion loss dominated, cold (i.e., gas temperatures are less than 1000 K), non-equilibrium plasma. In the high pressure regime, the microwave discharge is hot (i.e., gas temperatures are greater than 2000 K), is volume recombination dominated, and becomes a more thermal-like discharge. Plasma densities for 2.45 GHz hydrogen discharges operating at 100 Torr to 200 Torr are estimated to be about $10^{11}$ cm$^{-3}$ to about $10^{13}$ cm$^{-3}$ (i.e., free electrons per unit volume) [27, 28]. At these high pressures, the discharge separates from the walls and can become freely floating, taking on shapes that are related to the shape of the impressed electromagnetic fields. The discharge can even move about the discharge chamber as it reacts to the buoyant forces on the discharge and to the convective forces caused by the gas flows in the discharge chamber (e.g., source gas inlet and exhaust gas outlet).

Thus, high pressure microwave discharges behave very differently from the typical low pressure discharge and require new methods of discharge control and microwave applicator and plasma reactor design that take into account the distinctly unique nature of the high pressure microwave plasma. The goal in a CVD application is to control the size, the spatial location and the shape of this very hot, non-uniform discharge in such a manner to enable optimal CVD diamond synthesis. This is a formidable engineering challenge. The disclosed high pressure plasma reactors and associated methods allow the spatial positioning and shaping of this thermally inhomogeneous, hot microwave discharge, thereby enabling the optimization of the diamond CVD process at high pressure.

Reactor Geometry

A cross sectional view of a microwave plasma assisted reactor 100 according to the disclosure is illustrated in FIG. 1A. The reactor 100 generally includes a microwave chamber/section 10, a plasma chamber/section 20, and a vacuum chamber/section 30. The reactor 100 has a generally cylindrical structure with components that are generally aligned along a central axis A (e.g., the z-axis in a cylindrical coordinate system with substantial component symmetry in the θ (or phi, φ) direction). Collectively, the microwave chamber 10 and the plasma chamber 20 are referenced as an applicator 40. The microwave chamber 10 and the plasma chamber 20 meet at a reference axial location $Z_0$ (or z=0). The applicator 40 includes two coupled cavities at the $Z_0$ plane: a cylindrical cavity section (z≥$Z_0$) and a coaxial cavity section (z≤$Z_0$).

The microwave chamber 10 includes a cylindrical chamber 120 (e.g., an open-ended metallic cylinder) defining an interior cylindrical cavity 122 of radius R1 aligned with the central axis A. The cylindrical cavity 122 has a lower boundary 128 (e.g., a metallic portion of the base 130) at the reference axial location $Z_0$ and an upper boundary 126 at an axial location $Z_U$>$Z_0$ (i.e., the microwave chamber 10 generally extends upwardly in an axial direction z>$Z_0$). The microwave chamber 10 can be cooled with an external coolant, for example with cooling lines (e.g., for water or other cooling liquid) on the exterior of the cylindrical chamber 120 and/or with a cooling gas inlet/outlet (e.g., for air or other cooling gas) in fluid communication with the cylindrical cavity 122. As illustrated, the cylindrical chamber 120 has a uniform radius R1 throughout its height. In alternative embodiments, the cylindrical chamber 120 can have a multi-section construction, for example including a first cylindrical chamber of radius R1$a$ (or other characteristic width dimension for non-cylindrical chambers) adjacent to the base 130 and a second cylindrical chamber of radius R1$b$ adjacent to the first cylindrical chamber and extending upwardly away from the base 130. In general, R1$a$ can be less than or greater than R1$b$ depending on the resulting influence upon the microwave field in the microwave chamber 10.

The microwave chamber 10 further includes an upper conducting short 140 in electrical contact with the cylindrical chamber 120 and disposed in an upper portion 142 of the cylindrical chamber 120 at an axial distance $L_s$ above $Z_0$. The upper conducting short 140 has a central opening 144, defines the upper boundary 126 of the cylindrical chamber 120, and is electrically connected to the side walls of the cylindrical chamber 120 via finger stocks 146. Preferably, the upper conducting short 140 is slidably disposed in the cylindrical chamber 120, and its axial position can be adjusted by any suitable means, for example using a sliding (e.g., threaded) rod/gear assembly (e.g., via rods 148 (mounted to the upper conducting short 140) and as illustrated in more detail in U.S. Pat. No. 5,311,103; incorporated herein by reference).

The microwave chamber 10 further includes an excitation probe 150 as an electromagnetic wave source extending through the central opening 144 of the upper conducting short 140 and into an upper portion of the cylindrical cavity (or microwave chamber) 122 by an axial distance $L_p$ relative to the upper boundary 126. The excitation probe 150 is generally capable of generating radiofrequency waves in the UHF (e.g., about 300 MHz to about 3 GHz) and/or microwave (e.g., about 300 MHz to about 300 GHz or about 300 MHz to about 100 GHz) frequency domain. Suitable specific excitation frequencies include 915 MHz and 2.45 GHz. As illustrated, the excitation probe 150 is supported in an inner sleeve 152 by an insulator/holder 154. The inner sleeve 152 preferably is adjustably mounted on the interior annular surface of the upper conducting short 140. Similar to the upper conducting short 140, the excitation probe 150 also is adjustably disposed in the cylindrical chamber 120, and its axial position can be adjusted by any suitable means, for example using a gear assembly to slide the inner sleeve 152 and the excitation probe 150 as a unit relative to the upper conducting short 140 (e.g., as illustrated in U.S. Pat. No. 5,311,103; incorporated herein by reference). In an embodiment, the axial positions of both the upper conducting short 140 and the excitation probe 150 are independently adjustable to provide an impedance tuning mechanism to minimize reflected power in the cylindrical cavity 122.

The plasma chamber 20 includes a base 130 (e.g., a metallic base) that defines an interior base cavity 132 (e.g., a cylindrical cavity of radius R2) and that is mounted to the cylindrical chamber 120 of the microwave chamber 10. The interior base cavity 132 has (i) an upper boundary 134 at $Z_0$ and adjacent the cylindrical chamber 120 and (ii) a lower portion 136 extending axially downwardly in a direction z<$Z_0$. As illustrated, the base 130 includes a source/feed gas inlet in fluid connection with the base cavity 132, for example a conduit 138 extending through the base 130 and opening into the base cavity 132 through an annular manifold 138A (or other similar structure for tangentially distributing the source gas). The plasma chamber 20 further includes a quartz bell jar 180 mounted in/on the base 130 and extending upwardly into a bottom portion 164 of the cylindrical cavity 122 (i.e., z>$Z_0$). Together, the base 130 and the quartz bell jar 180 define an interior cavity 182 of the plasma chamber 20 (e.g., by an outer wall/boundary including the quartz bell jar 180 and the interior surface (i.e., at r=R2) of the base 130). The base 130 optionally can include cooling channels (e.g., a water cooling channel and/or a gas cooling channel; not shown) that circulate one or more coolants through the base 130 to provide a mechanism for controlling the temperature of the base 130, the quartz bell jar 180, and/or the interior cavity 182 of the plasma chamber 20 during operation of the reactor 100.

The plasma chamber 20 further includes a coaxial stage 160 (e.g., a conductive stage, for example a metallic tube) having a radius R3 and an upper surface 162. The coaxial stage 160 extends at least into the base cavity 132 and optionally into the bottom portion 164 of the cylindrical cavity 122 (i.e., the axial position of the upper surface 162 can be $z \leq Z_0$ or $z > Z_0$ based on the axially adjustable nature of the coaxial stage 160). The coaxial stage defines a coaxial cavity (or microwave chamber) 166 between R3 and R2 in the base cavity 132. A substrate holder 163 (e.g., a molybdenum substrate holder) having a radius R4 is mounted on the upper surface 162 of the coaxial stage 160; during operation of the reactor 100, a deposition substrate 163A is placed on the substrate holder 163. The thickness (i.e., in the z-direction) of the substrate holder 163 is suitably about 0.6 cm; however, the thickness can be varied as an additional means to independently vary L1 and L2. As illustrated, the substrate holder 163 is a flat, disk-shaped structure. Alternatively, the substrate holder 163 can contain a recess (not shown) in its upper surface facing the interior cavity 182, and the deposition substrate 163A is seated in the recess during operation. In an embodiment, the coaxial stage 160 includes internal structure to cool (or otherwise control the temperature of) the substrate 163A during operation. As illustrated, a conduit 165 in the interior of the coaxial stage 160 provides an inlet for a (relatively cold) coolant 165A (e.g., gas or liquid, preferably water) that serves as a heat transfer medium to withdraw heat from the substrate 163A and then exits the coaxial stage 160 as a heated coolant 165B. Alternatively, a relatively hot stream 165A can be used to warm the substrate 163 and then exit as a cold stream 165B.

The plasma chamber 20 further includes a lower conducting short 170 adjustably disposed in the coaxial cavity 166 below $Z_0$ and in electrical contact with the base 130 and the coaxial stage 160 via finger stocks 172. As illustrated, the lower conducting short 170 has a solid annular construction (e.g., a metallic construction); however, the lower conducting short 170 can include one or more channels (or other orifices; not shown) that allow effluent gases to escape from the interior cavity 182 of the plasma chamber 20 into the vacuum chamber 30. The axial distance between the lower conducting short 170 and $Z_0$ is L2, and the axial distance between the lower conducting short 170 and the substrate holder 163 (or a base or bottom portion of the substrate 163A) is L1. Alternatively, the distance L1 can be measured between the lower conducting short 170 and an upper or top portion of the substrate 163A. Together, the two distances define a difference $\Delta L = L1 - L2$ that denotes the displacement of the coaxial stage 160, substrate holder 163, and the substrate 163A from $Z_0$.

As illustrated in FIG. 1A, the plasma chamber 20 can further include a quartz tube holder 168. The quartz tube holder 168 is generally mounted on the lower conducting short 170 and extends upwardly to the substrate holder 163. The quartz tube holder 168 has a radius slightly larger than that of the coaxial stage 160, thereby defining an annular gap between the quartz tube holder 168 and the coaxial stage 160. The quartz tube holder 168 controls the flow of exhaust gas leaving the interior cavity 182 of the plasma chamber 20. Specifically, the substrate holder 163 has holes/conduits (not shown) at the outer radial positions of the substrate holder 163, thereby directing exhaust gas from the interior cavity 182 into the annular gap between the quartz tube holder 168 and the coaxial stage 160. In this case, holes/conduits are placed in the lower conducting short 170 at radial positions between the quartz tube holder 168 and the coaxial stage 160. In an embodiment (not shown), the quartz tube holder 168 can be fixed/mounted to the substrate holder 163 and can have portions that slidably extend through accommodating openings in the lower conducting short 170. In this case, L1 and L2 can be slidably adjusted without having to insert a quartz tube holder 168 of variable height.

Figure 1B:
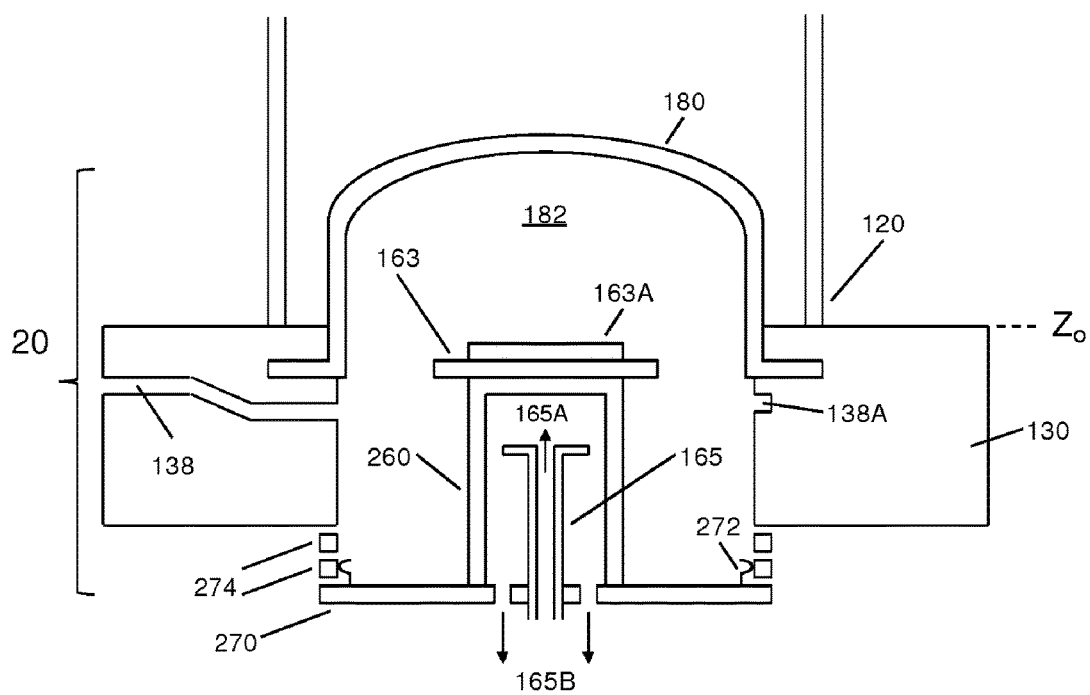

FIG. 1B illustrates an alternate embodiment of the lower conducting short 270. The lower conducting short 270 has a disk-shaped structure (e.g., a metallic construction) that is in electrical contact with the base 130 (via finger stocks 272) and with the conducting stage 260 (via direct contact). The axial position of the lower conducting short 270 is adjustable in the coaxial cavity 166 below $Z_0$ by selecting one or more conducting shim inserts 274 (e.g., conducting annular metallic rings of predetermined height) that are interposed between the base 130 and the lower conducting short 270. The structure illustrated in FIG. 1B is held in place during operation, for example, with bolts (not shown) that extend through lower conducting short 270, the shim inserts 274, and into the base 130. As illustrated, the coaxial stage 260 is a cylinder mounted on the lower conducting short 270; however, the coaxial stage can have similar cooling structure as that illustrated in FIG. 1A (e.g., a coolant inlet and a coolant outlet passing through conduits in the lower conducting short 270 and into the interior of the coaxial stage 260).

An aspect of the disclosed reactors is that the geometric reactor length scales L1 and L2 are adjustable by altering the axial location of the lower conducting short 170/270 in the coaxial cavity 166. In FIG. 1A, the illustrated conducting short 170 is a slidable, annular disk that can be moved in the axial direction before and/or during the operation of the reactor 100. In FIG. 1B, the illustrated conducting short 270 is a disk that can be repositioned in the axial direction by altering the number and/or size of the shim inserts 274 that are axially interposed between the base 130 and the lower conducting short 270. Preferably, both of the length scales L1 and L2 are independently adjustable. Thus, in the embodiment illustrated in FIG. 1A, the coaxial stage 160 is independently slidable/adjustable relative to the conducting short 170 such that L2 can be independently adjusted before and/or during the operation of the reactor 100. In the embodiment illustrated in FIG. 1B, the height of the coaxial stage 160 can be adjusted by selecting stages of differing height for mounting to the conducting short 270. The specific methods for adjusting L1 and L2 are not particularly limited, and can include any of a variety of known methods (e.g., using a gear assembly, using an o-ring sealed movable rod, manually repositioning the components, etc.).

The vacuum chamber 30 is defined by vacuum chamber walls 192 that are mounted to the base 130 of the plasma chamber 20 to provide an air-tight seal. The vacuum chamber 30 further includes a conduit 193 through the chamber walls 192 that is connected to a vacuum pump 194 that helps maintain a desired operating pressure in the plasma chamber 20 during operation. As illustrated, a base portion 192A of the chamber walls 192 can include one or more conduits/openings 192B that permit the structural/mechanical coupling of various elements in the plasma chamber to the external environment. For example, vacuum seals 192C (e.g., including an o-ring 192D) can accommodate slidable rods 196 that are attached to the lower conducting short 170 and that extend through the vacuum chamber 30 to the external environment. The rods 196 can be repositioned to adjust the axial position of the lower conducting short 170 by any of a variety of methods (e.g., manual, coupling to a gear assembly similar to that used to adjust the position of the upper conducting short 140, where the gear assembly can be under manual and/or automatic control). As illustrated, a conduit 192B also is provided for the coaxial stage 160 (and any internal structure such as the conduit 165) so that the coaxial stage 160 can be axially repositioned similarly to the slidable rods 196 and the lower conducting stage 170.

Characteristic dimensions and coordinates of the reactor 100 are shown in FIG. 1A. They are the distance $L_p$ that the excitation probe 150 extends beyond the conducting short 140, the height $L_s$ of the cylindrical cavity 122, the radius R1 of the cylindrical cavity, the radii R2 and R3 that define the annular width of the coaxial cavity 166, the radius R4 of the substrate holder 163, the thickness D of the substrate holder 163, and lengths L1 and L2 in the coaxial cavity 166 defining the position of the lower conducting short 170 and the coaxial stage 160. Generally, R1≥R2≥R4≥R3 and $L_s$≥L1 and L2, although other variations are possible. The substrate 163A itself is located approximately at $Z_0$ near the open end of the coaxial cavity 160 on the substrate holder 163. Thus, the upper surface 162 of the conducting coaxial stage 160 serves as a platform for the substrate holder 163, and the interior of the coaxial stage 160 allows temperature control of the substrate 163A (e.g., via water cooling/heating as illustrated). The conducting coaxial stage 160 and the substrate holder 163 are collectively identified as the powered electrode. The difference between L1 and L2 (i.e., L1−L2=ΔL), is the distance that the top surface of the powered electrode or the substrate surface is above or below the cylindrical cavity 122 bottom $Z_0$ plane (z=0).

The specific dimensions of a given reactor design generally scale inversely with the microwave excitation frequency of the excitation probe 150 (i.e., relatively higher probe 150 frequencies generally call for smaller reactor scales and vice versa). Two common excitation frequencies are 2.45 GHz and 915 MHz. For a 2.45 GHz-reactor, suitable dimensions include R1 ranging from about 6 cm to about 12 cm or 18 cm (e.g., about 8.9 cm), R2 ranging from about 5 cm to about 10 cm or 15 cm (e.g., about 7.0 cm), R3 ranging from about 0.5 cm to about 5 cm or 8 cm (e.g., about 0.95 cm, 1.9 cm, or 4.1 cm)), R4 ranging from about 1 cm to about 6 cm or 12 cm (e.g., about 3.25 cm), $L_s$ ranging from about 15 cm to about 25 cm (e.g., about 20 cm), $L_p$ ranging from about 2 cm to about 5 cm (e.g., about 3.6 cm), and/or L1 and L2 independently ranging from about 4 cm to about 8 cm (e.g., |ΔL| about 2 cm, 1 cm, or 0.5 cm or less, including cases where ΔL≠0 (i.e., a net displacement of the substrate 163/ coaxial stage 160 from $Z_0$)). For a 915 MHz-reactor, suitable dimensions include R1 ranging from about 15 cm to about 25 cm or 40 cm (e.g., about 30 cm), R2 ranging from about 5 cm to about 30 cm (e.g., about 15 cm), R3 ranging from about 2 cm to about 20 cm (e.g., about 9.5 cm), R4 ranging from about 2 cm to about 20 cm (e.g., about 12 cm), $L_s$ ranging from about 40 cm to about 80 cm (e.g., about 60 cm), $L_p$ ranging from about 5 cm to about 15 cm (e.g., about 8 cm), and/or L1 and L2 independently ranging from about 10 cm to about 20 cm (e.g., |ΔL| about 5 cm, 2 cm, or 1 cm or less, including cases where ΔL≠0 (i.e., a net displacement of the substrate 163/coaxial stage 160 from $Z_0$)).

The ratio R3/R2 can be up to about 0.8 in many applications. An aspect of the disclosure, however, is that a reduction in the size/diameter of the coaxial stage 160 allows an increase in the applied power density of the plasma in a manner that is controllable to permit uniform and high deposition rates (e.g., of diamond) on the substrate 163A. Thus, the radius R3 is suitably small relative to R2. For example, the ratio R3/R2 is suitably about 0.5 or less, about 0.4 or less, about 0.3 or less, or about 0.2 or less. Due to practical structural considerations (e.g., if the coaxial stage 160 include internal temperature control structure), the ratio R3/R2 is suitably about 0.05 or more, or about 0.1 or more.

Another aspect of the disclosure is that relatively fine adjustments of the axial positions of the lower conducting short 170 and/or the coaxial stage 160 (e.g., in the neighborhood of $Z_0$) allow positioning of the electromagnetic focus of the plasma above the substrate 163A to provide an additional means to control deposition rates. Thus, during or before operation (e.g., when tuning the reactor and/or when depositing a component), the distance ΔL is suitably small relative to L1 and/or L2. For example, the ratio |ΔL|/L1 or |ΔL|/L2 is suitably about 0.5 or less, about 0.2 or less, about 0.1 or less, or about 0.05 or less. In practice, a desirable, tuned value of ΔL is non-zero, and often ΔL<0 during operation.

The disclosed reactor can be provided in the form of a kit that facilitates the selection by a user of specific geometric embodiments. For example, the kit can include a microwave plasma assisted reactor according to any of the disclosed embodiments in conjunction with at least one of: (a) a plurality of cylindrical chambers, each defining an interior cylindrical cavity of a different radius R1; (b) a plurality of bases, each defining an interior base cavity of a different radius R2; and, (c) a plurality of coaxial stages, each having a different radius R3. When the kit includes a plurality of bases, a plurality of appropriately sized quartz bell jars and lower conducting shorts (whether disk-shaped, annular, or otherwise) are also included in the kit. Similarly, when the kit includes a plurality of coaxial stages, a plurality of appropriately sized lower conducting shorts also can be included in the kit (e.g., annular lower conducting shorts should be complementary in size with the individual coaxial stages; however, a single disk-shaped lower conducting short can accommodate the plurality of coaxial stages). A plurality of shim inserts (with the same or different heights) also can be provided in the kit. Thus, the reactor can be assembled with any combination of the cylindrical chambers, the bases, the coaxial stages, and any attendant complementary parts such that at least one of R1, R2, and R3 can be varied in a selected reactor assembly.

Reactor Operation

Figure 2:
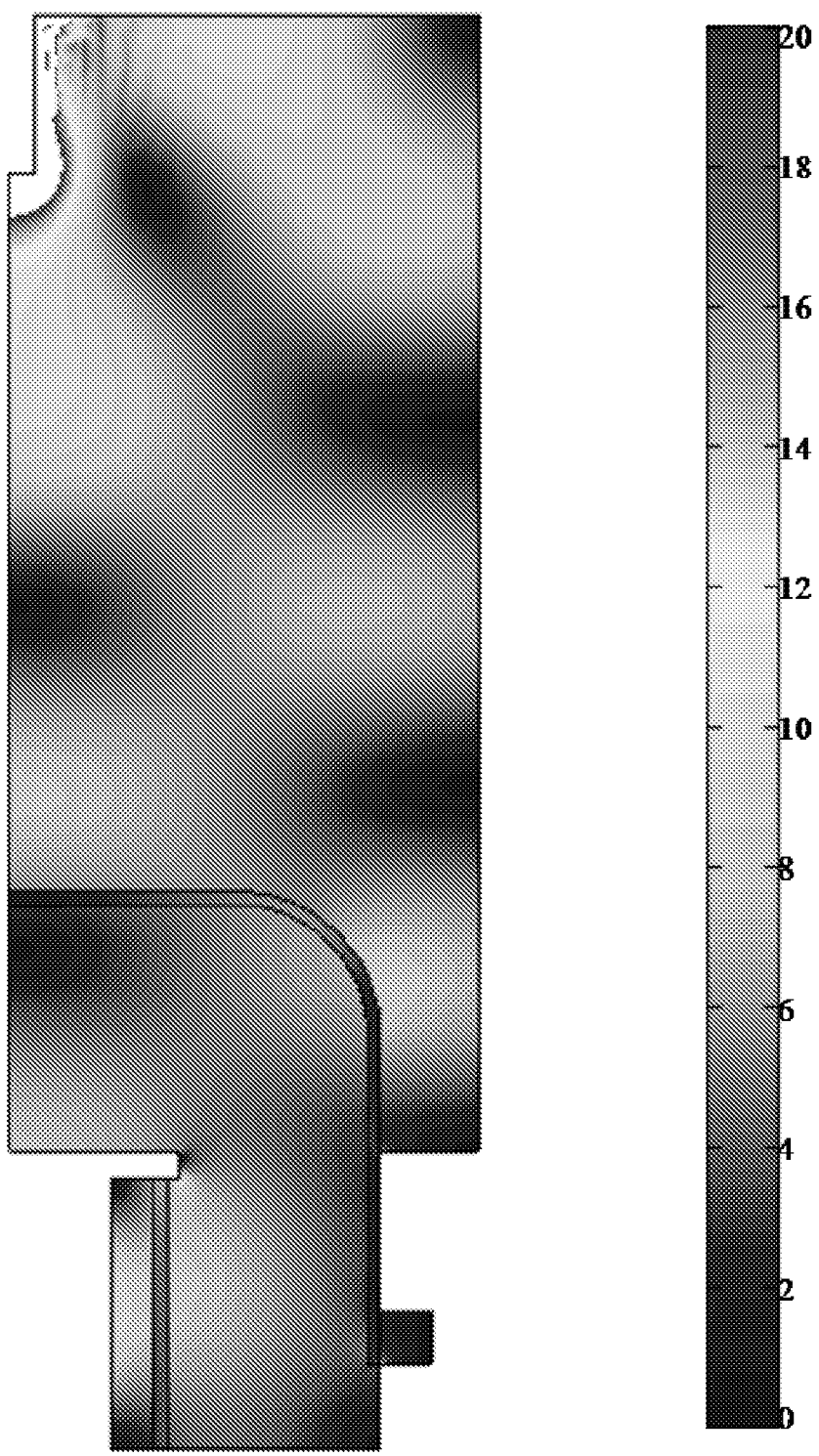
FIG. 2 illustrates electric field distribution patterns inside a MPCR using a COMSOL MULTIPHYSICS 2D axial symmetry model, where color intensities indicate the electric field strength in V/m (excited frequency=2.45 GHz, R1=8.89 cm, R2=7.04 cm, R3=1.91 cm, R4=3.24 cm, substrate holder thickness=0.58 cm, bell jar height=8 cm, Ls=21.6 cm, L1=5.65 cm, L2=5.08 cm).
Figure 3:
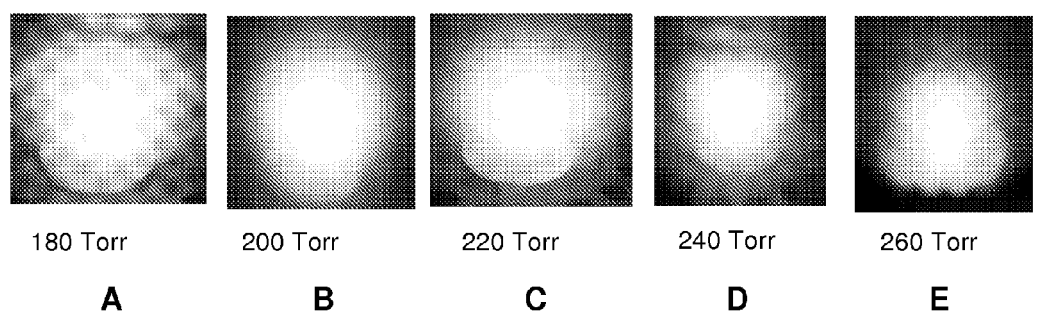
FIG. 3 presents images of plasma discharge and deposition substrate at operating pressures 180 Torr (a), 200 Torr (b), 220 Torr (c), 240 Torr (d), and 260 Torr (e).

In practice, the plasma loaded applicator is excited with the hybrid $TM_{013}+TEM_{001}$ electromagnetic mode. In order to achieve $TM_{013}$ excitation in the open cylindrical cavity 122, $L_s$ is preferably adjusted/selected to be very close to $3\lambda_g/2$, where $\lambda_g$ is the guided wavelength of the $TM_{01}$ cylindrical waveguide mode. In order to achieve $TEM_{001}$ excitation in the coaxial section, L2 is preferably adjusted/ selected to approximately $\lambda_o/2$, where $\lambda_o$ is the free space wavelength. In general, $\lambda_o$ is based on the relationship $f\lambda_o=c$ (e.g., for excitation frequency f=2.45 GHz, $\lambda_o$=12.2 cm; for f=915 MHz, $\lambda_o$=32.8 cm). In practice, $\lambda_g$ is larger than $\lambda_o$ and can be computed as $\lambda_g=\lambda_o(1-(f_c/f)^2)^{-1/2}$, where $f_c$ is the cut-off frequency (and $f>f_c$). Suitable discharge ignition starting lengths for process development are when L1 and L2 are equal to each other and are equal to approximately $\lambda_o/2$. Then, ΔL is zero and the top of the substrate is substantially even with the $Z_0$ plane. Suitable starting lengths for the cylindrical section are $L_s$ of about $3\lambda_g/2$ and the coupling probe depth $L_p$ of about $\lambda_g/4$. Representative reactor electromagnetic field intensity patterns for this starting condition are displayed in FIG. 2.

The geometry of the reactor 100 is generally a function of the geometric variables $L_s$, $L_p$, L1, L2, R1, R2, R3, and R4. When these geometric length variables are changed, the electromagnetic fields and the electromagnetic focus in the local region above and around the $Z_0$ plane are controlled and altered. Similarly, when a microwave discharge or plasma is present, the discharge power density, the plasma shape, and the plasma position can be altered by varying one or more of the geometric variables. Thus, a microwave plasma assisted deposition process (e.g., diamond synthesis) also can be changed, controlled, and optimized by changes in the reactor geometry.

When the size and shape of the reactor 100 is varied, for example by changing the various reactor radii or lengths, the reactor can be optimized for a specific deposition process. In practice R1 is determined primarily by the choice of the excitation frequency Generally, a range of R1 values can be used, ranging from a minimum R1 for the $TM_{013}$ mode to exist and some maximum R1 at which a distinct $TM_{013}$ mode is difficult to obtain due to many other modes having a similar $L_s$ value, and R2 and R3 are then determined by the specific process application (e.g., desired substrate size, operating pressure regime). For example, for low pressure, large-area operation and low discharge power density, R2 and R3 take on lengths that are slightly smaller than R1. Reactor designs according the disclosure often fix the applicator radii, and then, during process optimization, the electromagnetic field patterns and associated microwave discharge are modified by varying L1, L2, $L_s$ and $L_p$ as well as pressure and input microwave power. This is a multivariable optimization procedure that is initially performed by the operator during process development and after some experience it can also be performed automatically via a preprogrammed recipe. Since there are many variables, there are many possible shapes, positions, and intensities that the discharge can assume in the vicinity of the $Z_0$ plane, and all of these are available for process optimization.

The reactor 100 in any of its embodiments can be operated in a process to deposit a component (e.g., single-crystal diamond, polycrystalline diamond) on the substrate 163A mounted or otherwise located above the coaxial stage 160 (e.g., on the substrate holder 163). The specific construction of the substrate 163A is not particularly limited and can be suitably selected based on the particular component being deposited. For example, single-crystal diamond can be deposited on a single-crystal seed substrate (e.g., high-pressure, high-temperature single-crystal seed), and polycrystalline diamond can be deposited on a silicon-based substrate (e.g., nucleation-seeded silicon, doped silicon, or silicon nitride). Polycrystalline diamond can include both nanocrystalline diamond (e.g., crystals on the order of nanometers to hundreds of nanometers) and microcrystalline diamond (e.g., crystals on the order of micrometers to hundreds of micrometers).

The reactor 100 is operated by applying power to the excitation probe 150 to generate electromagnetic waves at a selected frequency. For example, applied powers ranging from about 1 kW to about 10 kW (e.g., about 2 kW to about 3 kW or about 4 kW) are suitable for a 2.45 GHz frequency, and applied powers ranging from about 5 kW to about 30 kW are suitable for a 915 MHz frequency. Based on the reactor 100 geometry and depending on the particular selection of characteristic length scales, a first electromagnetic mode $M_1$ (e.g., $TM_{013}$) can be excited in the cylindrical chamber 122 of the reactor 100 and a second electromagnetic mode $M_2$ (e.g., $TEM_{001}$) can be excited in the coaxial chamber 166 of the reactor 100, thereby forming a hybrid electromagnetic mode $M_3$ in the plasma chamber 20. This "hybrid mode" has field patterns that are predominantly $TM_{013}$ in the cylindrical chamber and $TEM_{001}$ in the coaxial chamber. The two electromagnetic field patterns interact at the discontinuous $z=Z_o$ boundary plane. The abrupt physical discontinuity at the $Z_o$ plane sets up local evanescent fields on either side of the plane and the total field in the vicinity of the deposition substrate 163A (i.e., the impressed electromagnetic field that creates and sustains the plasma) is the sum of the two modes $M_1$ and $M_2$ plus the induced evanescent field.

The impressed substrate field can be varied by spatially changing the evanescent field around the discontinuity plane by varying the various dimensions such as R1, R2, R3 L1, and L2, etc. Thus by changing these dimensions, the electromagnetic focus at the substrate is varied. For example if R3 is reduced and L1 and L2 are approximately equal to one half of the free space wave length, then the field at the end of the substrate holder will be intense and mainly perpendicular to the top of the substrate. If L1 and L2 are then varied slightly, the field then has additional inward or outward directed radial components, there by changing the total impressed field pattern. If R3 and R4 are large (i.e., with respect to R2) then the impressed field pattern is reduced, but is more uniform over a larger radius, there by producing a more uniform plasma and a more uniform deposition over the larger substrate area. Thus, it is clear that a large variety of impressed electromagnetic field patterns can be created in the vicinity of the substrate by adjusting the reactor dimensions. Given a specific microwave plasma assisted CVD application, the reactor dimensions and tuning can be adjusted to optimize a specific process.

A source gas is fed to the interior cavity 182 of the plasma chamber 20 at a selected operating pressure to form a plasma 184 when power is being applied. The particular operating pressure in the plasma chamber 20 can range between about 10 Torr and 760 Torr and can be suitably controlled by the vacuum pump 194 and/or by source gas flow rates. The operating pressure is desirably increased, however, to increase the deposition rate of the component on the substrate 163A. For example, operating pressures of at least about 100 Torr, 150 Torr, 180 Torr, 200 Torr, or 220 Torr and/or up to about 300 Torr, 350 Torr, 400 Torr, 500 Torr, or 760 Torr can be selected in various embodiments. More particularly, suitable pressures at a 915 MHz frequency can range from about 100 Torr to about 160 Torr (e.g., when the substrate 163A ranges from about 10 cm to about 14 cm in size/diameter) or from about 20 Torr to about 100 Torr (e.g., when the substrate 163A ranges from about 14 cm to about 20 cm in size/diameter). Suitable pressures at a 2.45 GHz frequency can range from about 50 Torr to about 150 Torr (e.g., when the substrate 163A ranges from about 6 cm to about 9 cm in size/diameter). Alternatively, pressures at a 2.45 GHz frequency can range from about 100 Torr to about 400 Torr, about 180 Torr to about 260 Torr, or about 220 Torr to about 260 Torr (e.g., when the substrate 163A is up to about 6 cm or up to about 3 cm in size/diameter).

The particular source gas(es) fed to the plasma chamber 20 will depend on the particular deposition component. For diamond deposition, a mixture of methane ($CH_4$) and hydrogen ($H_2$) is suitable. The feed composition is generally expressed as a mol. % (or vol. %) of methane relative to hydrogen. For example, feed compositions of at least about 1 mol. % $CH_4$, 2 mol. % $CH_4$, or 3 mol. % $CH_4$ and/or up to about 5 mol. % $CH_4$, 6 mol. % $CH_4$, 8 mol. % $CH_4$, or 10 mol. % $CH_4$ can be selected in various embodiments. In some embodiments, the source gas can further include nitrogen ($N_2$) to increase the diamond deposition rate. Suitable nitrogen feed concentrations can range from about 0.005 mol. % $N_2$ to about 2 mol. % $N_2$ relative to the hydrogen feed. Other source gases may be incorporated as desired to add desired dopants, for example including diborane ($B_2H_6$; to form boron-doped diamond). In yet other embodiments, an inert carrier gas (e.g., argon) can form the bulk of the source gas with desired levels of methane, hydrogen, etc. added to the carrier gas.

The process further includes adjusting the axial position of the lower conducting short 170 and/or the coaxial stage 160 of the reactor 100 to selectively position the electromagnetic focus of the plasma 184 above the substrate 163A during operation. The axial position adjustments can be made prior to operation of the reactor 100. For example, the lower conducting short 170 and the coaxial stage 160 can be set to their desired axial positions after which the reactor 100 can be powered on to execute a brief ignition step and then to perform a continuous deposition process according to the foregoing parameters. Alternatively or additionally, the lower conducting short 170 and the coaxial stage 160 can be set to their desired axial positions during the operation of the reactor 100 (e.g., using the structure illustrated in FIG. 1A to adjust the lower conducting short 170 and the coaxial stage 160 without needing to disassemble or otherwise access the plasma chamber 20 and the vacuum chamber 30).

The axial position adjustments can form the basis for a more general reactor tuning process. Specifically, a plurality (e.g., two or more) of combinations of L1 and L2 can be selected to identify favorable/optimum deposition properties (e.g., power density, substrate temperature, deposition rate, deposition uniformity) at a selected set of other operating parameters (e.g., operating pressure, source gas composition, applied power, coaxial stage radius (or other geometric parameters)). For example: L1 is held constant and L2 is parametrically varied over a plurality of values, L2 is held constant and L1 is parametrically varied over a plurality of values, or L1 and L2 are both parametrically varied over a plurality of values. Such parametric variation can be expressed in terms of a plurality of ΔL values that are individually tested (e.g., a plurality of ΔL/L1 or ΔL/L2 values ranging from about −0.5 to about 0.5, about −0.2 to about 0.2, about −0.1 to about 0.1, or about −0.05 to about 0.05). The tuning process is completed by operating the reactor 100 at each of the plurality of L1 and L2 (or ΔL) combinations and then measuring or otherwise characterizing one or more deposition properties resulting from each individual tuning selection. Deposition properties can be measured at each combination of L1 and L2 (e.g., as illustrated in FIGS. 6, 7, 8, and 11), and a specific set of L1 and L2 values (or the "tuned" L1 and L2 values) can be selected as that which maximizes or otherwise optimizes the reactor operation in terms of one or more deposition properties. For example, it is generally desirable to maximize the power density and/or the deposition rate, and such maximization can be constrained by a desire to simultaneously maintain the substrate temperature and/or the deposition uniformity within or under a specific range based on safety and/or quality considerations.

Figure 6:
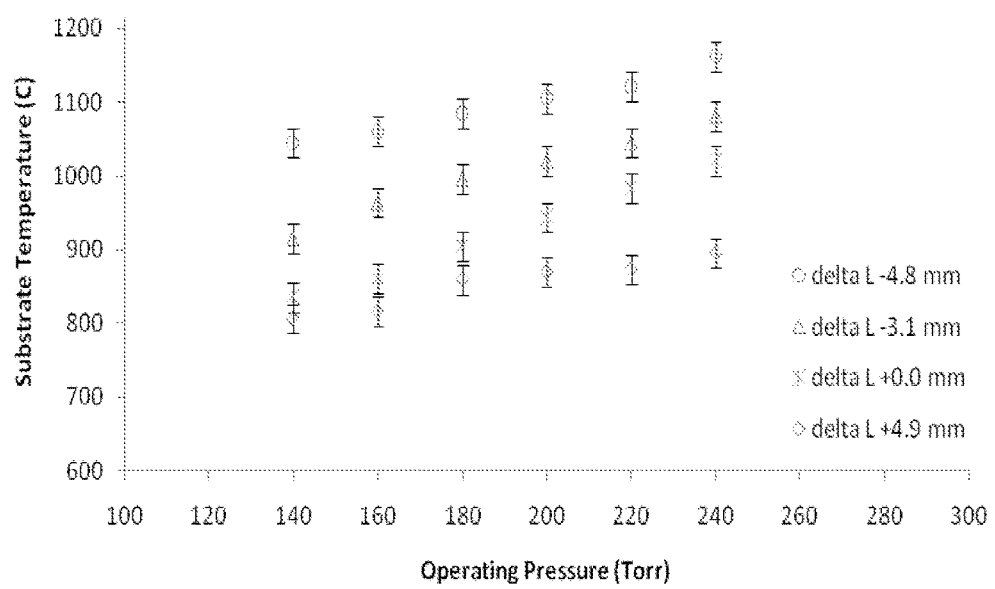
FIG. 6 illustrates substrate temperature as a function of substrate positions (ΔL) and operating pressures; vertical bars represent the maximum/minimum variation of the substrate temperature.
Figure 7:
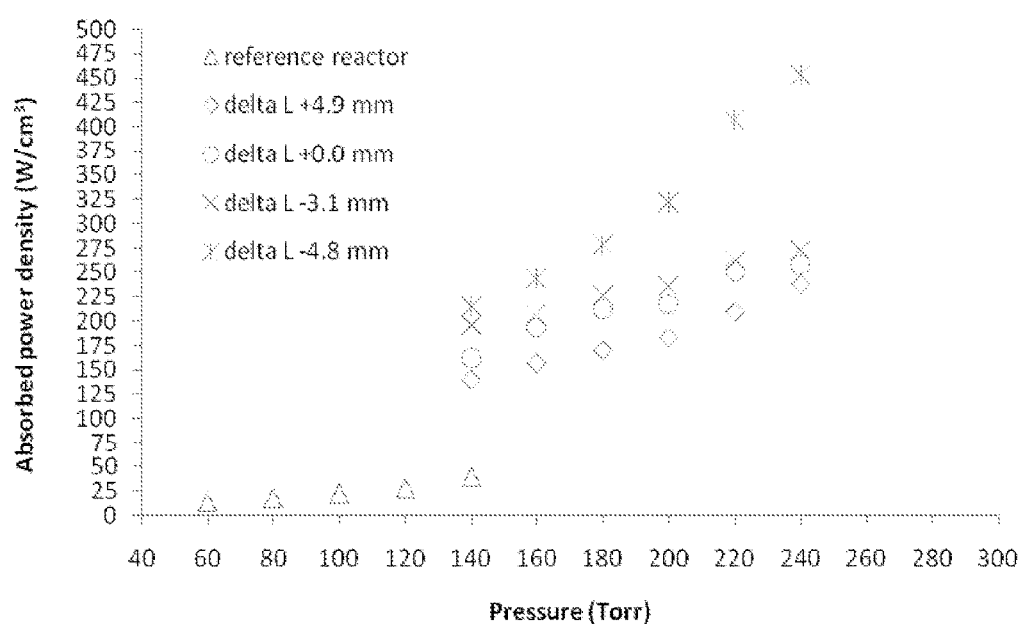
FIG. 7 illustrates absorbed plasma power density as a function of operating pressure for both the reference reactor (R3=4.13 cm and R4=5.08 cm) and the modified reactor (R3=1.91 cm and R4=3.24 cm) at various substrate positions (ΔL).
Figure 9:
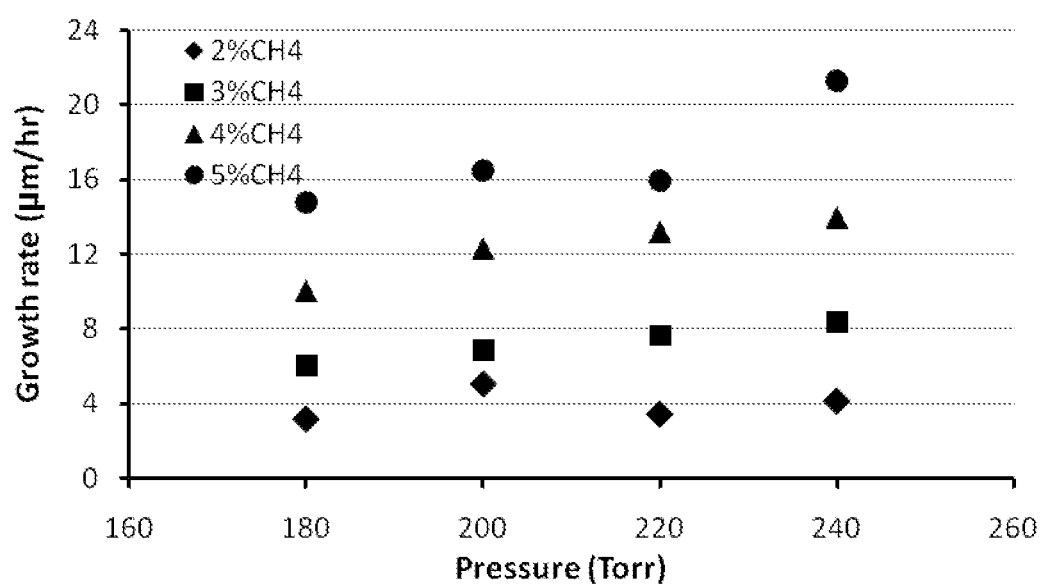
FIG. 9 illustrates polycrystalline diamond growth rate as a function of operating pressure and source gas chemistry (2 mol. % to 5 mol. % CH$_4$ in H$_2$ with no addition of nitrogen gas).
Figure 10A:
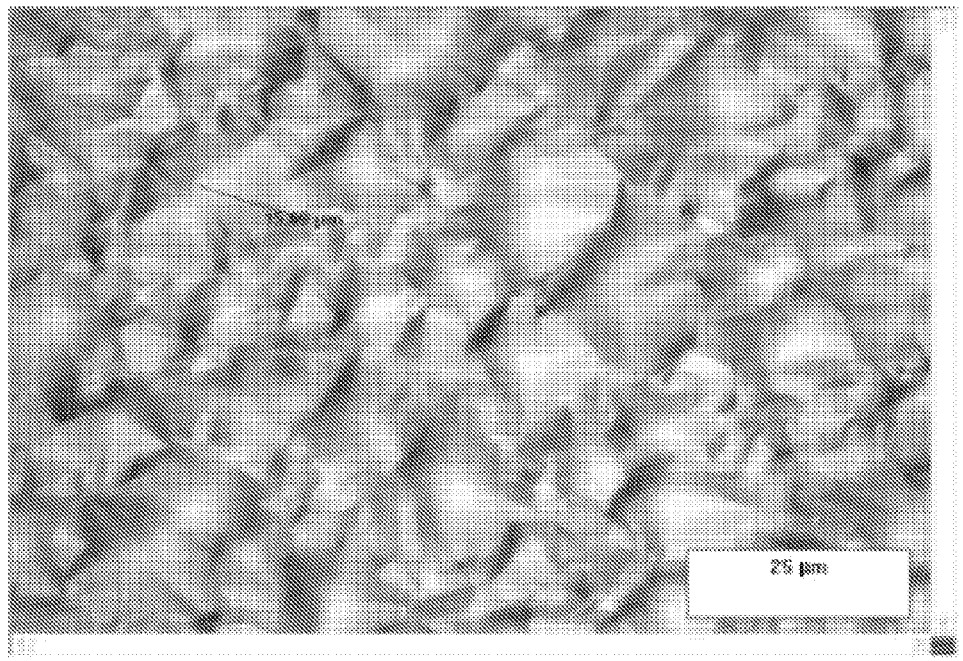
FIG. 10 illustrates optical microscope images of polycrystalline diamond grown at (a) 180 Torr, 32 μm, 2% CH$_4$/H$_2$; (b) 200 Torr, 56 μm, 3% CH$_4$/H$_2$; (c) 220 Torr, 96 μm, 4% CH$_4$/H$_2$; and (d) 240 Torr, 84 μm 5%, CH$_4$/H$_2$.
Figure 10B:
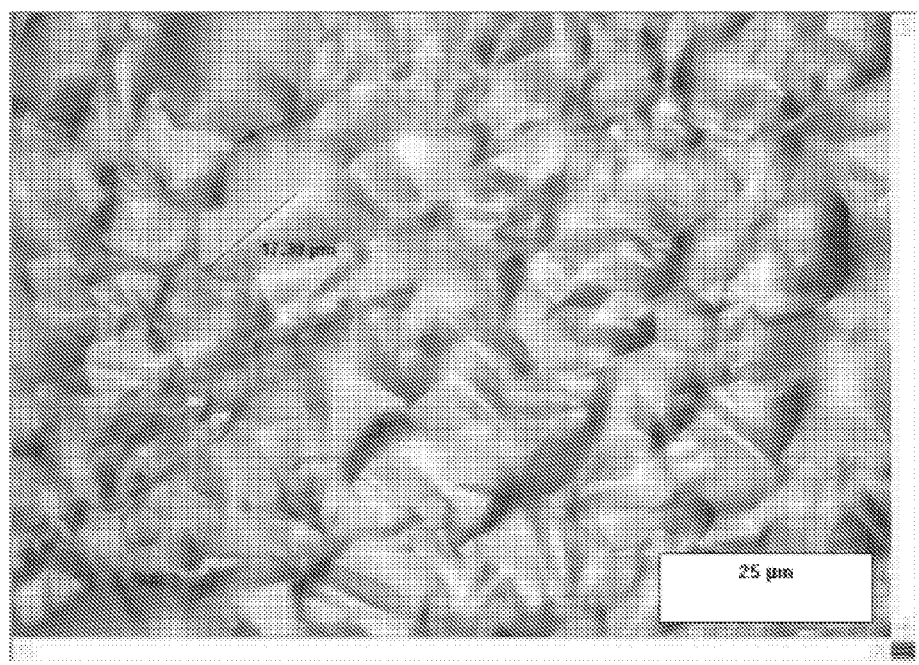
Figure 10C:
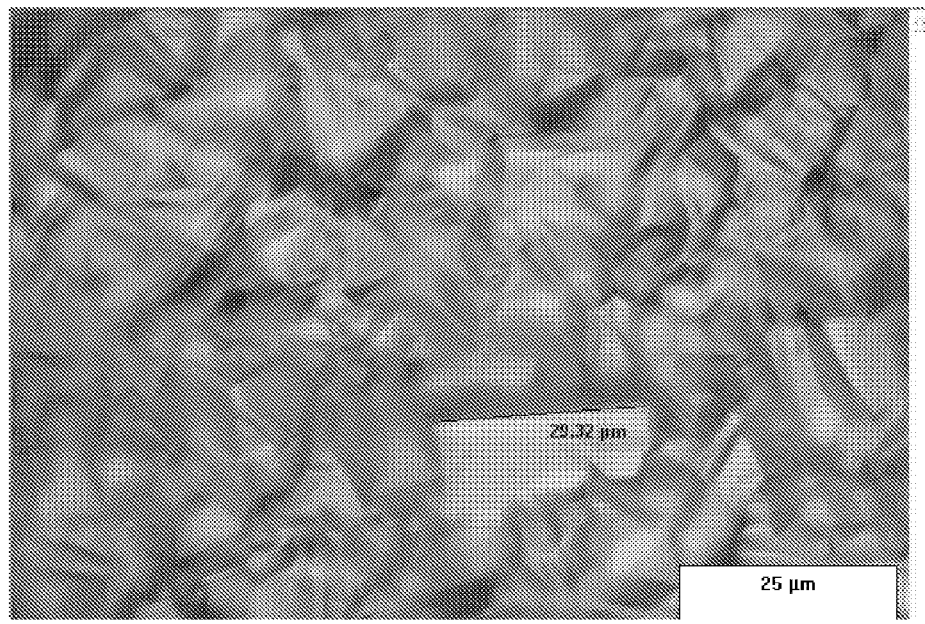
Figure 10D:
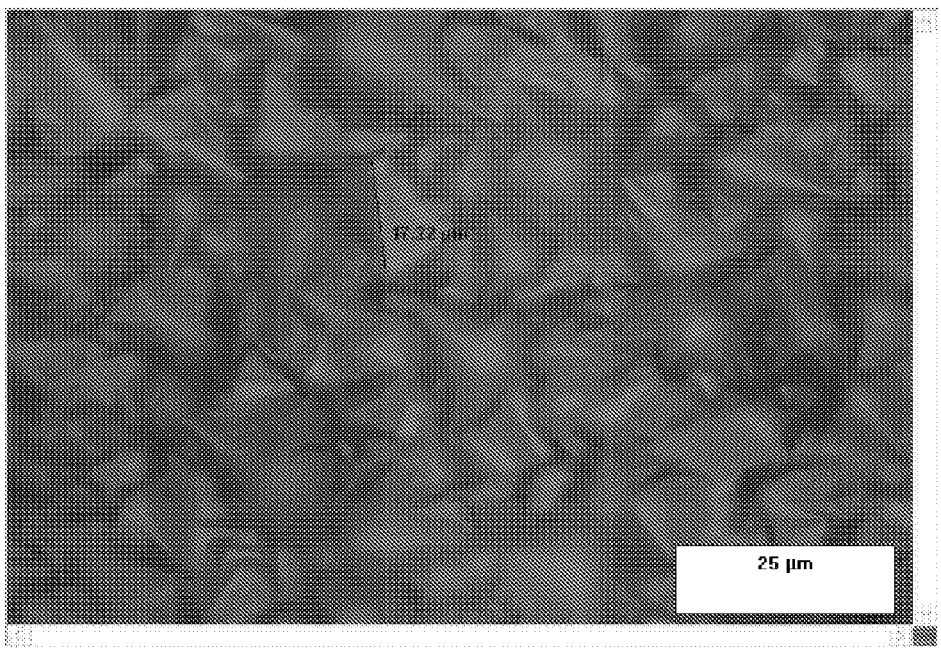

While the tuning process generally applies to the selection of favorable/optimum geometric parameters for reactor operation, other operating conditions can be parametrically varied over a plurality of values in addition to the plurality of L1 and L2 values as part of the tuning process. For example, the operating pressure and/or the source gas composition can be varied to characterize their influence on one or more deposition properties (e.g., as illustrated in FIGS. 6, 7, and 9).

The particular selection of geometric reactor parameters (e.g., coaxial stage 160 radius R3, coaxial stage 160 distance L1, lower conducting short 170 distance L2) permits operation of the reactor 100 under conditions that result in favorable/optimum properties of deposition process and/or resulting deposition film. Particular deposition properties of interest include applied power density, substrate temperature, deposition rate, and deposition uniformity. Thus, the reactor 100 is preferably capable of obtaining any combination of the foregoing deposition properties during operation, for example including deposition property values within the following ranges.

The power density (or discharge power density) is the absorbed microwave power divided by the plasma 184 volume. A relatively high power density is desirable as it generally leads to higher component deposition rates. In various embodiments, the power density is suitably at least about 50 $W/cm^3$, 100 $W/cm^3$, 120 $W/cm^3$, 160 $W/cm^3$, or 200 $W/cm^3$ and/or up to about 500 $W/cm^3$, 600 $W/cm^3$, 700 $W/cm^3$, 800 $W/cm^3$, 900 $W/cm^3$, 1000 $W/cm^3$, or 2000 $W/cm^3$.

During deposition, the temperature uniformity across the substrate 163A correlates with the size of the plasma 184. At low microwave powers, the plasma 184 may not completely cover the substrate 163A, leading to incomplete and/or non-uniform deposition. At higher microwave powers, the plasma 184 may expand in size to the point that it begins excessively heating the quartz bell jar 180. Thus, the substrate temperature uniformity and quartz bell jar temperature are preferably monitored and controlled during operation of the reactor 100 to achieve desired substrate temperature and substrate temperature uniformity without overheating the quartz bell jar (e.g., via the coolant 165A internal to the coaxial stage 160 and/or by adjusting the applied input power and/or operating pressure). For example, in a 2.45-GHz reactor and at elevated operating pressures of interest, the substrate temperature suitably ranges from about 1000° C. to about 1200° C., about 1050° C. to about 1200° C., or about 1100° C. to about 1200° C.

The deposition rate is suitably expressed as an integral property of the deposition process (i.e., total deposited (average) film thickness divided by the total deposition time, for example in microns per hour) and is desirably maximized to increase process throughput. In various embodiments, the deposition rate is suitably at least about 2 μm/h, 3 μm/h, 6 μm/h, 10 μm/h, 12 μm/h, or 15 μm/h and/or up to about 20 μm/h, 25 μm/h, 30 μm/h, 40 μm/h, 50 μm/h, 75 μm/h, 100 μm/h, or 150 μm/h (e.g., with the optional introduction of a nitrogen source gas) in particular for single crystal diamond and (microcrystalline) polycrystalline diamond. Deposition rates for nanocrystalline diamond are often lower, for example being at least about 50 nm/h or 100 nm/h and/or up to about 200 nm/h or 500 nm/h.

The deposition non-uniformity is desirably small so that the physical properties of the resulting film will be relatively homogeneous, regardless of how the resulting film is used in a practical setting. The deposition uniformity can be expressed as the percent relative deviation of the deposited component's film thickness measured at multiple (e.g., three or more) spatial locations (e.g., circumferential and/or radial locations) in the film. As reported herein, the deposition uniformity is the percent difference between the maximum and minimum measured thicknesses normalized to the average film thickness. In various embodiments, the deposition uniformity is suitably up to about 15%, 10%, 5%, or 3%. While the deposition uniformity is desirably as small as possible, process variability can result in deposition uniformities of at least about 0.1%, 0.2%, 0.5%, or 1%.

Generalized Improved Microwave Reactor Design

Figure 20:
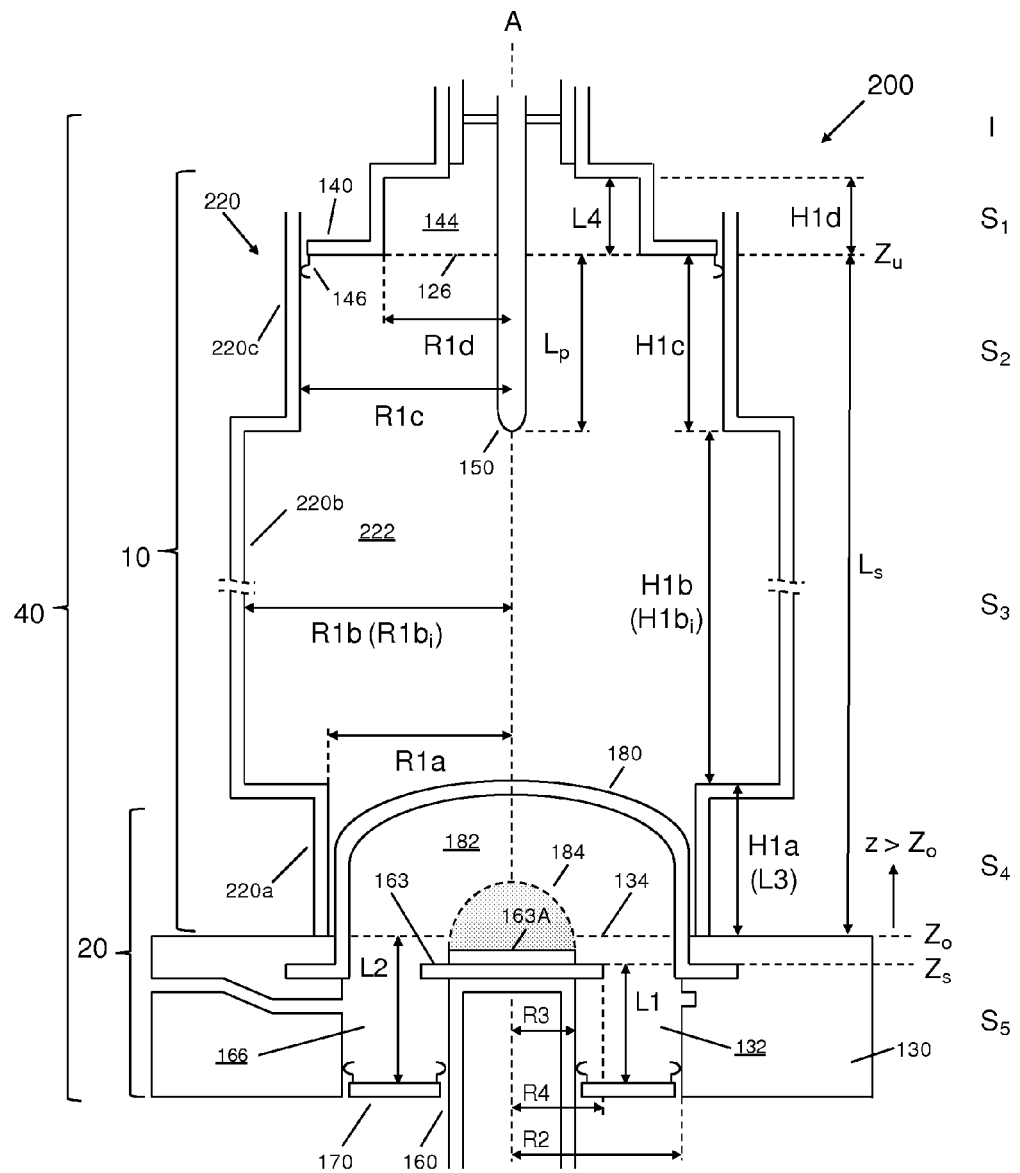
FIG. 20 illustrates a cross-sectional view of a generalized microwave plasma assisted reactor embodiment according to the disclosure.

In its most generalized form, the improved MCPR according to the present disclosure has many separate cylindrical coaxial and cylindrical waveguide sections each with different radii and variable lengths. An example of a generalized reactor design 200, which consists of an input section I and reactor sections $S_1$-$S_5$, is shown in FIG. 20. Analogous to FIG. 1A, the microwave chamber 10 includes a multi-section and/or variable-radius chamber 220, for example including cylindrical sections 220a, 220b, and 220c which define corresponding reactor sections $S_2$-$S_4$ (e.g., metallic sections with a step-wise (shown), linear, or curved profile transition therebetween). The chamber 220 and its sections 220a-c define an interior cavity 222 with respective radii and heights of R1a, R1b, and R1c and H1a (or L3), H1b, and H1c relative to the central axis A. As shown, the sliding short 140 can have a variable radius design (e.g., also with a step-wise profile as shown) to define the reactor section $S_1$ and the cylindrical cavity 144 with radius R1d and height H1d (or L4) adjacent to the uppermost section of the cavity 222 (e.g., reactor section $S_2$ defined by the cylindrical section 220c as illustrated).

The purpose of each section $S_1$-$S_5$ is (1) to guide and transmit microwave energy to the discharge load, (2) to impedance match the microwave power into the discharge, and (3) to appropriately spatially focus or refocus the microwave energy as it is transmitted through each individual waveguide section. By adjusting the position $Z_s$ of the substrate 163A in sections $S_4$ and $S_5$ above and below the Z=0 plane ($Z_0$; where $Z_s<Z_0$ is below $Z_0$ and $Z_s>Z_0$ is above $Z_0$), the electromagnetic (EM) field in the vicinity of the substrate 163A can be varied (although the electric field is primarily in the axial direction, both Ez and Er electric field components vary as $Z_s$ is varied) to achieve the desired CVD process growth rate and growth uniformity. The choice of the specific configuration (e.g., the number of and the specific lengths of each of the cylindrical waveguide sections) employed in a particular design depends upon on the requirements of the particular application. As is indicated in FIG. 20, the waveguide section $S_3$ can be further divided into multiple sections, each with a different radius $R1b_i$ and length/height $H1b_i$ (e.g., i=1 to n, where n is the number of sub-sections for waveguide section $S_3$). In this case, $R1b_i$/R1a can be greater than 1 to represent a focusing contraction. In various embodiments, the ratio $R1b_{i+1}$/$R1b_i$ can be less than or greater than one for adjacent subsections i and i+1 depending on whether the EM energy is being locally focused or defocused by the subsections. Similarly, the (coaxial) waveguide section $S_2$ and the (cylindrical) waveguide section $S_4$ can be further divided into multiple sections, each with a different radius $R1c_i$ or $R1a_i$ and length/height $H1c_i$ or $H1a_i$, respectively (e.g., i=1 to n, where n is the number of sub-sections for the waveguide section). In various embodiments, successive sections $R1c_i$ can be expanding and successive sections $R1a_i$ can be contracting in the direction from $Z_U$ to $Z_0$ to provide desired defocusing or refocusing, respectively, of EM energy passing through the microwave chamber 10.

As used herein, "focused" (or "refocused") and "defocused" are terms indicating a relative increase or decrease, respectively, in the electromagnetic power density of microwave energy in a microwave cavity/chamber, such as between neighboring or adjacent regions of the microwave cavity/chamber. Generally, the microwave energy density becomes focused or refocused as the wave propagates through the microwave cavity/chamber from a region having a relatively larger cross sectional area to a region having a relatively smaller cross sectional area (e.g., a sudden or gradual contraction in cross sectional area, such as in a plane generally perpendicular to a primary direction of propagation of electromagnetic energy in the apparatus). Similarly, microwave energy flux density generally becomes defocused as it propagates through the microwave cavity/chamber from a region having a relatively smaller cross sectional area to a region having a relatively larger cross sectional area (e.g., a sudden or gradual expansion in cross sectional area, such as in a plane generally perpendicular to a primary direction of propagation of electromagnetic energy in the apparatus). For example, in the context of FIG. 20, microwave energy emanating from the probe 150 is defocused as it propagates from section $S_2$ to $S_3$, and it is focused/refocused as it propagates from section $S_3$ to $S_4$ and into the plasma chamber 180.

Three-Section Microwave Chamber

Figure 21:
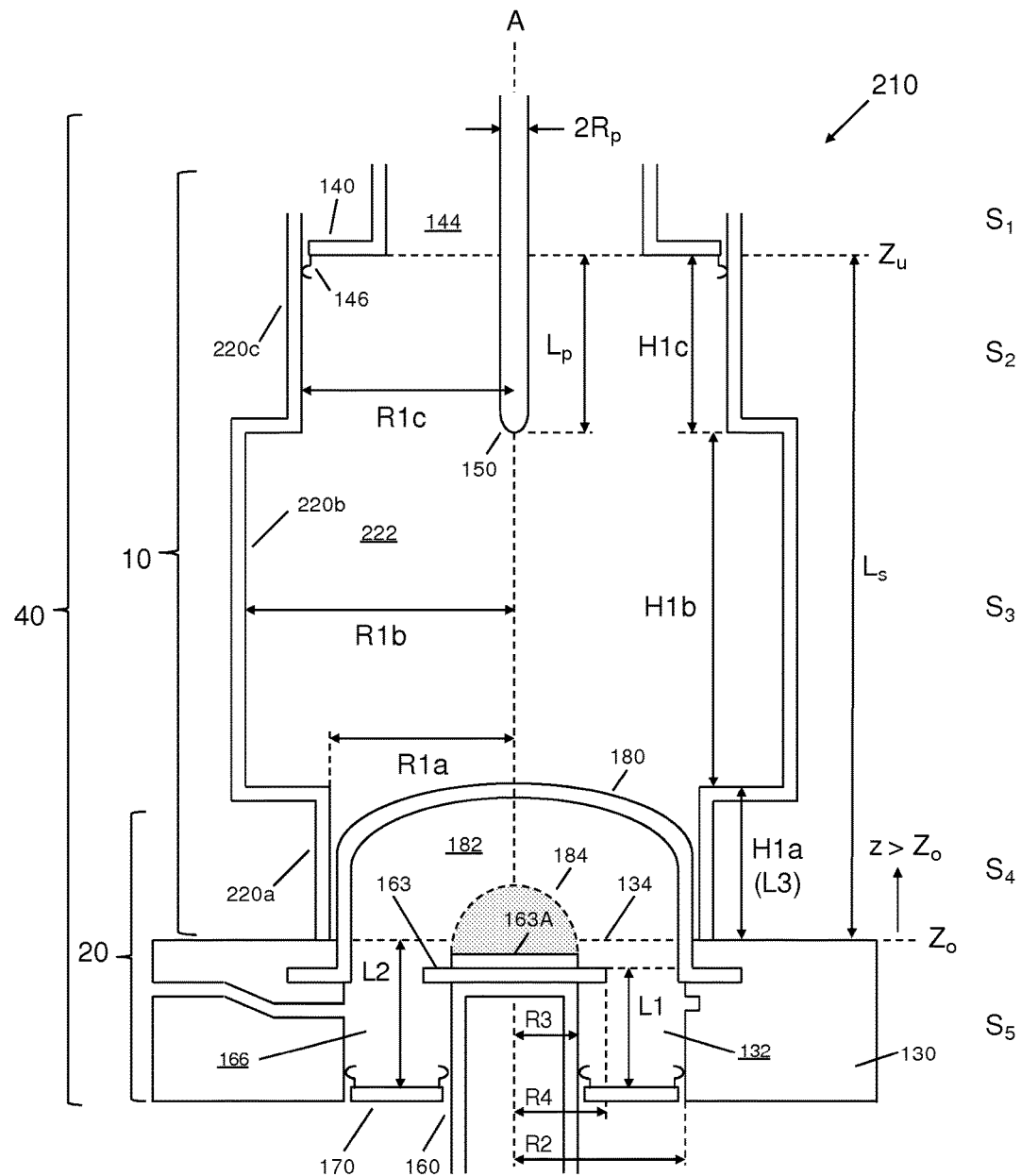
FIG. 21 illustrates a cross-sectional view of a microwave plasma assisted reactor embodiment with a three-section microwave chamber according to the disclosure.

A cross section of an embodiment of the more generalized reactor 200 design is shown in FIG. 21 as reactor 210. The reactor 210 design is close to the specific prototype reactor 214 (Reactor C) described in Example 10. It is used here to further describe the specific example reactor design and to explain its operation in greater detail.

The internal cavity 222 is cylindrically symmetric about a center z-axis A, and the $Z_0$ plane is identified as the bottom of the reactor 210 and the top of the substrate holder 163 is located in the vicinity of the $Z_0$ plane. The reactor 210 shown in FIG. 21 is divided into five interconnected but distinct cylindrical waveguide sections $S_1$-$S_5$. From the top to the bottom, these are identified as: section $S_1$ which is the coaxial input microwave feed; section $S_2$ which is a length-adjustable coaxial waveguide impedance-matching section of length Lp and radius R1c; section $S_3$ which is a cylindrical waveguide section of length Ls-L3-Lp and of radius R1b; section $S_4$ which is an additional cylindrical waveguide section of radius R1a, and length L3; and section $S_5$ which is a variable length, coaxial cavity section with radii R2 and R3 and variable length L2. The probe 150 has a radius $R_p$ and the position of the probe 150 and/or sliding short 140 can be adjusted to select the desired length $L_p$ (e.g., independently adjusted such that $L_p$ and H1c can be the same or different). The length L1 of the cylindrical center conductor of section $S_5$ is also independently variable (e.g., as described above relative to FIGS. 1A and 1B for the sliding short 170). The substrate 163A is placed on the top of the center conductor 163 of section $S_5$ near the $Z_0$ plane. Thus the position $Z_s$ of the substrate 163A is independently variable and is defined by $Z_s$=L1−L2. The center conductor 163 of section $S_5$ also serves as the substrate holder 163 and can be independently externally heated or cooled as described above.

As shown in FIG. 21, section $S_1$ is the coaxial waveguide input power port. Section (2), the second cylindrical coaxial waveguide section, behaves as an impedance matching section where in practice Lp is often adjusted to be close to a quarter TEM wavelength. In practice, the radial dimensions of this section (R1c and Rp), can be chosen to allow the propagation of a single TEM mode or the propagation of both the coaxial TEM and $TM_{01}$ modes. Section $S_3$ also acts like an impedance matching section and, for this embodiment, the radius R1b is larger than the radii R1d and R1c of sections $S_1$ and $S_2$, respectively (e.g., R1b>R1c>R1d). This causes an EM field intensity redistribution over the waveguide cross section of section $S_3$ and, for a given high input power operation, allows a lower EM power flux density (W/cm$^2$) to be transmitted through the empty waveguide region of section $S_3$ than the power flux density being transmitted through sections $S_1$ and $S_2$. Thus, section $S_3$ defocuses the microwave power as it is transmitted through the reactor 210 preventing at high input powers discharge formation in section $S_3$.

Section $S_4$ also behaves like an additional impedance matching and EM field refocusing section. Since it is desired to create an intense EM field region above the substrate 163A around the $Z_0$ plane and then maintain a discharge in this region at the center axis A of the reactor 210, the EM fields in section $S_4$ are refocused onto the substrate holder 163 location around the $Z_0$ plane. This is accomplished by reducing the radius from R1$b$ in section $S_3$ to R1$c$ of section $S_4$ and then adding the appropriate, additional coaxial waveguide section $S_5$ to the bottom of the applicator 40 enabling a strong electric field to be produced along the central z-axis A at the surface of the substrate 163A while avoiding power discharges in the microwave chamber 10.

Section $S_5$, (-L2≤z≤0), behaves as a TEM mode coaxial waveguide section. When excited with 2.45 GHz microwave energy, only the TEM waveguide mode is excited in this section. By adjusting the coaxial cavity lengths L1 and L2 to about 6.12 cm, which is a half TEM wavelength, a standing wave TEM$_{001}$ mode EM field exists in this section and a perpendicular electric field is produced on the surface of the substrate 163A. The substrate position $Z_s$ is further adjusted by slightly varying L1 to position the substrate 163A above or below the $Z_0$ plane as desired.

Variable-Radius Microwave Chamber

Figure 22:
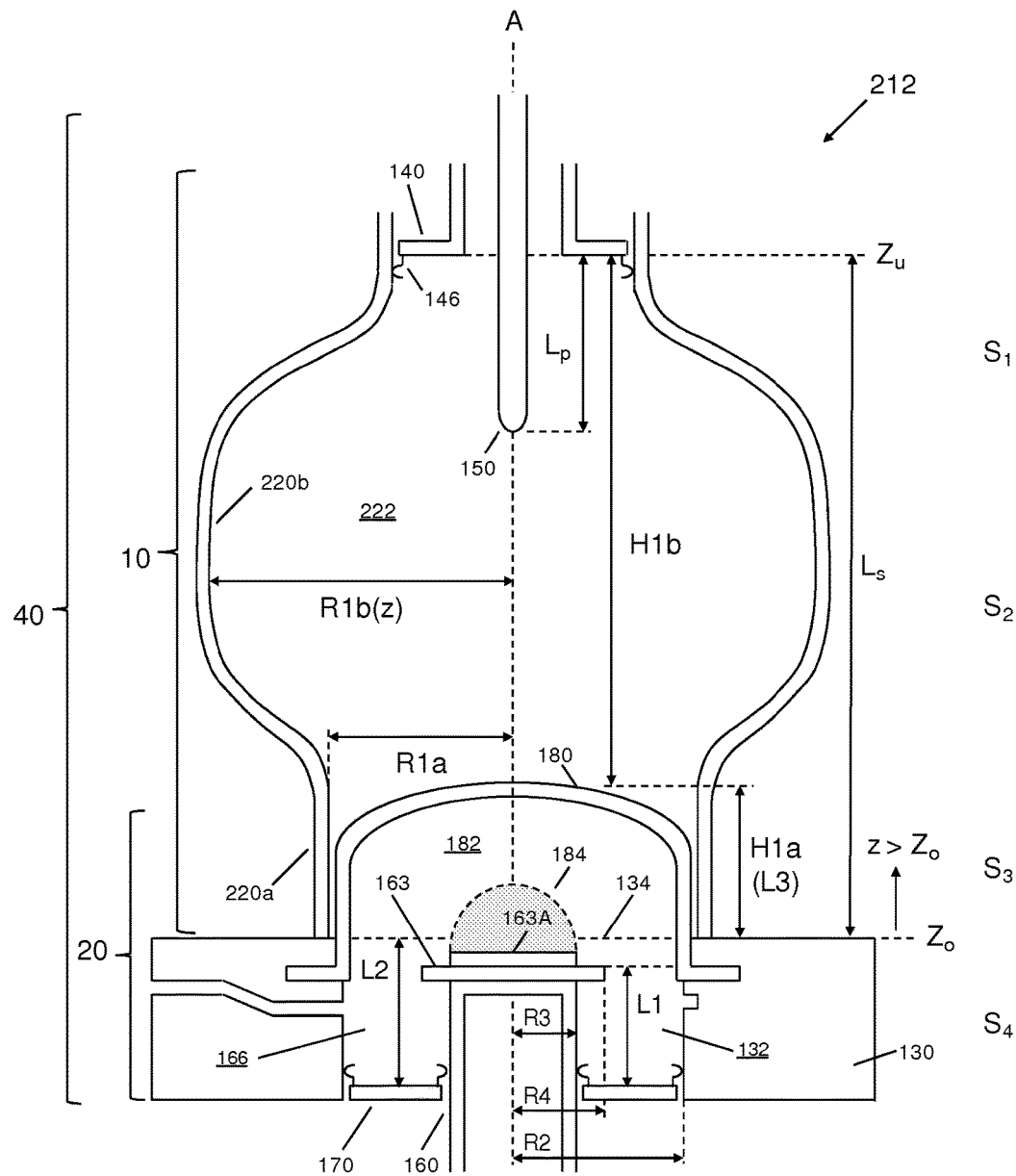
FIG. 22 illustrates a cross-sectional view of a microwave plasma assisted reactor embodiment with a variable-radius microwave chamber according to the disclosure.

Another embodiment of the generalized reactor 200 is shown in FIG. 22 as reactor 212 with a contoured, smooth curving wall/section 220$b$. The individual sections each with a different radii and length are replaced by a wall/section 220$b$ with a continuously varying radius R1$b$(z). As illustrated, from the top $Z_U$ of the applicator 40 down toward the $Z_0$ plane, the radius R1$b$(z) first increases and then, as the substrate location $Z_s$ is approached, the radius R1$b$(z) decreases. Thus, the discrete cylindrical sections shown in FIG. 20 can be replaced with a gradual, continuously varying wall/section of radius R1$b$(z). The particular variation of R1$b$(z) depends on the desired EM unfocusing and refocusing that is desired and may be selected based on the specific plasma processing application.

As shown, the curved, continuously varying section 220$b$ can be connected to a generally cylindrical section 220$a$ as described above. In other embodiments, the curved section 220$b$ can extend to the base 130 at $Z_0$ of the applicator 40.

EXAMPLES

The following examples illustrate several geometric designs and the performance of the high pressure/high power density reactor of FIG. 1B (and Example 1) with respect to polycrystalline and single crystal diamond deposition. In the following examples, a 2.45 GHz microwave plasma assisted CVD reactor along with its attendant power supply, source/effluent gas flow controllers, coolant flow controllers, etc. was structurally modified to incorporate one or more shim inserts such that L1 and L2 were independently adjustable (i.e., variably positionable lower conducting short and coaxial stage).

Example 1

High Pressure/High Power Density Reactor Design (Reactor B)

FIG. 1B illustrates the structure of a reactor designed according to the present disclosure that allows operation at higher discharge power densities and higher pressures. The substrate holder radius R4=3.24 cm and the coaxial cavity inner conductor radius R3=1.91 cm. Thus, the cross-sectional area of coaxial cavity center conductor is reduced by a factor of about 4.5 (i.e., the square of the ratio of R3 values is 4.68) relative to the reference reactor (Example 2 below). This modification focuses the electromagnetic energy on the reduced diameter substrate holder and increases the axial electric field intensity and the associated displacement current density at the location of the substrate surface. This redesign not only increases the plasma absorbed power density above the substrate, but also facilitates operation at higher pressures. The electromagnetic field focus at and above the substrate is additionally controlled and varied during process development by length-tuning the geometric variables L1, L2, $L_s$ and $L_p$. When a plasma discharge is present, this length tuning changes the electromagnetic field focus and in turn, changes the location and the shape of the plasma.

In the following examples, $L_s$ and $L_p$ are adjusted to excite and match the TM$_{013}$ mode in the cylindrical section of the applicator. Thus, $L_s$=20.3 cm and $L_p$=3.6 cm. During process optimization/tuning, L1 is held constant at 5.65 cm, while L2 is varied between 5.16 cm and 6.13 cm. Thus, ΔL (i.e., L1−L2) is varied between +0.49 cm and −0.48 cm, resulting in an experimental variation of about +/−0.5 cm around the $Z_0$ (or z=0) plane. As the substrate axial position is varied, the electromagnetic field intensity and spatial distribution also are altered in the local region of the discharge (i.e., around the $Z_0$ plane).

Example 2

Reference Reactor Design (Reactor A)

Several publications [6-7, 20-21] report the use of a 2.45 GHz-MPCR for CVD diamond synthesis over low to moderate operating pressures of 60 Torr to 160 Torr. The specific dimensions of this reference reactor are R1=8.89 cm, R2=7.04 cm, R3=4.13 cm, and R4=5.08 cm. The dimensions were chosen to enable diamond synthesis over larger substrate areas (i.e., about 5 cm to about 10 cm diameter) while operating in the low to moderate pressure regime (i.e., about 20 Torr to about 160 Torr). The performance of the reference reactor is compared with that of the high pressure/high power density reactor design according to the present disclosure.

Examples 3 to 5

Alternate High Pressure/High Power Density Reactor Designs

The higher pressure/high power density reactor design of Example 1 can be further modified for different target applications. For instance, the coaxial cavity inner conductor radius can be further reduced to R3=0.95 cm in a 2.45 GHz reactor (Example 3; where L1 and L2 represent approximate initial values prior to tuning). The reduced value for R3 further focuses the electromagnetic energy in the neighborhood of the substrate and substrate holder, thus further increasing the applied power density. In another embodiment, the reactor geometry can be scaled up for a 915 MHz microwave excitation frequency, for example to accommodate substrates up to about 10 cm to about 12 cm in diameter at operating pressures ranging from about 110 Torr to about 160 Torr (Example 4). In another embodiment, the reactor geometry can be scaled up to optimize the plasma performance for nanocrystalline diamond deposition at a 2.45 GHz microwave excitation frequency (e.g., about 300 nm/h at 160 Torr), for example to accommodate substrates up to about 10 cm in diameter at operating pressures ranging from about 40 Torr or 70 Torr to about 100 Torr to about 200 Torr (Example 5). In Example 5, the reactor's cylindrical chamber has a dual-radius design, with (a) a lower portion of the chamber having a radius of about 12.2 cm and a height essentially the same as the extent to which the quartz bell jar extends into the microwave chamber and (b) an upper portion of the chamber having a radius of about 15.6 cm and extending the remainder of the way to the top of the chamber (e.g., at least up to the location of the upper conducting short).

The various geometric parameters of Examples 1-4 are summarized in Table 1.

The experimental pressure variation ranged between 60 Torr and 240 Torr, and microwave input powers varied between 1.5 kW and 2.8 kW. The reflected power was less than 5% of the incident power, which indicated a good impedance match into the MCPR. Hydrogen and methane were the synthesis gases, and the percentage of methane was varied from 2% to 5% (i.e., mol. % $CH_4$ relative to $H_2$). The hydrogen flow rate was fixed at 400 sccm and methane flow varied from 8 sccm to 20 sccm. The $H_2$ and $CH_4$ source gases source had a purity level of 99.9995% and 99.99% respectively, and no additional $N_2$ was added into the gas system. A one-color pyrometer (emissivity set to 0.6) was used to monitor the substrate temperature during the diamond deposition through a viewing port window on the cavity applicator.

During ignition at about 5 Torr, the plasma discharge initially filled the whole discharge chamber, and a similar effect was observed on the reference reactor (Example 2). As the pressure was gradually increased, however, the plasma size began to shrink at about 60 Torr and gradually became smaller as the pressure reached 240 Torr. FIGS. 3A-3E display photographs of the plasma discharge hovering over the silicon substrate as the operating pressure increases from 180 Torr to 260 Torr. At high pressure, the discharge has a

TABLE 1

Reactor Scales

| Property | Example 1 | Example 2 | Example 3 | Example 4 | Example 5 |
|---|---|---|---|---|---|
| Frequency | 2.45 GHz | 2.45 GHz | 2.45 GHz | 915 MHz | 2.45 GHz |
| R1 | 8.89 cm | 8.89 cm | 8.89 cm | 30.0 cm | 15.6 cm |
| R2 | 7.04 cm | 7.04 cm | 7.04 cm | 15.0 cm | 11.5 cm |
| R3 | 1.91 cm | 4.13 cm | 0.95 cm | 9.5 cm | 6.78 cm |
| R4 | 3.24 cm | 5.08 cm | ~1.25 cm-~1.5 cm | 12.0 cm | 10.0 cm/12.2 cm |
| L1 | 5.65 cm | ~5.63 cm-~6.63 cm | 5.65 cm | ~15.4 cm-~17.4 cm | 6.22 cm |
| L2 | 5.16 cm-6.13 cm | ~6.13 cm | 5.65 cm | ~16.4 cm | 5.71 cm |
| $L_s$ | 20.3 cm | 20.3 cm | 20.3 cm | 60 cm | ~16 cm-~17 cm |
| $L_p$ | 3.6 cm | 3.6 cm | 3.6 cm | ~8.2 cm | ~3.2 cm |

Example 6

Polycrystalline Diamond Deposition

The reactor of Example 1 was tested for its ability to deposit (microcrystalline) polycrystalline diamond at high operating pressures and high power densities.

Start up and experimental procedures: Before plasma ignition, the applicator is length-adjusted to excite the hybrid electromagnetic resonance. Discharge ignition is achieved at pressures of about 1 Torr to about 20 Torr. Once the discharge is ignited, $L_s$ and $L_p$ are readjusted to match the microwave power into the applicator and hence into the discharge, and pressure is also increased to the desired operating pressure. The substrate is a 25.4 mm-diameter and 1.5 mm-thick silicon wafer. The silicon wafer is nucleation seeded by mechanical polishing using natural diamond power of size ≤0.25 μm, cleaned using acetone and deionized water, and then placed on the molybdenum substrate holder. The linear diamond growth rates are determined by measuring the weight of the substrate before and after deposition (i.e., total weight gain) divided by the deposited substrate area and mass density of diamond 3.515 g/cm$^3$. Calibrated incident and reflected power meters are located in the input microwave circuit, and the input absorbed microwave power is determined from the difference between the experimentally measured incident and reflected power.

green color and has an intense almost white center core. As illustrated, the discharge becomes more visually intense, and shrinks in size as the pressure increases.

Figure 4A:
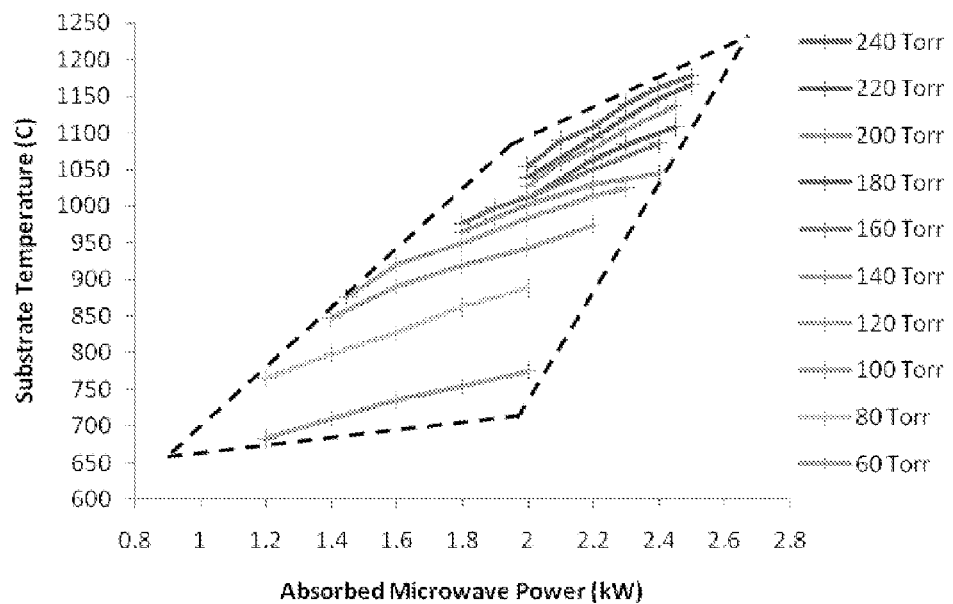
FIG. 4 illustrates substrate temperature as a function of absorbed microwave power at operating pressures of 60 Torr-240 Torr (a) and 180 Torr-240 Torr (b).
Figure 4B:
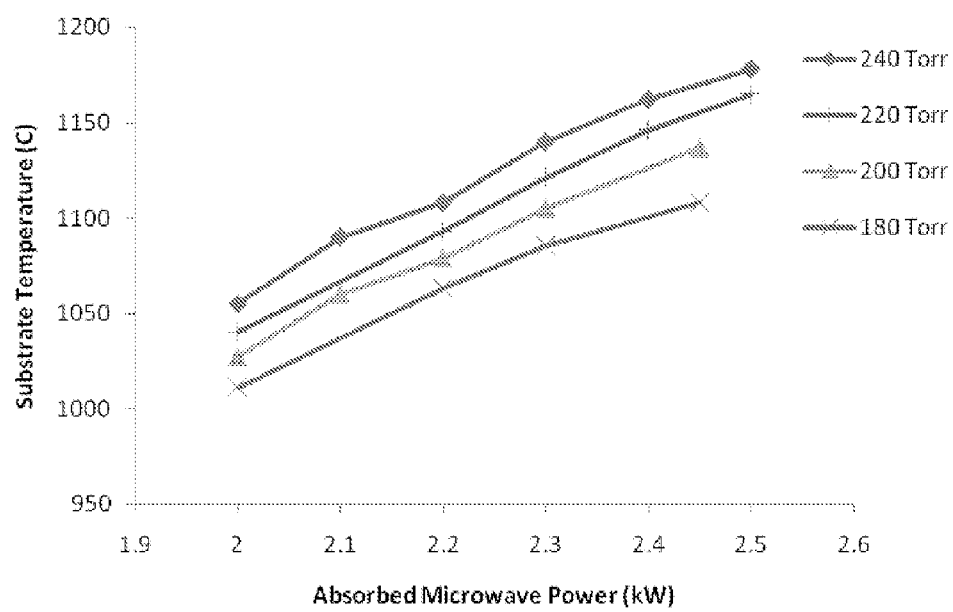

Reactor operation: When the reactor geometry, substrate size, and total gas flow rate are held fixed, the deposition process is a function of input power, pressure, substrate temperature, and methane concentration. The major variables are the input power, pressure and substrate temperature. The relationship between these variables is nonlinear, and the relationship between them can best be understood by experimentally measuring and plotting a set of these curves [20, 21, and 24] to illustrate the substrate temperature as a function of input power and operating pressure. FIGS. 4A and 4B are operating curves for the Example 1 reactor where the reactor geometry is held fixed at $L_s$=20.5 cm, $L_p$=3.5 cm, L2=6.13 cm, and ΔL=−0.48 cm, the total gas flow rate is 412 sccm, and methane percentage is 3%.

Each of the experimental curves in FIG. 4A is plotted for a constant pressure and the set of curves displays the variation of the substrate temperature versus input microwave power over the entire 60 Torr to 240 Torr pressure regime. Only the safe and process useful operating data points are displayed in FIG. 4A. The allowable operating regime is the area enclosed within the dashed line boundary. The enclosed region displays the acceptable experimental operating region for process operation and optimization. The left hand side of the enclosed region is determined by the minimum power required to generate a discharge of sufficient size to cover the substrate while the right side of the enclosed region is determined by the power required to completely cover the substrate without touching the discharge chamber walls. Thus, at each operating pressure, the right hand side of the data points represents the approximate limit of the maximum input power at that pressure before reactor wall heating becomes a problem.

Several observations can be made from the curves of FIG. 4. First, as the pressure and input power increase, the substrate temperature increases. At low pressures, the change in substrate temperature is less sensitive to input power changes than at high pressure (i.e., the slope of the lines of constant pressure increases as pressure increases). However, the substrate temperature is more sensitive to pressure changes at low pressures than at high pressures. For a fixed reactor geometry, the experimental synthesis is more sensitive to input power changes at high pressures than at lower pressures. Thus, at high pressures, the input power is preferably actively experimentally monitored to keep the process within the desired temperature deposition conditions (e.g., in a feedback control loop adjusting the input power in response to measured changes in the substrate temperature).

Figure 5:
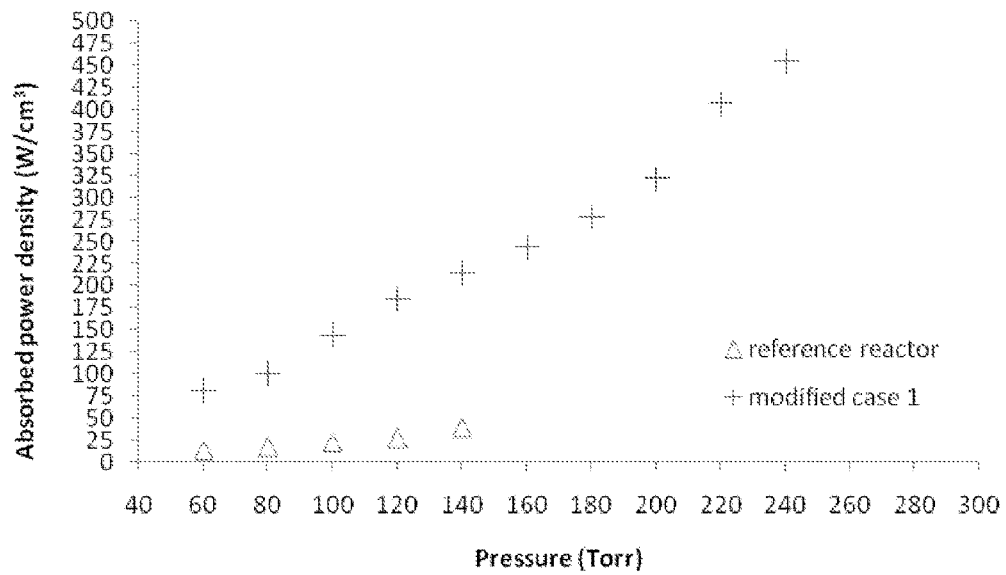
FIG. 5 illustrates absorbed plasma power density as a function of operating pressure for both the reference reactor (R3=4.13 cm and R4=5.08 cm) and the modified reactor (R3=1.91 cm and R4=3.24 cm).

Discharge power density: The discharge power density is defined as the input absorbed microwave power divided by the plasma volume. The input absorbed microwave power is determined from the difference between the incident and the reflected power meters. The plasma volume is approximated by taking length-calibrated photographs of the discharge within the allowable reactor operating region, defining the discharge volume as the volume of the brightest luminescence of the discharge, and then determining the discharge volume from the visual photographs. An example of the experimentally measured discharge power density versus operating pressure for the high pressure reactor of Example 1 is presented in FIG. 5. Here, the experimental data were taken with fixed reactor geometry where L2 was held constant at 6.13 cm as the pressure was increased from 60 Torr to 240 Torr. As shown, the discharge power density increased from about 80 W/cm$^3$ to about 500 W/cm$^3$ as the pressure increases from 60 Torr to 240 Torr. In FIG. 5, the high pressure reactor is also compared with the power densities of the reference reactor. The power densities of the redesigned reactor are much larger than similar power densities from the reference reactor. Specifically, the corresponding absorbed power densities for the reference reactor shown in FIG. 5 vary from 20 W/cm$^3$ to 45 W/cm$^3$ as the pressure increases from 60 Torr to 140 Torr [20], while the corresponding discharge power densities of the Example 1 reactor vary from 60 W/cm$^3$ to 225 W/cm$^3$ over the same lower operating pressure range. Accordingly, the reduction of the center conductor area by a factor of about 4.5 increases the power density by a factor 4-5. Thus, at a constant pressure, the reduction of the powered electrode diameter significantly increases the power density of the discharge, and the increase in power density is inversely proportional to the substrate area.

Reactor tuning: When operating at a constant pressure within the allowable deposition region shown in FIG. 4, the reactor performance can be further optimized by length-tuning the coaxial cavity (i.e., by adjusting ΔL). Thus, within the allowable deposition region shown in FIG. 4, each curve can be modified by adjusting the coaxial cavity section of the applicator. When this is done, the electromagnetic focus is altered around the $Z_0$ (z=0) region, and the substrate also is moved changing by its axial position relative to the $Z_0$ plane (i.e., either above or below the plane). As the substrate position changes, the position, size, shape, and power density of the microwave discharge is also varied in a complex nonlinear fashion.

As the substrate position is lowered from a position above to a position below the $Z_0$ plane, the discharge size decreases, its position with respect to the substrate changes, its power density increases, and the substrate temperature increases. FIGS. 6 and 7 display the variations of substrate temperature and discharge power density, respectively, as a function of operating pressure as the substrate position. In the figures, ΔL varies from +4.9 mm (i.e., the substrate is above the $Z_0$ plane and closer to the excitation probe) to −4.9 mm (i.e., the substrate is below the $Z_0$ plane and further away from the excitation probe). These curves demonstrate that at a constant pressure, the substrate temperature can vary more than 300° C., and the associated plasma power density also changes dramatically. For example as shown in FIG. 7 at 240 Torr, as the substrate position is varied from +4.9 mm to −4.9 mm, the substrate temperature changes from 875° C. to 1175° C. The substrate temperature increases as the substrate is lowered below the $Z_0$ plane. As the substrate is lowered, the discharge shape is changed, its volume is reduced, and the discharge becomes more intense. The associated discharge power densities vary from about 225 W/cm$^3$ at z=+4.9 mm to 525 W/cm$^3$ at z=−4.9 mm. These experiments clearly demonstrate the ability to tune the reactor by altering the substrate temperature, the discharge position, and the power density as the coaxial cavity size is changed.

Process Optimization: A set of separate eight-hour deposition experiments was performed to investigate the deposition rate variation as a function of substrate position at a constant pressure of 220 Torr and at a constant 3% methane concentration. L1 was held constant while L2 was varied in five steps such that the substrate position (ΔL) varied from +4.9 mm to −4.9 mm. The input power only varied slightly from 2.6 kW to 2.8 kW. The experimental results are displayed in FIGS. 8A and 8B. For each of the experimental data points presented in the figure, the discharge size was slightly adjusted by varying the input power to achieve uniform deposition. Generally, it is desired to have the size of the plasma discharge cover the entire substrate in order to achieve deposition uniformity. However, at higher-pressure operation, the plasma discharge size can be slightly smaller than the substrate surface area and still achieve uniform deposition. As long as the plasma hovers around and remains in good contact with the substrate, it will produce a uniform temperature distribution on the substrate and deposition uniformity.

Figure 8A:
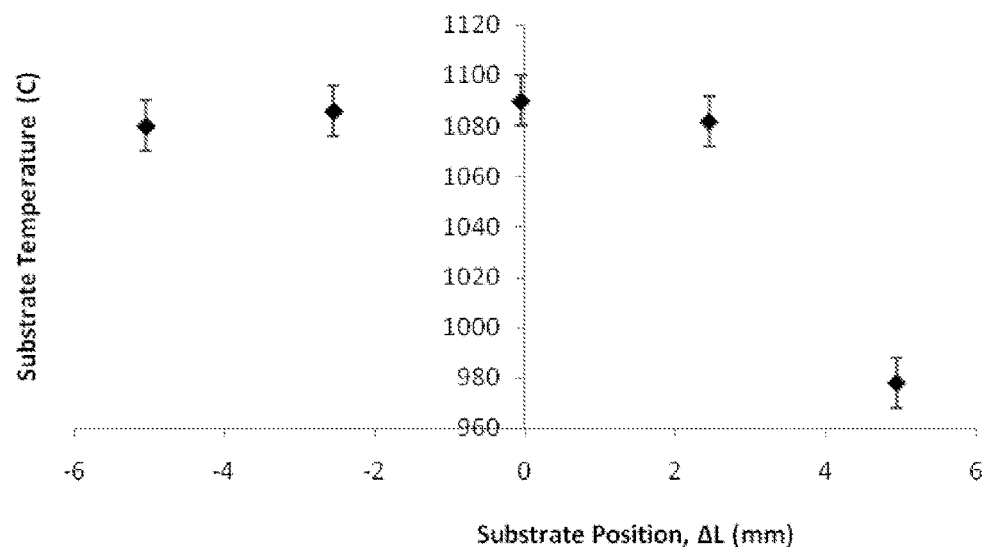
FIG. 8 illustrates substrate temperature (a) and diamond growth rate (b) versus substrate position (ΔL).
Figure 8B:
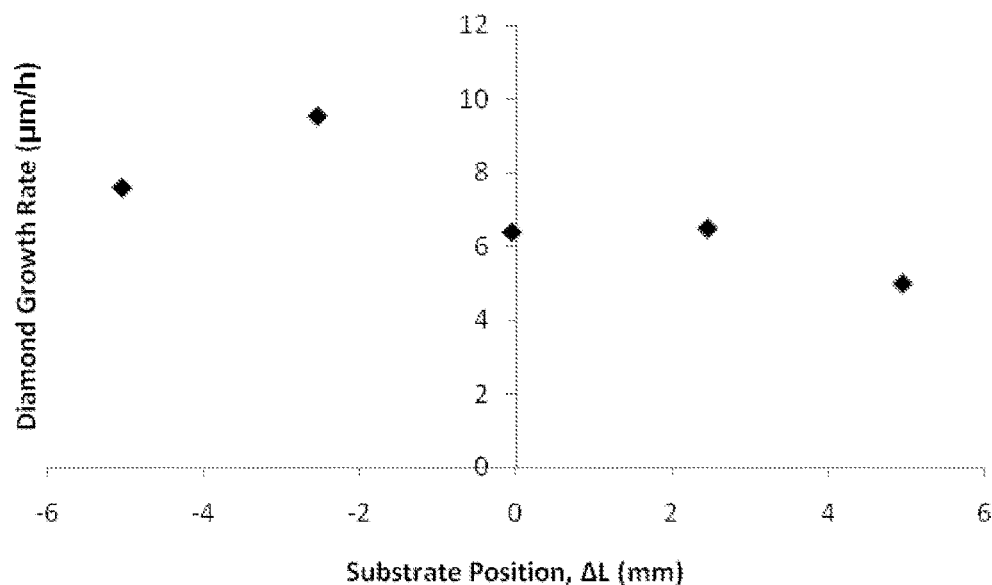

As can be observed from the measurements presented in FIGS. 8A and 8B, relatively small adjustments in L2 can have a substantial influence on the resulting deposition rate. As L2 is varied, the electromagnetic fields in the region around the $Z_0$ plane substantially change, resulting in a variation in the shape and the position of the discharge. By varying the substrate position a few millimeters, the deposition rates vary from 5.4 μm/h to 9.5 μm/h. At ΔL=−4.9 mm, the deposition rate decreases. In this case, the substrate temperature has begun to decrease since the discharge is starting to separate from the substrate. These experiments demonstrate the benefit at higher operating pressures of varying the coaxial cavity dimensions to achieve optimum diamond synthesis (e.g., uniform and high deposition rate). The very non-uniform, buoyant, and high pressure nature of the microwave plasma discharge means that the reactor preferably has the ability to control and position the discharge with respect to the substrate in order to achieve optimum deposition. Thus the reactor tuning adjustments are very useful in order to control and optimize the deposition process.

Diamond growth rates, morphology and uniformity: Diamond film synthesis was investigated over a range of process conditions and the experimental results are displayed in FIG. 9. Specifically, in a series of eight-hour experimental deposition runs, polycrystalline films were deposited on one-inch silicon wafers as pressure was varied from 180 Torr to 240 Torr and methane concentrations were varied from 2% to 5%. Input power levels (see FIG. 4) were varied from about 2 kW to about 2.5 kW as pressure and methane concentrations were varied. For each measurement, the reactor length was adjusted to yield a good deposition rate. For all the data points in FIG. 9, the rector length scales were the same (as shown in Table 1—Example 1) except for a change in $\Delta L$. For experiments above 200 Torr, $\Delta L=-0.48$ cm; for experiments at 200 Torr and below, $\Delta L=-0.31$ cm. In both cases, the substrate was located below the $Z_0$ plane in order to produce good deposition rates. As is shown in FIG. 9, the linear deposition rates increase as pressure and methane concentration increase. The substrate temperature during the deposition varied from about 1030° C. to about 1150° C. for this set of operating pressures.

A comparison of these deposition rates with the lower pressure and lower power density performance of the reference reactor indicates a significant improvement in linear deposition rates. When operating at 130 Torr to 140 Torr the maximum deposition rates were about 6 µm/h using a 3% methane concentration [6, 7, 20, and 21]. According to the present disclosure, however, maximum deposition rates exceed 10 µm/h and, at the higher pressures and methane concentrations, the deposition rates are above 20 µm/h. These deposition rates also compare favorably with the rates reported at 200 Torr with a millimeter wave plasma assisted CVD reactor [24].

The diamond morphology was determined by analyzing the diamond samples using optical microphotographs. The grain size of the synthesized polycrystalline diamonds varies along the surface of the substrate and it is mainly dependent upon the operating pressure, gas chemistry, and deposition time. Typical grain sizes range from about 10 µm to about 50 µm for 180 Torr to 240 Torr and 2% to 5% $CH_4$ gas chemistry. As the pressure increases, the grain size tended to increase up to several tens of micrometers. The polycrystalline grown diamond mostly exhibits a pyramidal shape, as shown in FIGS. 10A to 10D, with the thickness of the polycrystalline diamond layers ranging from 32 µm to 96 µm.

Figure 11A:
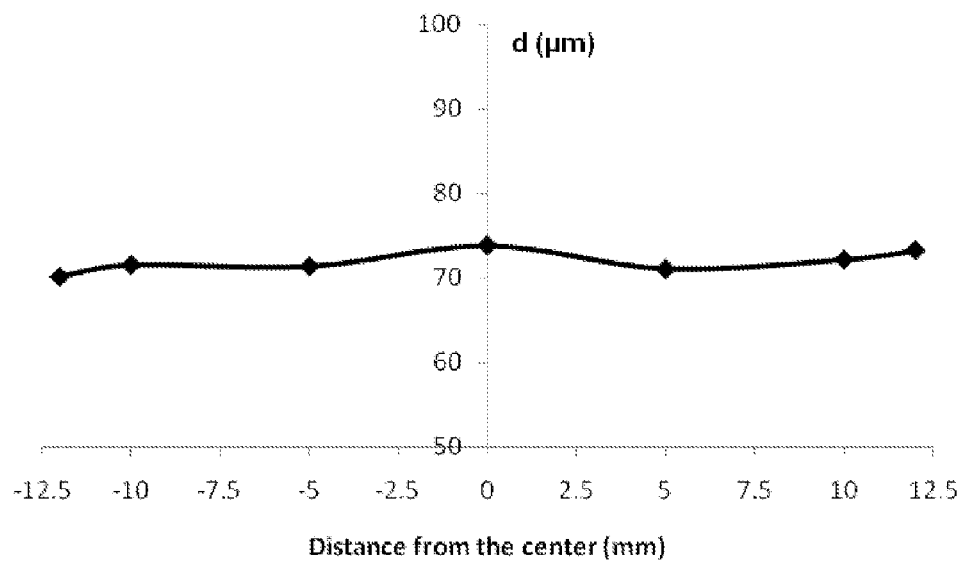
FIG. 11 illustrates diamond film uniformity for a 25.4 mm-diameter substrate (a: radial distribution of film thickness (d in μm); b: circumferential distribution of film thickness (d in μm) at a radial position 12 mm from the substrate center.
Figure 11B:
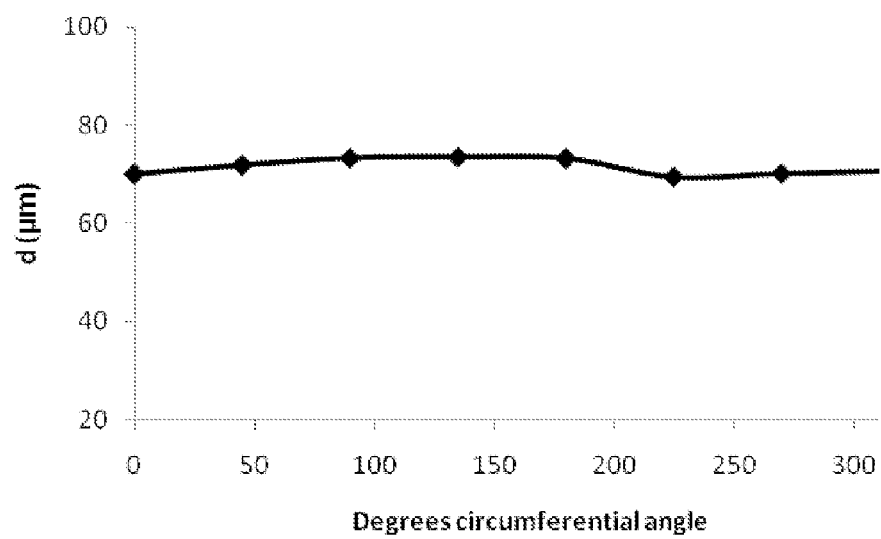

The grown diamond uniformity is deduced from the diamond thickness profile. The thickness distribution is determined by using a tip connected to a Solarton linear encoder. Prior to diamond deposition, the non growth surface of the substrate was marked and the thickness of the brand new silicon wafer measured at several points both in radial and circumferential directions. After the deposition, the exact same points on the substrate were re-measured to obtain the final diamond thicknesses. FIGS. 11A and 11B show the radial and circumferential diamond film uniformity for a film of 73 µm nominal thicknesses on a 25.4 mm diameter substrate with an operating pressure of 220 Torr and a source gas flow of 400 sccm $H_2$ and 12 sccm $CH_4$ (i.e., 3% methane). The L1=5.65 cm, L2=6.05 cm, $L_s$=20.3 cm, $L_p$=3.8 cm, with a microwave absorbed power of 2.3 kW and a substrate temperature of 1120° C. As shown, a good uniformity of grown diamond can be achieved at this operating high pressure, similar to the deposition at lower pressures. The variation in the thickness uniformity across the substrate surface was ±1.30 µm radially and ±1.63 µm circumferentially at a radial distance of 12 mm. These variations are determined based on maximum and minimum thickness values across the substrate surface points.

Diamond quality: Diamond quality was determined from visual observations of the color and transparency of the freestanding films, from the Raman scattering spectrum of the films, and from optical and IR transmission measurements of freestanding films. The freestanding films were produced by removing the silicon substrate by placing the deposited film and substrate into a wet etching solution of nitric acid, deionized water, and hydrofluoric acid. In order to reduce the surface roughness and produce a smoother flat diamond surface some of the samples were polished and lapped prior to back etching. This allowed more accurate measurements on the IR transmission.

Figure 12A:
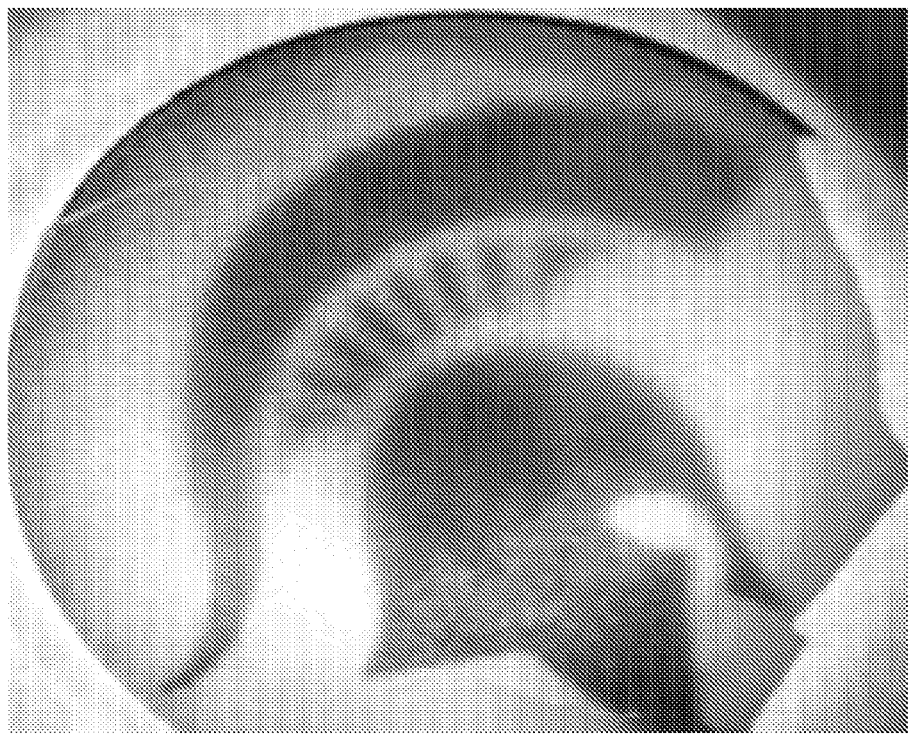
FIGS. 12A-12D illustrate polycrystalline diamond over a graphic logo (a: unpolished, 32 μm, 2% CH$_4$/H$_2$ at 180 Torr; b: unpolished, 68 μm, 3% CH$_4$/H$_2$ at 180 Torr; c: unpolished, 133 μm, 4% CH$_4$/H$_2$ at 180 Torr; d: polished, 2% CH$_4$/H$_2$ at 200 Torr).
Figure 12B:
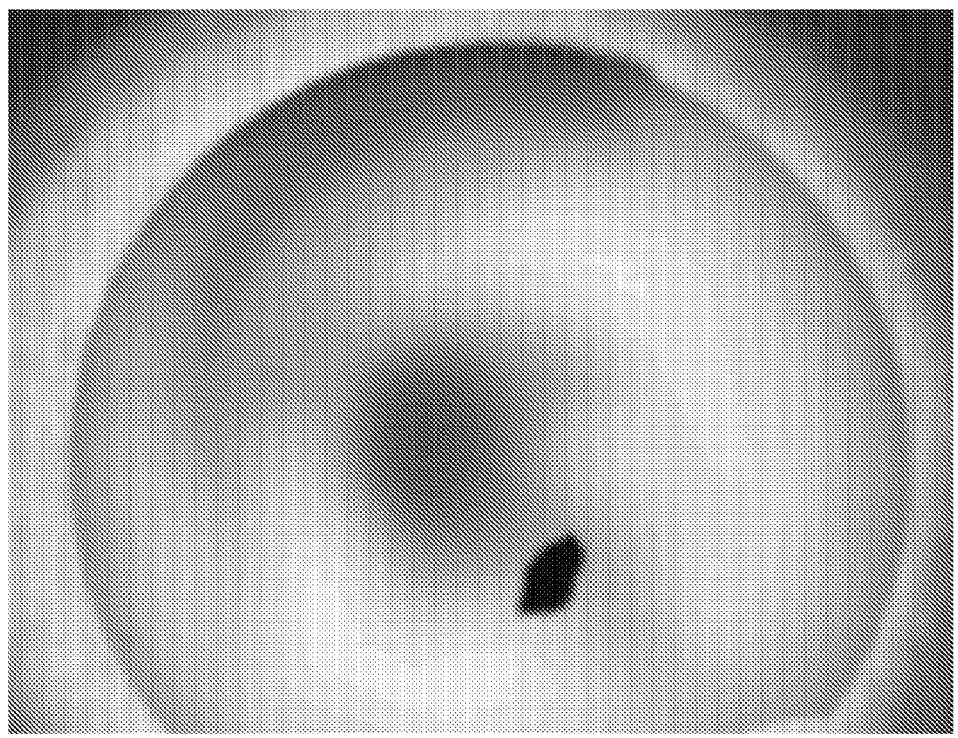
Figure 12C:
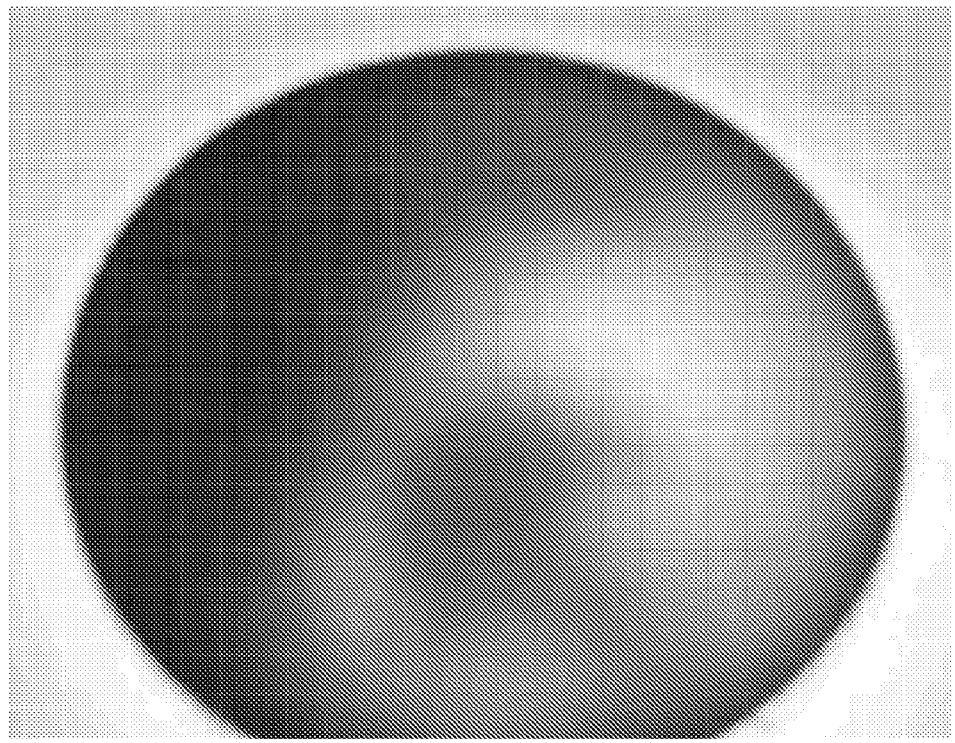
Figure 12D:
Figure 12E:
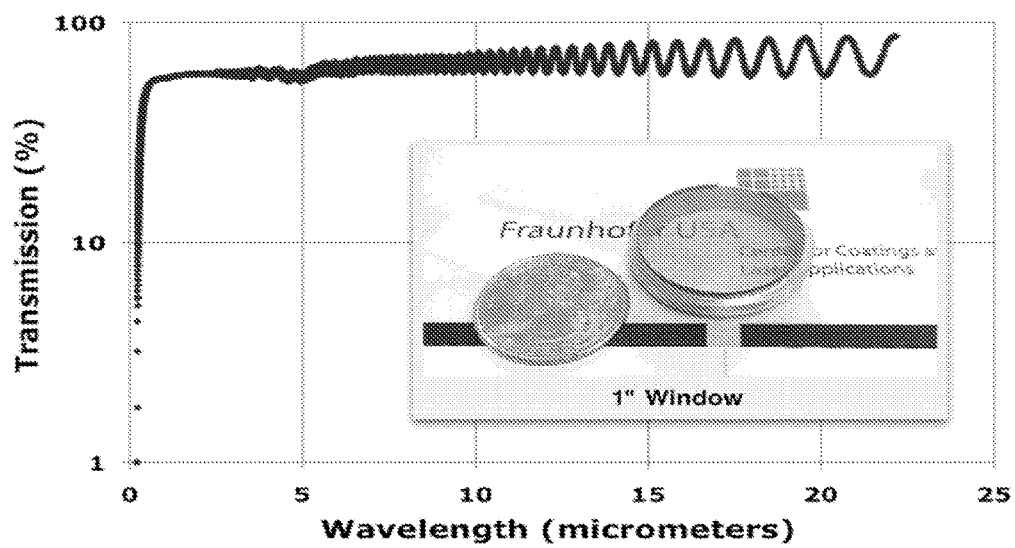
FIGS. 12E and 12F illustrate FTIR and UV transmission spectra for polycrystalline diamond deposited at 200 Torr and 2% methane.
Figure 12F:
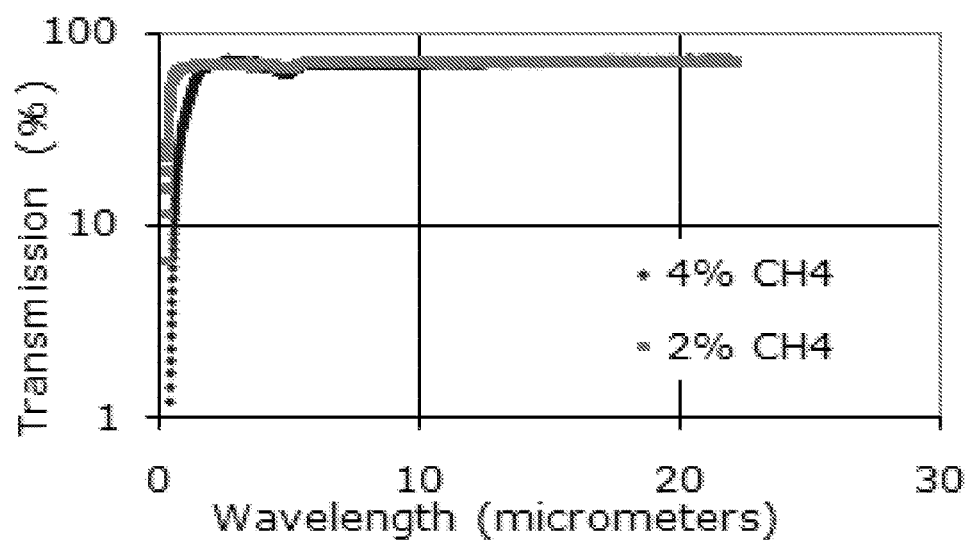

In terms of diamond transparency quality, when the source gas chemistry is varied from 2% to 4% at a fixed operating pressure of 180 Torr, several freestanding polycrystalline diamond films were obtained as shown in FIGS. 12A to 12C. These grown diamonds are smooth on the nucleation side and rough on the growth side since they are unpolished. As is visually apparent, the transparency of the grown diamond decreases as the gas chemistry increases from 2% to 4% methane and the film thickness correspondingly increases from 32 µm to 133 µm. The quality of the 2% and 3% films appears to be good, since one can see through them and they are also white. Hence, lower gas chemistry concentration results in higher freestanding diamond quality at this pressure regime. FIG. 12D is a polished (to a final thickness of about 70 µm) and lapped freestanding diamond film grown at 200 Torr, with 2% methane concentration, 30 hours deposition time, and a growth rate of 3.5 µm/h. As can be seen, the grown diamond exhibits a good visual transparency showing the graphic logo underneath the film sample. Transmission spectra for the polycrystalline diamond window grown at 200 Torr and 2% methane are shown in FIG. 12E. The photo inset displays a free standing diamond film after being polished, lapped and silicon substrate removal via chemical etching. The highly monochromatic FTIR region of the data shows interference maxima and minima about an average of approximately 71% in the mid-IR, as expected for a diamond refractive index of 2.38. The UV transmission drops to zero upon the onset of band-gap absorption at 222 nm. The absorption observable between approximately 3 and 5 micrometers is principally due to two-phonon absorption that occurs in intrinsic diamond. The transmission of 2% $CH_4$ shows better results in the UV than the 4% $CH_4$ (FIG. 12F).

Figure 13:
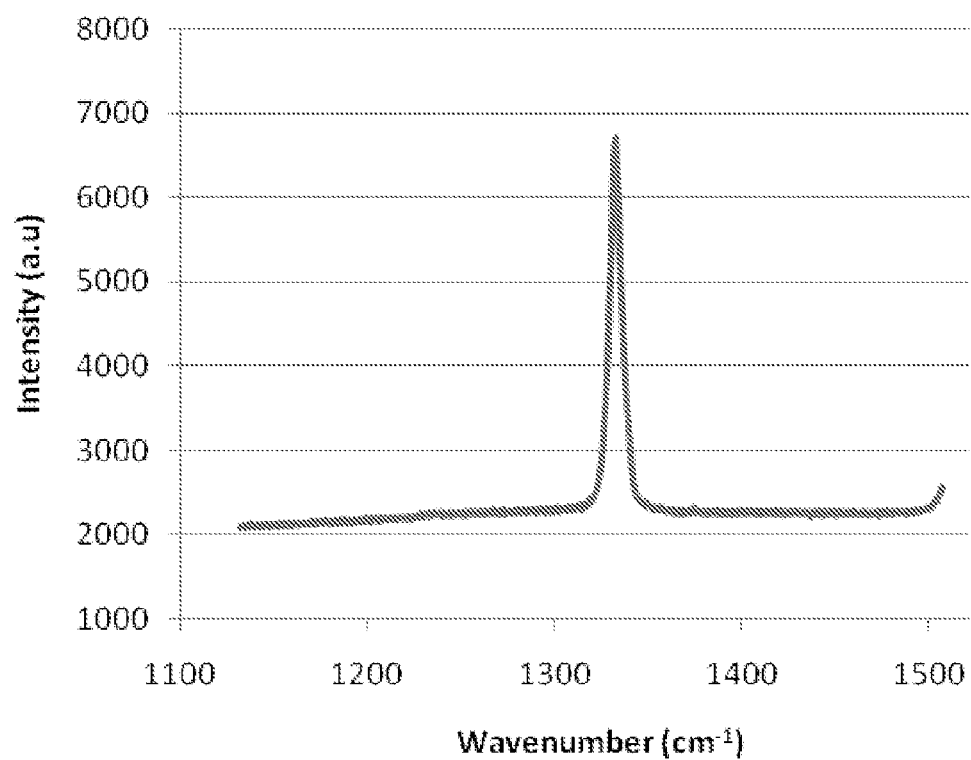
FIG. 13 illustrates the Raman spectrum for polycrystalline diamond grown at 3% $CH_4/H_2$ and 220 Torr.

The deposited diamond is also characterized using the Raman method (argon green laser excitation wavelength of 514.5 nm). Shown in FIG. 13 is a representative Raman spectrum for the polycrystalline diamond sample grown at 220 Torr and 3% methane. It exhibits a strong diamond peak at 1332.5 $cm^{-1}$, with a full-width-at-half-maximum (FWHM) value of 7.1 $cm^{-1}$. Additional Raman readings (not shown) for polycrystalline diamond grown at 240 Torr and 2% methane have a FWHM value of 4.6 $cm^{-1}$.

Figure 14A:
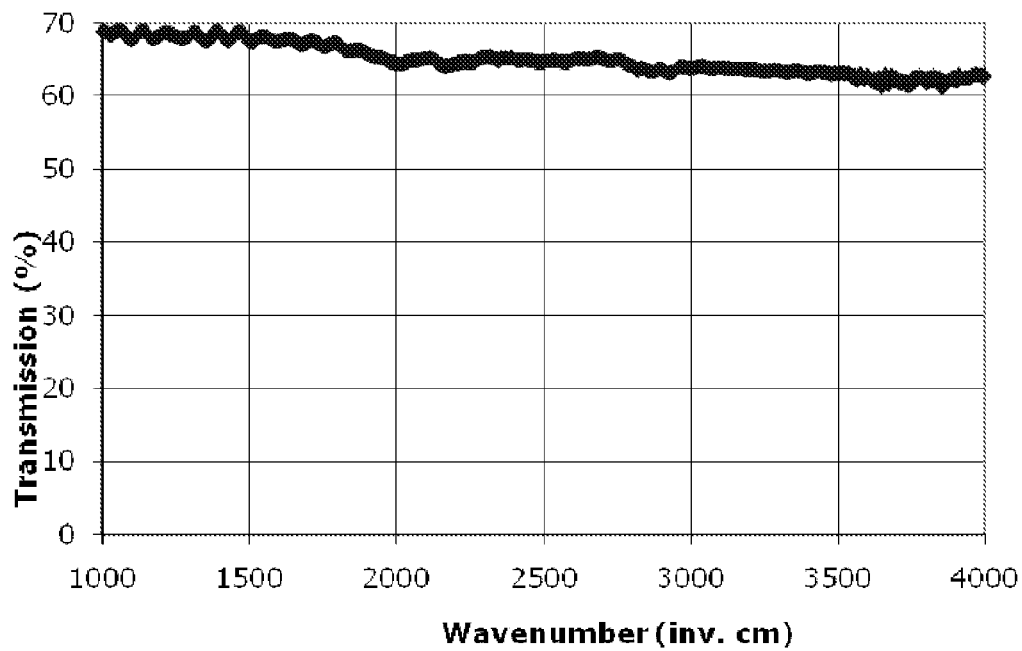
FIG. 14 illustrates FTIR infrared (a) and visible (b) spectra for polycrystalline diamond deposited with 4% $CH_4/H_2$ at 220 Torr; in the visible spectrum, crosses represent measured points, the upper dashed line represents model results for a 20 nm surface roughness, and the lower dashed line represents model results for a 30 nm surface roughness.
Figure 14B:
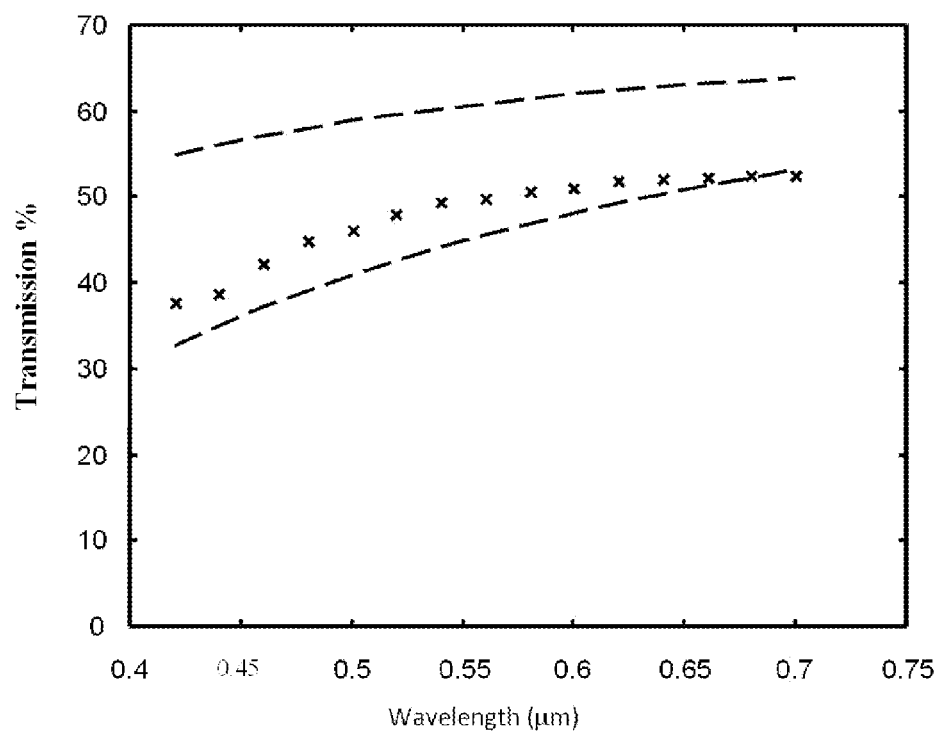

By further increasing deposition pressure, improved quality is achieved with higher methane concentrations. FIGS. 14A and 14B show the optical transmission of a polycrystalline diamond layer grown at 220 Torr and 4% methane concentration with a thickness of 26 µm after being polished and lapped. FIG. 14A shows the infrared (IR) transmission through the sample. At longer IR wavelengths, the transmission approaches the ideal value of approximately 71% for lossless diamond with a refractive index equal to 2.38. In the visible portion, as shown in FIG. 14B, the transmission drops to approximately 35% in the violet portion of the spectrum. Analysis indicates that the drop-off may be largely explained by surface roughness considerations. The effect of surface roughness on transmission is calculated using a model reported previously [21]. Surface profilometer measurements with a 4.8 mm scan length and a high-pass filter of 20 μm yielded polished surface roughness results of approximately 30 nm for this sample. Surface roughness values of the unpolished nucleation of the sample are approximately 12 nm. Model calculations based on a polished surface roughness of 20 nm and 30 nm are also shown in FIG. 14B (dashed lines) for comparison. The data points (crosses) largely fall between these bounds, indicating that the visible transmission is largely determined by surface roughness considerations. This was also the case for earlier reported diamond layers grown at 120 Torr with 1.0% to 1.5% methane [21]. Thus the optical transmission of the diamond films grown with 4% methane at 220 Torr is comparable to the transmission of diamond film grown with significantly lower methane concentrations at lower pressures.

Example 7

Single Crystal Diamond Deposition

The reactor of Example 1 was tested for its ability to deposit single crystal diamond at high operating pressures. The single crystal diamond sits on a substrate holder similar in size to that used for the deposition of polycrystalline diamond. In general, the power density for the single crystal experiments is expected to be about the same as that for the polycrystalline diamond examples.

The experimental procedures (e.g., start-up, operation, tuning, optimization) for the deposition of single crystal diamond are generally the same as described for the deposition of polycrystalline diamond in Example 6. The main difference is that the substrate is a 3.5 mm×3.5 mm single crystal diamond seed substrate. The substrate is a yellow high-pressure, high-temperature (HPHT) single crystal seed that is pre-treated with an acid cleaning/$H_2$-plasma etch procedure and then used as a basis for the homoepitaxial growth of the single crystal diamond.

The reactor of Example 1 was used for the single crystal diamond deposition and had the geometric parameters specified in Table 1. For the particular results presented in this example, ΔL was about −2 mm to −3 mm. The experimental pressure variation ranged between 180 Torr and 260 Torr, and the microwave input power was about 1.8 kW. Hydrogen and methane were the synthesis gases, and the percentage of methane was 3 mol. % or 5 mol. % $CH_4$ relative to $H_2$. The hydrogen flow rate was fixed at 400 sccm and methane flow was 12 sccm or 20 sccm. The resulting substrate temperatures ranged from about 1000° C. to about 1200° C.

Figure 15A:
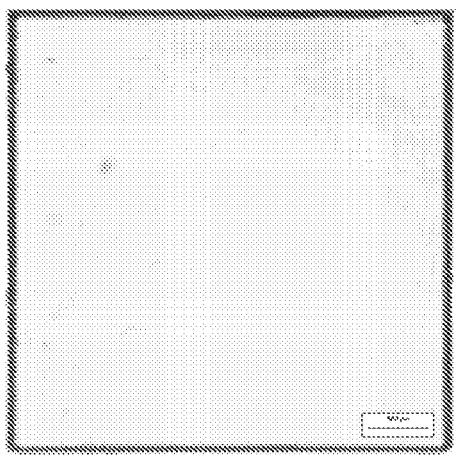
FIG. 15 presents images of (a) single crystal diamond seed, (b) single crystal diamond grown at 200 Torr with 3% $CH_4/H_2$, and (c) single crystal diamond grown at 240 Torr with 3% $CH_4/H_2$.
Figure 15B:
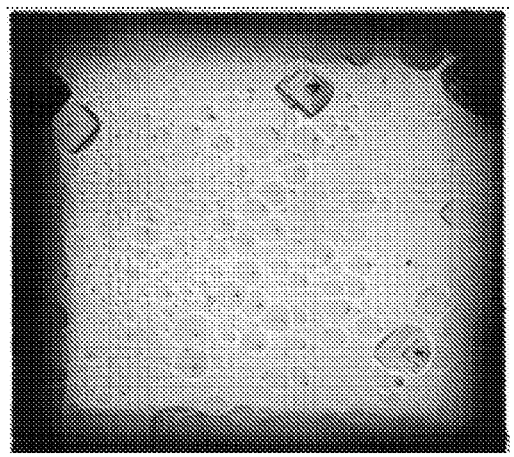
Figure 15C:
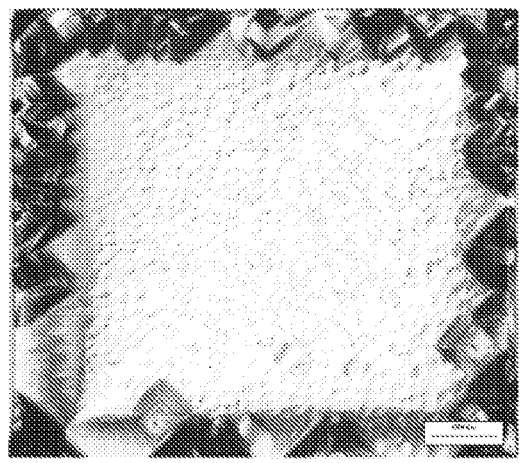
Figure 16:
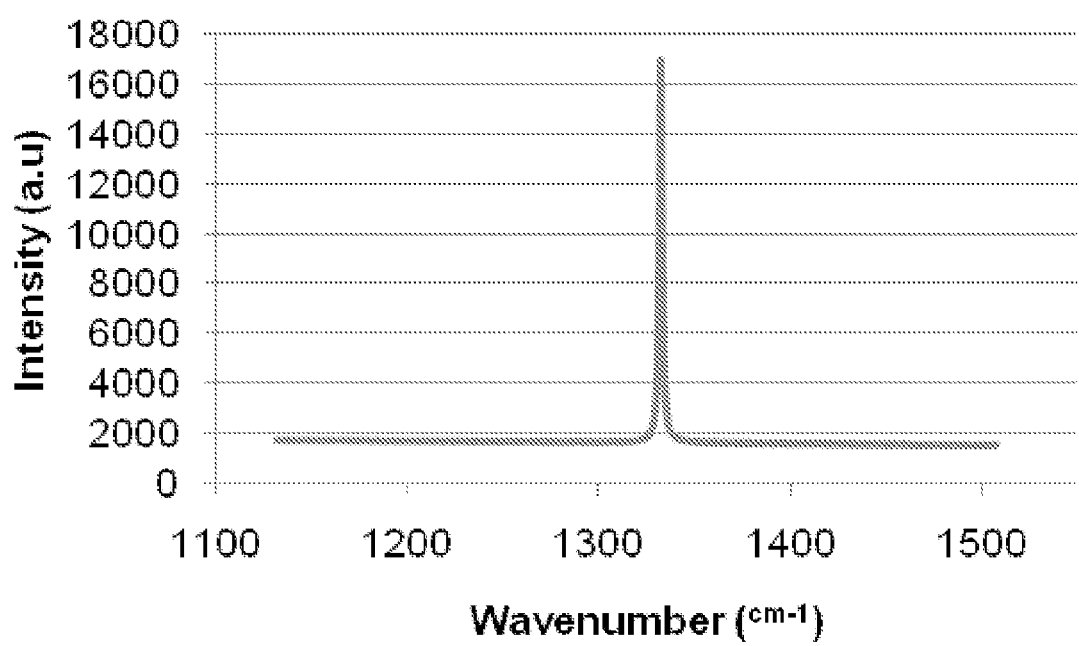
FIG. 16 illustrates the Raman spectrum for single crystal diamond grown at 3% $CH_4/H_2$ and 220 Torr.
Figure 17A:
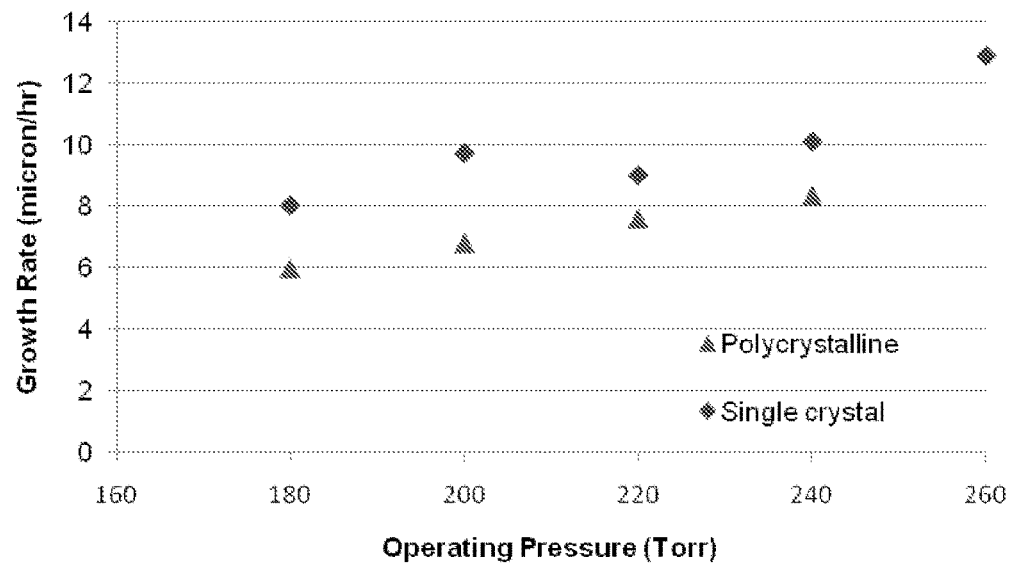
FIG. 17 illustrates single crystal diamond growth rates as a function of operating pressure (a: 3% $CH_4/H_2$ comparing PCD and SCD rates; b: 3% and 5% $CH_4/H_2$ SCD rates). (no addition of nitrogen gas).
Figure 17B:
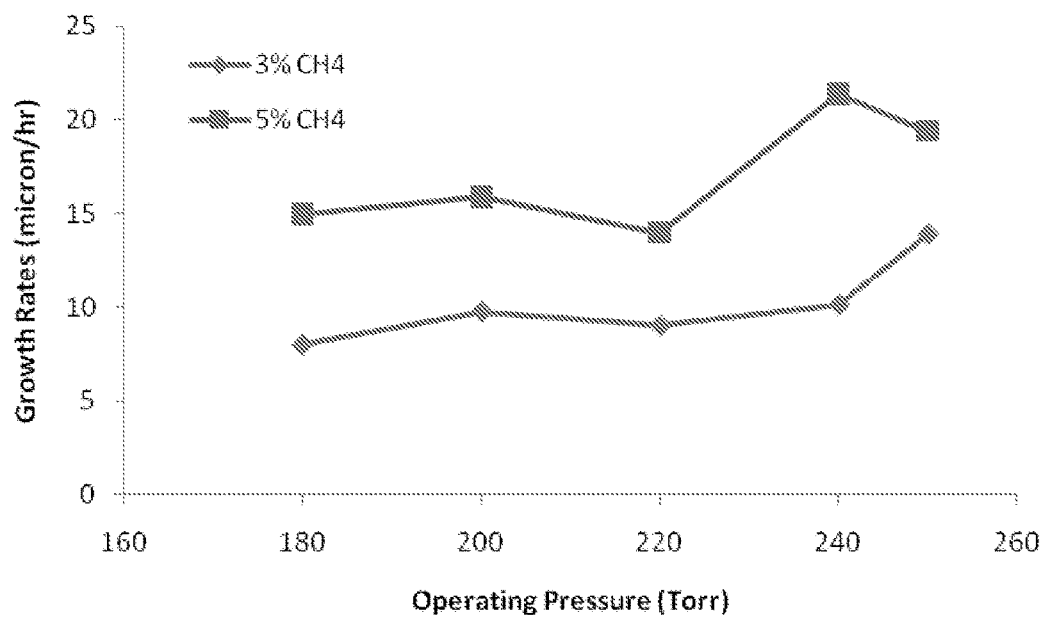

FIGS. 15A to 15C are images of the 3.5 mm×3.5 mm substrate (A) prior to deposition (i.e., the single crystal diamond seed), (B) after deposition of single crystal diamond grown at 200 Torr, and (C) after deposition of single crystal diamond grown at 240 Torr. FIG. 16 illustrates the Raman spectrum for single crystal diamond grown at 3% $CH_4/H_2$ and 220 Torr. It exhibits a strong diamond peak at 1332.33 $cm^{-1}$, with a full-width-at-half-maximum (FWHM) value of 1.82 $cm^{-1}$. By comparison, the HPHT seed had a FWHM value of 1.80 $cm^{-1}$. FIGS. 17A and 17B compare the resulting single crystal diamond growth rates as a function of operating pressure with the analogous data measured for polycrystalline diamond deposition at 3% and 5% methane. The single crystal diamond growth rates are about 10%-15% higher than those for PCD growth (e.g., ranging from about 8 μm/h to about 13 μm/h at 3% methane and about 15 μm/h to about 22 μm/h at 53% methane). Certain impurities and defects in diamond have characteristic absorption signatures in the mid-infrared region of the FTIR infrared spectrum. The existence or absence of absorption peaks in a given spectrum (i.e., relative to a known standard, for example the single crystal seed) is a valuable indicator of diamond quality. FTIR infrared spectra for the seed diamond and the deposited diamonds (not shown) had similar characteristic absorption spectra (i.e., no new peaks detected and no peaks missing), indicating that the grown single crystal diamond was of high quality.

Example 8

Single Crystal Diamond Deposition

The 2.45 GHz reactor of Example 1 was tested for its ability to deposit single crystal diamond with the addition of small amounts of nitrogen to the methane/hydrogen source gas. The deposition substrate is an HPHT single crystal seed similar to that used in Example 7. Suitable source gas compositions include about 2% to 10% $CH_4/H_2$ with an additional 100 ppm to 700 ppm $N_2$. Specific source gas compositions are summarized in Table 2 below and the accompanying figures. The input microwave power ranges from 1.5 KW to 3 kW with operating pressures from about 180 Torr to about 250 Torr, resulting in applied power densities of about 160 $W/cm^3$ to about 500 $W/cm^3$. Water cooling of the substrate maintains the substrate temperature from about 950° C. to about 1250° C.

Figure 18A:
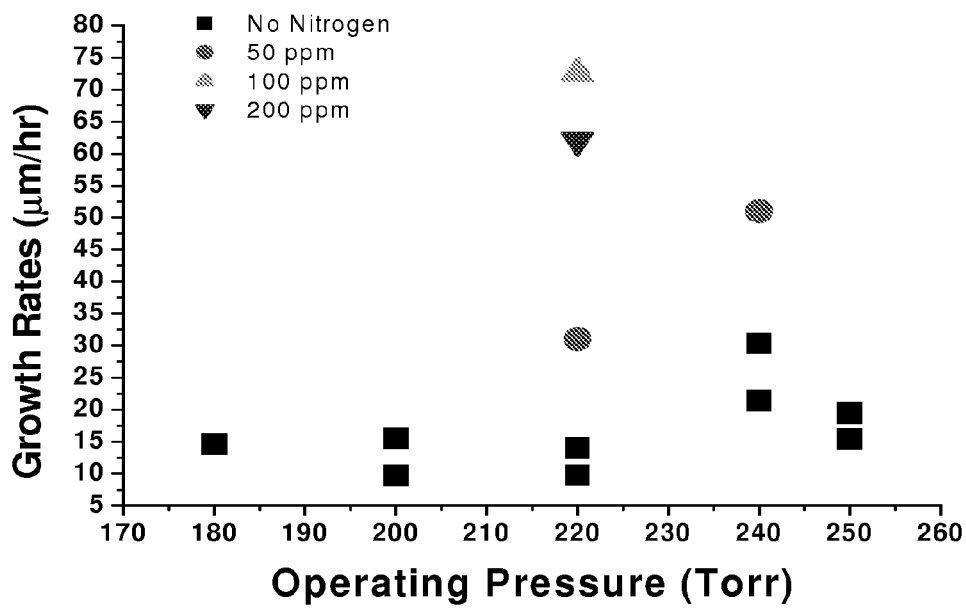
FIGS. 18A and 18B illustrate single crystal diamond growth rates with $N_2$ added to source gas (a: growth rate as a function of operating pressure at 5% methane and variable nitrogen; b: growth rate as a function of nitrogen content at 5% and 7% methane).
Figure 18B:
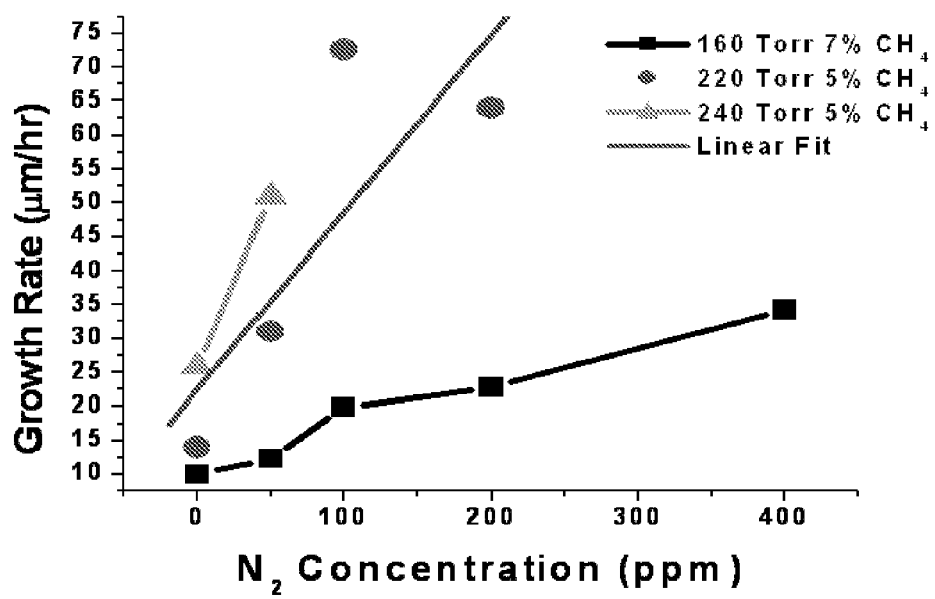
Figure 18C:
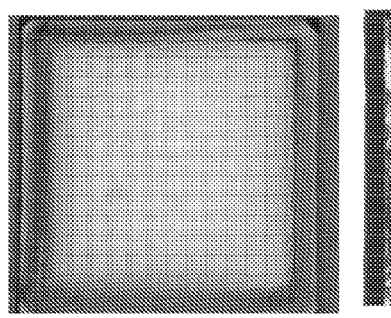
FIGS. 18C-18E present images of (c) single crystal diamond grown at 200 Torr with 3% $CH_4/H_2$, (d) single crystal diamond grown at 220 Torr with 5% $CH_4/H_2$ and 50 ppm $N_2$, and (e) single crystal diamond grown at 220 Torr with 5% $CH_4/H_2$ and 100 ppm $N_2$.
Figure 18D:
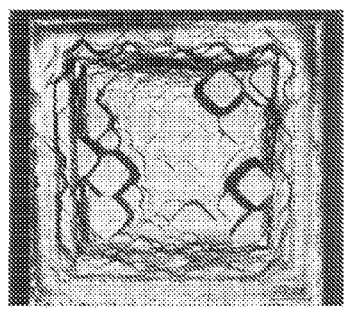
Figure 18E:
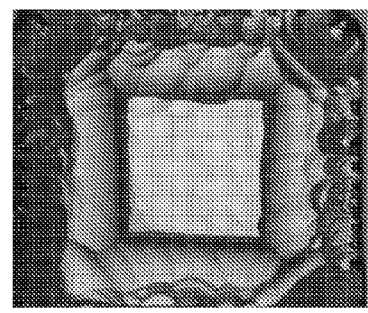

Table 2 and FIGS. 18A and 18B summarize the effects of adding nitrogen to the otherwise binary mixture of methane/ hydrogen source gas. In Table 2, methane and hydrogen are fed as essentially pure gases at the indicated flow rates; the nitrogen flow rate represents the flow of a dilute (100 ppm) mixture of nitrogen in a hydrogen carrier. In general, the addition of nitrogen to a methane-rich source gas at high operating pressure increases the growth rate of single crystal diamond, with growth rates about 10% -30% higher than polycrystalline diamond under the same conditions. As a result of an increase in the plasma power density by a factor of about 4-6 relative to the reference reactor (Example 2), the synthesis of optical quality films about 6-7 times faster than the reference reactor is possible. The reactor power efficiency for highest growth rate at 160 Torr is 6.3 $mm^3$/ hr-kW. When the pressure was increased to 220 Torr, the power efficiency could go up to 6.9 and 16.7 $mm^3$/hr-kW for experiments with and without nitrogen addition, respectively. The power efficiency was estimated by the growth rate and input power. FIGS. 18C-18E present corresponding images of single crystal diamond grown with varying amounts of nitrogen added (FIG. 18C: 200 Torr with 3% $CH_4/H_2$ and no nitrogen, 8.6 μm/h resulting growth rate; FIG. 18D: 220 Torr with 5% $CH_4/H_2$ and 50 ppm $N_2$, 31.0 μm/h resulting growth rate; FIG. 18E: 220 Torr with 5% $CH_4/H_2$ and 100 ppm $N_2$, 72.5 μm/h resulting growth rate).

TABLE 2

SCD Synthesis with Nitrogen addition

| Run # | P (Torr) | Source Gas (sccm) | | | Growth (hours) | Subst. T (° C.) | Ave. Thick. (µm) | Growth Rate (µm/h) |
|---|---|---|---|---|---|---|---|---|
| | | $H_2$ | $CH_4$ | $N_2$ | | | | |
| 1 | 200 | 400 | 12 | 0 | 8 | 1035 | 69 | 8.6 |
| 2 | 200 | 400 | 20 | 0 | 5 | 1016 | 49 | 9.7 |
| 3 | 220 | 400 | 20 | 0 | 7 | 1046 | 68 | 9.8 |
| 4 | 180 | 400 | 20 | 0 | 8 | 1017 | 120 | 15.0 |
| 5 | 240 | 400 | 20 | 0 | 8 | 1120 | 242 | 30.3 |
| 6 | 250 | 400 | 20 | 0 | 8 | 1121 | 123 | 15.4 |
| 7 | 240 | 400 | 20 | 0 | 8 | 1134 | 171 | 21.4 |
| 8 | 250 | 400 | 20 | 0 | 8 | 1137 | 156 | 19.5 |
| 9 | 220 | 400 | 20 | 0 | 8 | 1063 | 112 | 14.0 |
| 10 | 200 | 400 | 20 | 0 | 8 | 1060 | 124 | 15.5 |
| 11 | 220 | 400 | 20 | 2 | 8 | 1081 | 248 | 31.0 |
| 12 | 220 | 400 | 20 | 4 | 8 | 1170 | 581 | 72.6 |
| 13 | 220 | 400 | 20 | 8 | 8 | 1156 | 318 | 64.0 |
| 14 | 240 | 400 | 20 | 2 | 8 | 1120 | 408 | 51.0 |

Example 9

Nanocrystalline Diamond Deposition

Figure 19:
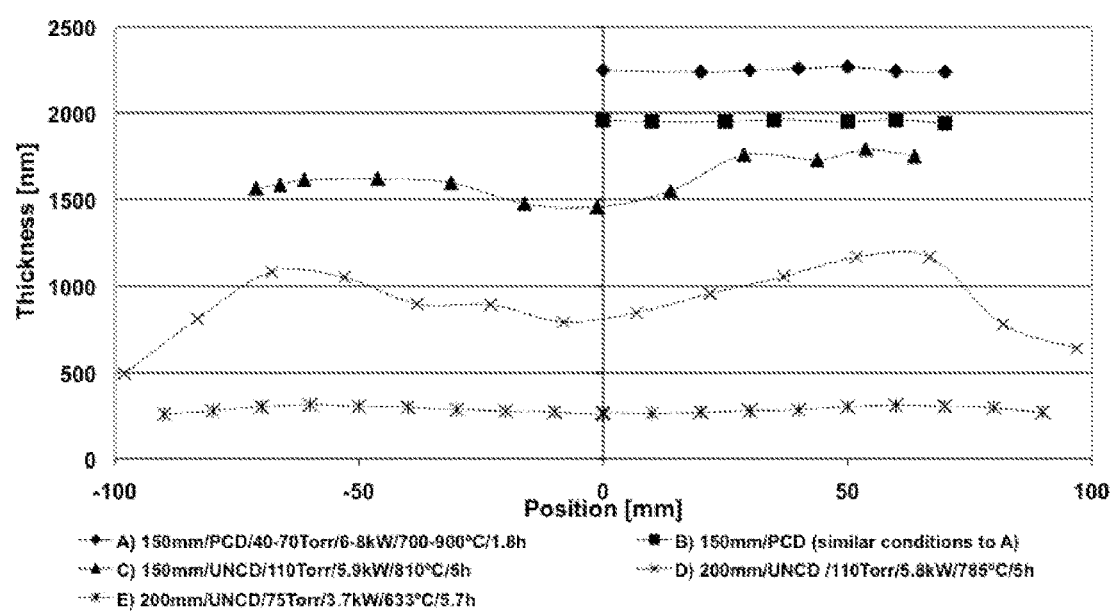
FIG. 19 illustrates nanocrystalline and polycrystalline diamond deposition thickness and uniformity at moderate operating pressures and using a microwave chamber cylinder having two cylindrical subsections having different radii.

The reactor of Example 5 was tested for its ability to deposit nanocrystalline diamond at high operating pressures. A source gas of about 1% $CH_4$ and about 1% $H_2$ relative to an argon (Ar) carrier gas was fed to the reactor at moderate temperatures ranging from 40 Torr to 110 Torr. The deposition process and characteristics are summarized in Table 3 and FIG. 19.

TABLE 3

Nanocrystalline Diamond Synthesis
Process parameters and measured average deposition rates and uniformities

| Process | Wafer size [mm] | Pressure [Torr] ([kPa]) | Power Absorbed [kW] | Temperature [° C.] | Deposition rate [nm/h] | Thickness variation[a] [%] |
|---|---|---|---|---|---|---|
| UNCD | 150 | 110 (14.7) | 1.9-6.7 | 696-810 | 80-460 | 8-13 |
| UNCD | 200 | 75-110 (10-14.7) | 3.6-5.8 | 633-785 | 30-180 | 6-21 |
| PCD | 150 | 40-70 (5.3-9.3) | 3-8 | 700-940 | 320-390 | 4-15 |

[a]Thickness variations are calculated as percentage of the standard deviation from the average thickness across the wafers.

Summary: A new high pressure and high power density MPCR reactor is disclosed and has been experimentally evaluated by depositing PCD on silicon substrates over the 180 Torr-240 Torr pressure regime. The disclosed reactor has (1) a reduced-diameter substrate holder powered electrode and (2) independently length-adjustable/tunable powered electrode (coaxial stage) and lower conducting short components. The reduction of the powered electrode area by a factor of about 4.5 increased the discharge power density by a factor of 5-8 over the reference design when operating at pressures of 100 Torr to 160 Torr and produced very intense hydrogen gas discharges with adjustable power densities of 200 W/cm³ to 550 W/cm³ in the 180 Torr to 240 Torr pressure regime. The length tuning of the powered electrode allowed the electromagnetic focus to be varied above the substrate and allowed the control of the discharge shape, size and position. The experiments demonstrated that small changes of a few mm in powered electrode position could change the deposition rate by a factor of two and the optimal deposition position varied as pressure and power varied. Thus the length tuning provided an important experimental variable for process control and optimization especially in the high-pressure regime.

Polycrystalline diamond film synthesis rates varied from 3 µm/h to 21 µm/h as the methane concentration was varied from 2% to 5%. The diamond growth rate increased with increasing operating pressure and higher methane concentration. These growth rates are significantly higher than the comparable growth rates of 1 µm/h to 6 µm/h in the lower and moderate pressure, lower power density MCPR. More importantly, the experimental "methane window" in which high quality optical diamond films could be synthesized increased as pressure and power increased. Optical quality films were produced with methane concentrations as high as 4% and at growth rates of 12 µm/h to 14 µm/h. Thus, high quality films were synthesized about 6-7 times faster than the equivalent films grown at 110 Torr to 130 Torr in the reference reactor. These growth rates were similar those reported using a high power millimeter-wave plasma reactor at 200 Torr [28]. Thick freestanding transparent films were produced with deposition rates as high as 12 µm/h to 14 µm/h. These thick films had optical properties that closely matched the optical properties of films that were synthesized at lower deposition rates using lower methane concentrations, lower pressures and lower power densities. Comparable improvements are also obtainable with reactor designs and tuned deposition processes specific to single crystal diamond synthesis and nanocrystalline diamond synthesis.

The foregoing disclosure is provided in detail using the MPCVD of diamond as an example process application. However the techniques described can be employed for other microwave plasma assisted processing applications. Additionally, the disclosure is provided in the context of an internally tunable microwave plasma reactor as the example reactor. However, the disclosed apparatus and methods can be applied to other microwave reactor designs where the cylindrical, tunable applicator portion of the applicator is replaced by a standard fixed applicator.

Example 10

Two-Section Microwave Chamber (Reactor C)

This example relates to the design and performance of an improved microwave plasma assisted chemical vapor deposition (MPACVD) reactor ("Reactor C") including an embodiment of the generalized multi-section microwave chamber 10 of the reactor 200 in FIG. 20. Reactor C in this example operates with high power densities (e.g., at least 200 W/cm$^3$ and/or up to 600, 700, 800, 900, or 1000 W/cm$^3$) and at high pressures (e.g., at least 100, 150, or 200 torr and/or up to 300, 350, or 400 torr). Differences from earlier MPACVD reactor designs such as Reactors A and B from Examples 2 and 1 above, respectively, include an increase in applicator and dome size and the excitation of the applicator with a new hybrid $TM_0/TEM_{001}$ mode. The reactor is experimentally evaluated by synthesizing single crystal diamond (SCD) at pressures from 180 to 300 torr with absorbed power densities between 400 and 1000 W/cm$^3$. Without $N_2$ addition, SCD growth rates as high as 75 μm/h were observed. A SCD growth window between 950° C. and 1300° C. was identified, and, within this growth window, growth rates were 1.2 to 2.5 times greater than the corresponding growth rates for earlier reactor designs. SCD characterization by micro-Raman spectroscopy, SIMS, and by IR-UV transmission spectroscopy indicated that the synthesized SCD quality is that of type IIa diamond.

At pressures of 100 torr or more, microwave discharges in hydrogen and methane gas mixtures separate from the reactor walls. They become freely floating and assume shapes that are related to the shape of the impressed electromagnetic (EM) fields. At very high pressures microwave discharges become very non-uniform, intense and "arc like." They may even move about the discharge chamber as they react both to buoyant and convective forces caused by the gas flows around and within the discharge. Plasma densities for 2.45 GHz hydrogen discharges operating at pressures from 100 to 200 torr are estimated to be about $10^{12}$ cm$^{-3}$ [27]. At pressures greater than 150 torr, microwave discharges in hydrogen and methane gas mixtures have neutral gas temperatures in excess of 3000 K. These discharges have high densities of radical species, i.e. H. and .$CH_3$ radicals, which enable increased diamond growth rates at high pressures.

Since high pressure microwave plasma discharges behave very differently from the typical lower pressure discharges, they desirably implement methods of discharge control and microwave applicator and plasma reactor design that take into account their distinctly unique nature. As pressure increases, the size, the spatial location and the shape of the very hot, non-uniform plasma is desirably controlled so that optimal CVD diamond synthesis is achieved. Substrate axial position adjustments as described herein enable the substrate to be positioned up into and in good contact with the discharge as pressure is varied. This enables the optimal, independent positioning of the substrate with respect to the discharge as pressure varies, and yields high deposition rates. Thus at high pressures, the independent positioning of the discharge with respect to the substrate position becomes an additional experimental variable.

There are a number of other issues associated with utilizing high pressure MPACVD discharges for diamond synthesis. First, because of the discharge's high gas temperatures, the substrate is desirably cooled to the desired deposition temperature. The reactor walls, in contrast to the substrate, are desirably protected from the intense high temperatures of the discharge and from the active discharge species. As a result, it is desirable that the hot discharge be separated and placed out of direct contact from the reactor walls. In Reactor C of this example, both the metal and dome walls are spatially remote/removed from the discharge zone. This reduces plasma- and radical species-wall interactions and also reduces the conductive and convective discharge heat flux losses to the walls.

Figure 23:
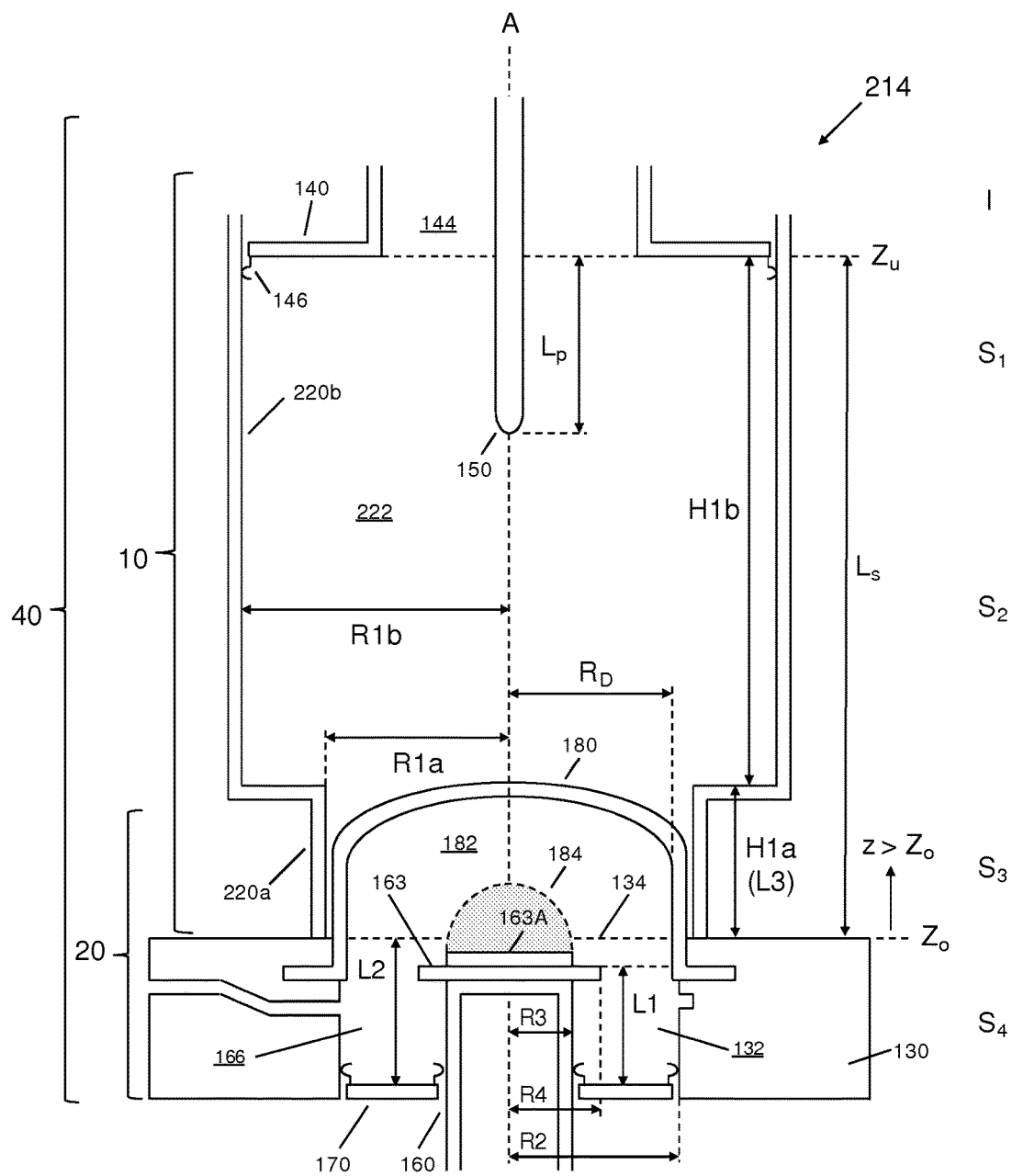
FIG. 23 illustrates a cross-sectional view of a microwave plasma assisted reactor embodiment with a two-section microwave chamber according to the disclosure.

Reactor Design: FIG. 23 is a cross-sectional view of the reactor 214, which can be considered as a special case of the generalized reactor design concept that is described above. The basic design features of Reactor C as a specific embodiment of the reactor 214 include: (1) single mode excitation, (2) internal applicator matching, (3) adjustable substrate position $Z_S$, (4) variable electromagnetic focus at the substrate position $Z_s$ and (5) the excitation of a "non-classical" electromagnetic (EM) applicator mode. The tunability and the experimental versatility of the design allows not only excellent discharge matching but also the control of the position, size, shape and intensity of the microwave discharge. An additional advantage of the reactor design is its ability by varying $L_s$ to experimentally determine new, useful, and "non-classical" applicator EM excitation modes that enable diamond synthesis.

As shown in FIG. 23, the reactor 214 includes five cylindrical waveguide sections: the input section I and reactor sections $S_1$-$S_4$. In the embodiment denoted as Reactor C, the design has the following dimensions: Lp~3 cm; Ls~16.2 cm; R1a=12.07 cm; R1b=15.24 cm; R2=10.8 cm; R3=1.84 cm; R4=3.24 cm; $R_D$=10.8 cm; L1 and L2~6.12 cm; −0.8 cm<$Z_s$<0.5 cm; H1a (or L3)=7.32 cm; and H1b=8.88 cm. Reactor C has four mechanically independent cavity applicator 40 adjustments: (1) variable coupling probe 150 length Lp, (2) variable substrate holder 163 length L1, (3) variable top plate sliding short 140 position Ls, and (4) variable lower conducting short plate 170 position L2. These enable process optimization and impedance matching and are varied for discharge control as input power, pressure, gas flow, substrate holder design, etc. are varied. For example, as the substrate holder 163 position $Z_S$ is varied from +4 mm to −6 mm, the electric field increases and can be focused at a desired position relative to the $Z_0$ plane.

The major differences between Reactor B and Reactor C designs are that in Reactor C: (1) the applicator 40 and dome 180 diameters have been increased respectively from 17.78 cm to 30.48 cm (i.e., 2 R1b) and from 13.02 cm to 21.6 cm (i.e., 2 $R_D$) and the dome height has been increased from 9.47 cm to 10.86 cm, (2) the applicator 40 has an additional cylindrical section $S_3$ providing an abrupt step change in applicator 40 radius from section $S_2$, and (3) the applicator 40 is excited in the "approximate" $TM_0/TEM_{001}$ hybrid mode. In sections $S_1$-$S_3$, the mode is TM and phi symmetric, hence the notation $TM_0$. Because each section has a length that is short with respect to the guided wavelength (e.g., less than the guided wavelength), the EM field patterns in these sections are not easily related to the empty classical cylindrical cavity modes. Thus the notation $TM_0$ is adopted here as the identification for the EM mode in sections $S_1$-$S_3$. Due to this hybrid mode excitation, the height Ls above the $Z_0$ plane is reduced from ~21 cm in Reactor B to ~16 cm in Reactor C. However the substrate holder/cooling stage 163 area in section $S_4$ has the same dimensions as the holder/cooling stage 163 in Reactor B.

Reactor C generally has larger radii (e.g., R1a, R1b, R2, $R_D$, etc) than Reactor B. The increased reactor and dome sizes remove the reactor walls 220a, 220b and dome walls 180 (e.g., sidewalls and top) further from the discharge zone 184 and thus reduce wall heating and plasma/radical species-wall interactions. This change allows robust operation at higher pressures, at higher power densities, and over longer diamond synthesis process times relative to other reactor designs. For example, in Reactor B, when the operating pressure was increased from 160 Torr to 240 Torr the discharge power density greatly increased to 300-450 W/cm$^3$. As pressure was increased from 160 Torr to over 200

Torr, the gas temperature increased and the quartz walls 180 and the cavity walls 120 were heated. Relocation of the quartz walls 180 and the cavity walls 220 further away from the intense discharge zone 184 in Reactor C reduces this adverse heating effect.

As illustrated in FIG. 23, R2 and $R_D$ may be nominally the same. In other embodiments, R2 and $R_D$ may have different values, such as where R3/R2 and/or $R_D$/R2 are independently selected to be at least 0.05 or 0.1 and/or up to 0.2, 0.3, 0.4, or 0.5. For example, a design with $R_D$>R2 where the plasma dome 180 is relatively larger in diameter than the coaxial base cavity 132 may be used limit plasma 184-dome 180 interactions while providing a uniform plasma 184 over a relatively larger deposition area.

The variation of reactor radii versus the five cylindrical reactor sections has an additional benefit. Microwave energy is coupled and impedance matched into the reactor by varying $L_s$ and $L_p$. The EM energy that is transmitted to the discharge zone above the substrate holder is first defocused in sections I, $S_1$ and $S_2$, and then, by reducing the radius from R1b to R1a and by varying L1 and L2, the EM energy is refocused onto the substrate holder in sections $S_3$ and $S_4$. For a given input power, the radius variation spreads out the electromagnetic field intensity over a larger waveguide cross section. Then, at and around the $Z_0$ plane, the time-average power flux density flowing through the sections $S_1$ and $S_2$ is refocused onto the substrate 163A. The design produces intense discharges above and in contact with the substrate 163A with power densities over 600 W/cm$^3$ (e.g., up to about 1000 W/cm$^3$) without imposing a serious heat and plasma load on the quartz dome 180 (e.g., where the extent of the plasma discharge 184 is substantially confined to radial positions within R3 relative to the axis A and to height/axial positions within R3 relative to the substrate 163A). The design allows diamond synthesis up to 320 torr. It reduces quartz wall-plasma interactions, wall heating, and wall deposition and thereby allows longer (e.g., at least 100 hr, 200 hr, or 300 hr and/or up to 300 hr, 500 hr, or 1000 hr) deposition times. The reduction of quartz wall-plasma interactions, heating, and deposition substantially increases the useful life of the reactor components by greatly extending the time between (or eliminating the need for) cleaning or replacing the quartz dome 180 to obtain efficient deposition conditions during subsequent reactor operation. The diamond synthesis process also becomes more efficient.

Experimental Procedures: SCD was grown on commercially available 3.5 mm by 3.5 mm synthetic, high pressure high temperature (HPHT) SCD substrates. Each experimental run was limited to less than 24 hours. Before each experimental run the HPHT substrate was chemically cleaned and then was subjected to a 1-4 h $H_2$ (5.5 N) plasma etching pretreatment before introducing 2-9% methane (5 N) into the feed gas. Substrate temperatures ($T_S$) were measured by using an infrared pyrometer with one fixed wavelength (one-color) at 0.96 μm. Two-color pyrometer temperature measurements were also taken. Under the same conditions the two color measurements were approximately 100 K higher than the one-color measurements. Film thicknesses were measured by a linear encoder. The growth thickness for each experimental run was determined as the average of five measurement points on the top surface of the diamond. One measurement point was in the center of the grown diamond and the other four points were measured near each of the corners.

The discharge was ignited at low pressures of a few torr using a low input power level of 1.25 kW and then once ignited the input power was gradually increased as the pressure was increased to the appropriate higher pressure deposition conditions. Once the mode ignition tuning positions, i.e. $L_s$, $L_p$ and $Z_s$, were determined the discharge always ignited only on the top of the substrate holder and no additional tuning was necessary as the reactor was adjusted for CVD process conditions.

Experiments were performed without any $N_2$ addition. The total gas flow rate was kept constant at approximately 400 sccm. The growth rate is strongly dependent on $N_2$ impurity levels. Estimated $N_2$ impurities in the feed gases and from any leaks in the vacuum system yields an equivalent $N_2$ input of ~5 ppm of the input gas flow.

Figure 24:
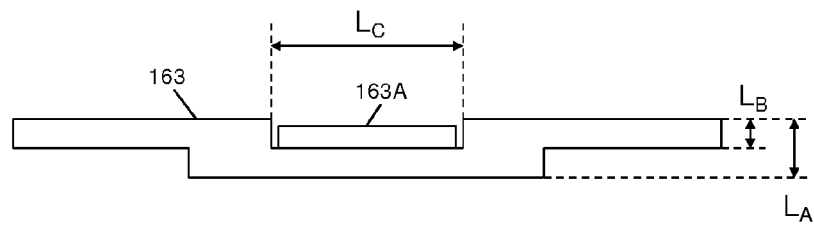
FIG. 24 illustrates a cross-sectional view of a substrate holder according to the disclosure.

All substrate holders 163 used in the experiments were holders 163 of the type shown in FIG. 24. The differences between holders were the pocket dimensions ($L_C$) and the thicknesses ($L_A$, $L_B$). The substrate deposition temperature $T_S$ was varied by varying the thickness dimensions $L_A$ and $L_B$. All experimental runs reported here involved one continuous run using one pocket holder 163.

The SCD quality was evaluated by Raman spectroscopy, IR-UV transmission measurements and SIMS analysis. Raman spectroscopy was performed using a 514.5 nm Ar ion laser with a spot size of 20-30 μm and a resolution of 0.2 cm$^{-1}$. The Raman measurements on each grown sample were compared with a type IIIa diamond reference sample from Element Six. This low absorption, reference sample has a nitrogen impurity level of ~30 ppb and as measured by us a Raman FWHM of 1.64 cm$^{-1}$.

Experimental Performance: SCD was grown on the SCD HPHT seeds as described above in each of Reactors A, B, and C, and the resulting growth rate and absorbed power density were compared for the different reactors as described below. Briefly, the relative performance of Reactor C can be summarized as follows: (a) Reactor C operation in the 200-300 Torr regime yields absorbed power densities of 400-600 W/cm$^3$; (b) at the higher pressures (e.g., >200 Torr), a higher power density operation was achieved with Reactor C; (c) reactor tunability is permits optimum process development at high pressures; (d) single crystal diamond synthesis rates (without $N_2$ addition) increase dramatically versus pressure and power density; by a factor of about at least about 1.2, 1.5, 2, or 3 and/or up to about 4, 5, 6, 8, or 10 (e.g., a relative deposition rate compared to a reactor without the multi-cylinder/section microwave chamber design such as Reactor A or Reactor B) to over 100 microns/hr; (e) deposition energy efficiencies (without $N_2$ addition) for Reactor C range from 6-25 mm$^3$/(kW-h) over a 25 mm-diameter synthesis area as pressure, power density, and gas chemistry are varied; and (f) Reactor C operated reliability and robustly with no maintenance for over 120 hours of continuous operation for a given synthesis run and for thousands of hours with separate synthesis runs.

Discharge Absorbed Power Density: The discharge absorbed power densities for Reactors A, B and C were measured over the experimental 60-300 torr regime and the results are displayed in FIG. 25. The plasma volume was determined experimentally from size calibrated photographs of the discharge versus pressure. For each data point in FIG. 25, the discharge volume was defined as the white central core of the discharge, i.e. as the volume of the brightest luminescence of the discharge. Then the discharge power density at each pressure was calculated as the absorbed microwave power divided by the plasma volume.

Figure 25:
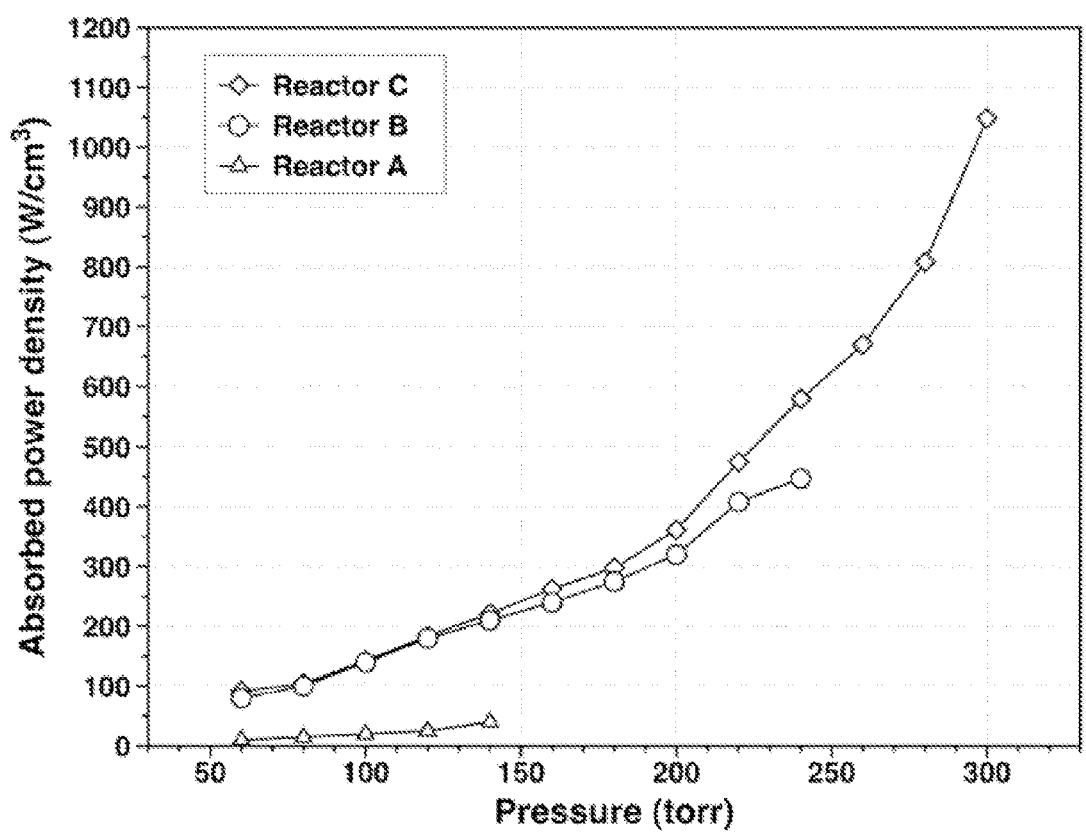
FIG. 25 is a graph illustrating the absorbed power density for various MCPRs according to the disclosure.

The discharge power density for all three reactors increases as pressure increases. In the lower pressure regime of 60-180 torr, Reactors B and C have similar discharge power densities versus pressure and their power densities are larger by a factor of 4-5 over the discharge power densities of Reactor A. For example, at a constant pressure of 140 torr, the power density for Reactor A is 45 W/cm$^3$, while the power density for Reactor B is 210 W/cm$^3$. Reactors B and C have the same substrate holder area, which is smaller than in Reactor A. Thus, one observation from the data in FIG. 25 is that at a given pressure, the discharge power density increases inversely proportionally to the substrate holder area. Similar to Example 6, the fourfold reduction in substrate holder area increases the discharge power density by a factor of about 4-5.

When the pressure is increased above 180 torr, power densities as high as 300-1000 W/cm$^3$ are achieved. As pressure increases beyond 200 torr, the power densities for Reactor C become increasingly greater than those of Reactor B. At the higher pressures, reactor geometry differences between the two reactors may produce different internal gas flows within and around the discharge, resulting in different absorbed discharge power densities.

Figure 26:
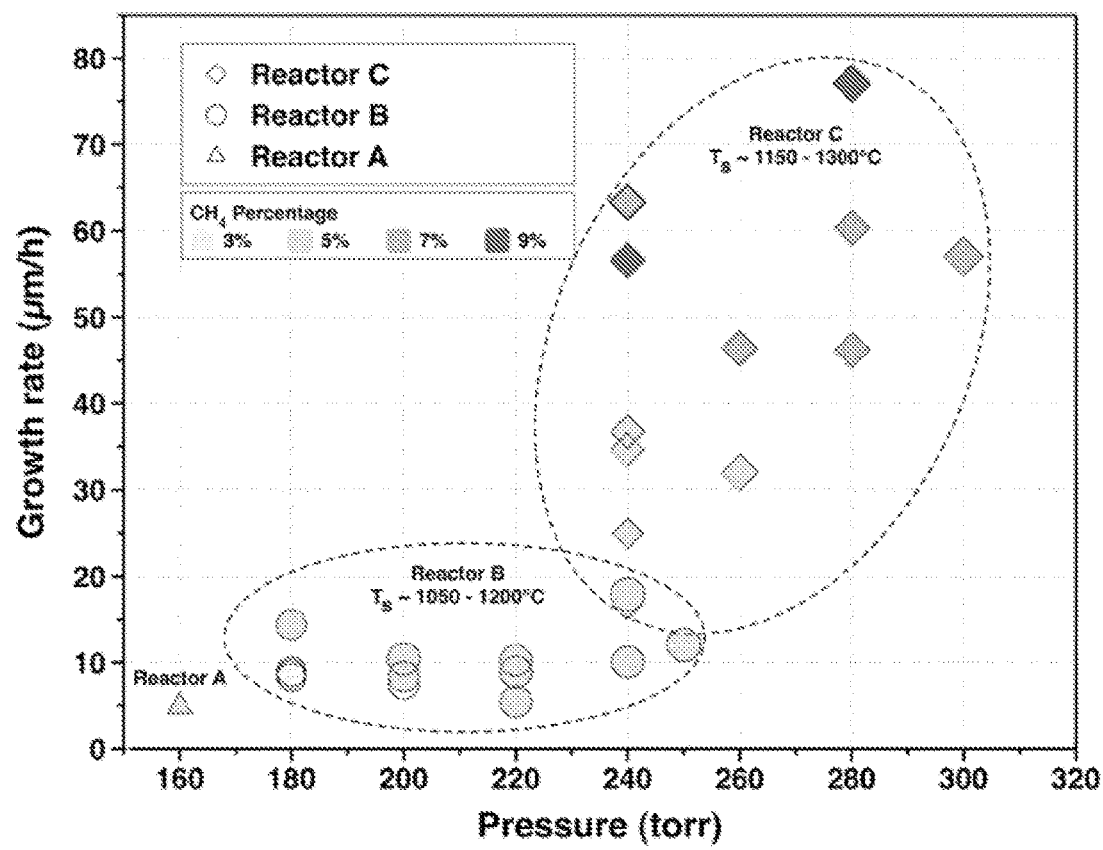
FIGS. 26 and 27 are graphs illustrating the growth rate of single-crystal diamond for various MCPRs according to the disclosure.

Growth Rate versus Pressure: A series of exploratory experiments of SCD growth rate versus pressure, methane concentration, and substrate temperature was performed in Reactors A, B and C, and the results are displayed in FIG. 26. The maximization of the growth rate at each data point is a multivariable optimization problem. At each of the data points shown in FIG. 26, the total flow rate was held at ~400 sccm and the substrate position $Z_S$ for each reactor was held constant at an optimized (high growth rate) position. The optimized $Z_S$ positions are −3.6 mm for Reactor B and −4.8 mm for Reactor C. The input powers ranged from 3 kW for Reactor A, between 2.1-2.3 kW for Reactor B, and 1.9-2.1 kW for Reactor C. The exploratory experimental data in FIG. 26 show that there are important increases in SCD growth rates for Reactors B and C over Reactor A at lower pressures. A comparison of FIGS. 25 and 26 suggests that the increased growth rates in Reactor C are related in part to the increased discharge power density due to both the smaller substrate holder and operation at higher pressures.

Figure 27:
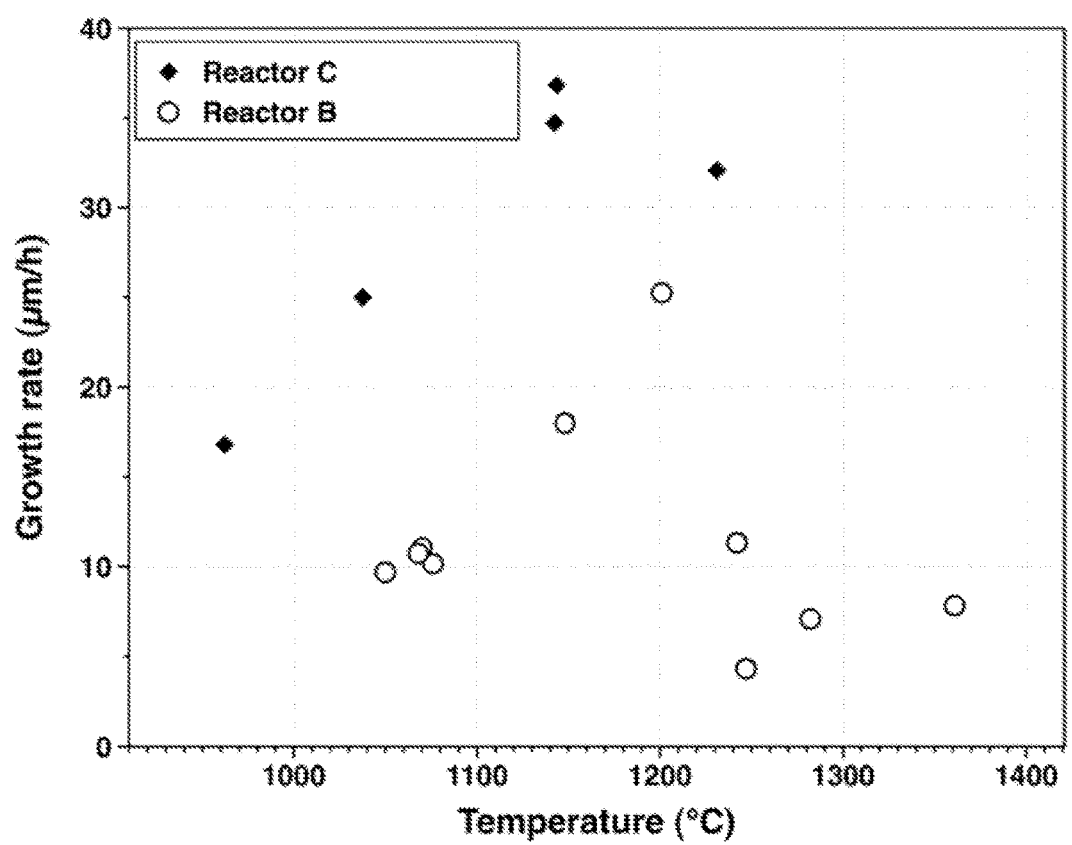

A more precise comparison between reactors B and C is made in FIG. 27 where the performance of the reactors is compared under similar experimental conditions. For each experimental data point there are at least eight important experimental variables: (1) pressure, (2) substrate temperature $T_s$, (3) substrate position $Z_S$, (4) substrate holder thickness (FIG. 24), (5) methane concentration, (6) flow rate, (7) absorbed power density, and (8) reactor design/geometry. In the comparison between Reactors B and C shown in FIG. 27, both reactors were operated under the same input variable conditions: 240 torr pressure, fixed $Z_S$, the fixed generic substrate holder configuration shown in FIG. 24, CH$_4$/H$_2$=5%, and a constant total flow rate of ~400 sccm. Under these input conditions, a series of experiments versus substrate temperature was performed for both reactors B and C operating with the approximate absorbed power density conditions that are indicated in FIG. 25. FIG. 27 identifies a SCD growth window between 950 and 1300° C., where the growth rate exhibits a maximum between 1125 and 1225° C. Under these conditions, the maximum growth rate for Reactor B is about 25 µm/h at 1200° C. and 38 µm/h at 1150° C. for Reactor C. Within this growth window, the growth rates for Reactor C are 1.2-2.5 times greater than the corresponding growth rates for Reactor B. This suggests that the higher power densities of Reactor C (FIG. 25) result in higher deposition rates; i.e. changes in reactor design/configuration result in higher power densities and also higher deposition rates.

SCD Diamond Quality: Diamond plates were fabricated by removing the SCD CVD synthesized diamond from the seed by laser cutting and then the plates were mechanically polished.

The CVD-synthesized SCD was characterized by micro-Raman spectroscopy, SIMS, and by IR-UV transmission spectroscopy. For Reactor C, the Raman FWHM of the synthesized SCD ranged from 1.65 to 1.80 cm$^{-1}$. SIMS analysis shows 400-500 ppb N in the synthesized diamond (when N$_2$ was about 5 ppm in the gas phase). The IR transmission for all samples was similar to that associated with type IIa diamond, and the sub-bandgap ultraviolet optical absorption coefficients for the SCD synthesized with Reactor C were comparable to that reported for type IIa; i.e. the absorption coefficient at 250 nm is between 4 and 7 cm$^{-1}$.

Summary: An improved microwave plasma assisted CVD reactor, Reactor C, has been designed and experimentally evaluated by growing single crystalline diamond over the 180-300 torr pressure regime. Design differences from Reactor B include: (1) the cavity radii and quartz dome wall radius and height are increased, and (2) Reactor C employs a "non-classical" electromagnetic (EM) TM$_0$/TEM$_{011}$ plasma excitation applicator mode that allows control of plasma position, size, shape and intensity. Reactor C produces high power density discharges, i.e. 400-1000 W/cm$^3$, reduces wall heating and wall deposition, and provides robust diamond synthesis up to 300 torr. In the Reactor C design, the reactor radius varies versus the reactor axial position. SCD synthesis was performed within the 180-300 torr regime, and a diamond growth window was observed between 950 and 1300° C. with SCD growth rates in excess of 75 µm/h. A direct experimental comparison with the Reactor B design indicates that growth rates for Reactor C within the growth window were 1.2-2.5 greater than the corresponding growth rates for Reactor B. Micro-Raman spectroscopy, SIMS and IR-UV transmission spectroscopy measurements showed that the SCD synthesized with Reactor C was of similar quality to type IIa diamond.

Example 11

Computational Analysis of Reactor C

Electric field patterns for the specific Reactor C design that is illustrated in FIG. 23 have been numerically calculated for an empty reactor (i.e., without a discharge load). Solutions have been obtained for 2.45 GHz resonant eigenmodes. The fixed geometric dimensions of the reactor are as in Example 10, and the variable dimensions are Ls~16.2 cm, $L_p$=3.0 cm, L1=variable, L2=6.1 cm, and $Z_s$=−4 mm to −5 mm.

The EM resonant mode that is numerically predicted and experimentally observed does not correspond to any simple classical cylindrical cavity eigenmode. It also does not correspond to the TM0$_{13}$+TEM$_{001}$ hybrid resonance associated with the Reactor B design in the plasma chamber 182 and in the vicinity of the deposition substrate 163A (e.g., generally in the vicinity of the substrate holder 163 and/or top surface of the conductive stage 160). The mode is a phi symmetric mode that is uniquely associated with the exact multi-section geometry of Reactor C. The EM fields in the coaxial section S$_4$ are still primarily TEM (e.g., TEM$_{001}$), but the field patterns in sections S$_1$-S$_3$ are combinations of TM$_{01}$, and TM$_{02}$ (e.g., where TM$_{01}$, TM$_{02}$, and TM$_0$ share the same waveguide mode but may have varying filed patterns depending on reactor geometry), cylindrical waveguide modes, the TEM mode, and/or other evanescent phi symmetric modes. It is also observed that the electric field is intense and concentrated as it is first coupled into the applicator through the input port and also in the coupling probe section $S_1$. The fields then spread out (i.e., defocused) in sections $S_1$ and $S_2$ and are refocused in sections $S_3$ and $S_4$ onto the substrate holder 163. The existence of this mode is not intuitive; i.e. it does not exist in simple cylindrical cavity theory. However, the existence of this mode has been experimentally verified and is the excitation mode that is used to operate the Reactor C during all CVD process runs.

Numerical solutions for series of the 2.45 GHz resonant eigenmode electric fields versus substrate position $Z_s$ have been performed for Reactor C. The solutions demonstrate that the electric field intensity is focused on and above the substrate holder 163 and is variable as $Z_s$ varies. The best EM focus on the substrate 163 is located at specific range of $L_s$ and $Z_s$ positions. Experiments have demonstrated that the new MCPR also behaves in a similar manner when a microwave discharge is present. The optimal $Z_s$ positions for SCD synthesis usually occur for negative $Z_s$ values (i.e., the substrate 163A/substrate holder 163 is positioned below the reference plane $Z_0$).

Reactor C operates by exciting the applicator with a special non-classical, hybrid EM mode that (1) focuses the microwave energy onto the substrate 163A location and also (2) defocuses the EM field as it passes through the interior cavity 222 and through the quartz dome 180. This mode is excited by adjusting $L_s$, $L_p$, L1, and L2 to excite the correct hybrid mode. The specific lengths selected to excite this hybrid are $L_s$=16.2 cm, Lp=3.0 cm, L1=variable, and L2=6.1 cm. The excited hybrid mode has a high intensity EM field that is located in the vicinity of the $Z_0$ plane at the transition region between the cylindrical and coaxial sections. At the location of the substrate 163A on the powered center conductor electrode 163 the electric field is predominantly normal to the substrate 163A.

Thus when the section $S_4$ coaxial waveguide is adjusted properly the electric field couples directly to the discharge 184 and enables the efficient production of a high pressure and high power density discharge 184 above and in contact with the substrate 163A. Additionally as Ls, Lp, L1 and L2 are adjusted, the microwave energy is not only impedance-matched to the input source, but, as the EM power is transmitted through the applicator 40, it is gradually defocused from its centrally focused radially directed position in the coaxial section $S_1$ to the outer circumference in section $S_2$. Thus in section $S_2$, the high electric field standing wave regions are positioned away from the center axis A of the waveguide and also the top of the quartz dome 180, thereby preventing the formation of unwanted discharges inside and at the top of dome 180. In section $S_3$, the fields are refocused toward the reactor 214 center and then, in the vicinity of the $Z_0$ plane with the addition of section $S_4$, are further focused upon the substrate 163A. This design then reduces the risk of forming a discharge at the top of the dome 180 while still producing an intense discharge 184 in contact with the substrate 163A.

Reactor C incorporates design changes that allow an intense MW discharge to be formed and maintained further away from the reactor metallic wall 220 and quartz walls 180 than in Reactors A and B and thereby decreases plasma-wall interactions and heat/energy losses to the walls. These changes also enable excitation of a different, non classical EM resonant applicator 40 mode. This mode creates a unique EM field pattern distribution within the cavity applicator 40. The resulting EM field distribution is unique to the dimensions and shape of the cavity applicator 40 and is not readily or intuitively predicted from the classical resonant cavity theory that is presented in textbooks. The new EM field pattern refocuses the MW electric field intensity as microwave power is coupled through the applicator 40 to the discharge load. That is, as microwave energy is coupled through the applicator 40, the electric field is first spread radially outward over a constant-z plane allowing the microwave energy to pass through quartz dome 180 with low microwave power flux density and decreased electric field intensity (e.g., as compared to Reactor A and B) and then it is refocused onto the substrate position $Z_s$ where the discharge is maintained. Thus the electromagnetic flux density passing through the quartz walls 180 is reduced even for the high input power and high discharge power density operation required for CVD diamond synthesis at high pressures.

Example 12

Figure 28:
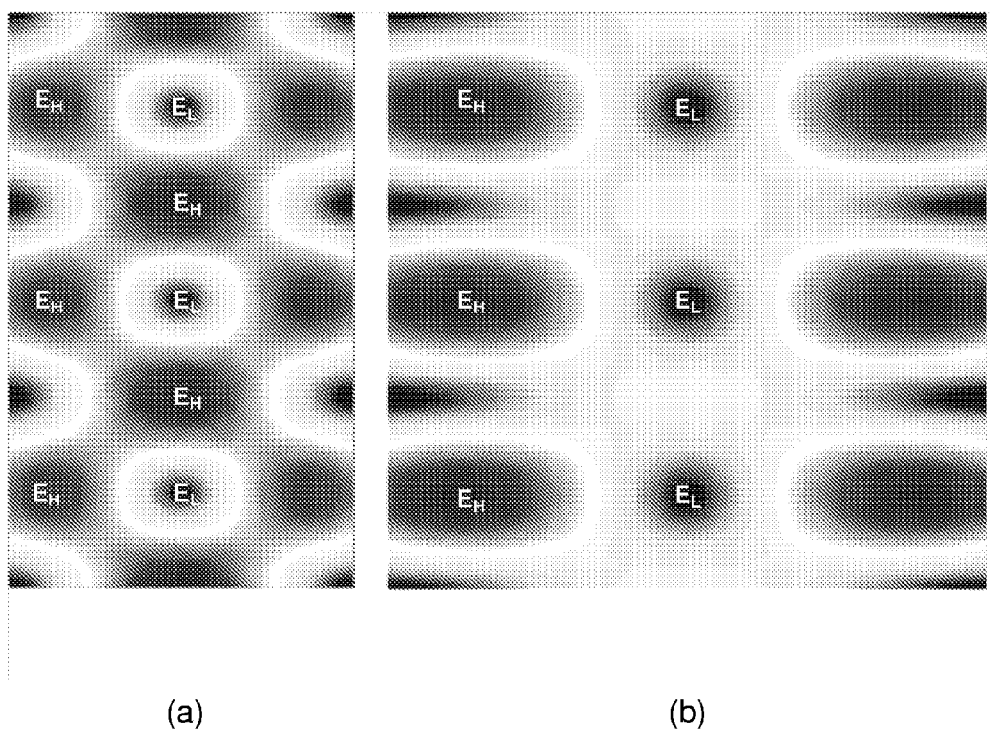
FIG. 28 illustrates numerical simulations for electric field distribution patterns inside MPCRs of differing radius.

Redistribution of the Electromagnetic Field Patterns by Varying the Waveguide Radii In order to understand the concentration and dilution of the EM fields as microwave energy passes through the reactor, the standing wave 2.45 GHz resonant $TM_{013}$ mode EM field patterns for two specific cylindrical waveguide radii were numerically calculated and are displayed in FIG. 28. FIG. 28 displays the standing wave resonant EM field patterns for a $TM_{01}$ mode for two cylindrical waveguide diameters: (a) one for the 8.9 cm radius waveguide, which is R1 in the Reactor B design, and (2) the other with a 15.24 cm radius, which is the radius R1b of section $S_2$ for Reactor C.

In FIG. 28a, the standing wave electric field intensities for the 17.8 cm diameter cavity are strong ($E_H$) in the center axis of the cavity as well as the outer radial region next to the cavity outer walls. Along the center axis of FIG. 28a, the regions of high electric field intensity ($E_H$) alternate with regions of low electric field intensity ($E_L$). However, as shown in FIG. 28b, if the cavity radius is increased to 15.25 cm, then the $TM_{013}$ mode electric field intensity is refocused from the center axis to the outer radial region of the cavity. At the larger radius, the $TM_{01}$ mode has the advantage of having the regions of very high EM field intensity ($E_H$) located away from the center axis of the cavity and distributed near the outer perimeter of the waveguide; i.e. by increasing the waveguide radius the high electric field regions ($E_H$) of the mode are refocused from the center axis and redistributed to the outer cylindrical region of the waveguide cross section. As a result, the regions of low electric field intensity ($E_L$) remain along the centerline of FIG. 28b, but they are not separated by the regions of relatively high electric field intensity ($E_H$) as in the smaller diameter cavity. FIG. 28 shows that by varying the waveguide radius, the regions of high EM energy ($E_H$) and field strength can be redistributed over the waveguide cross section.

This change in the mode of the standing wave field patterns versus radius illustrates (1) the difference in the field patterns in Reactor B and Reactor C, and it also illustrates (2) how the fields vary as the applicator 40 radius changes from sections $S_2$ to section $S_3$ in Reactor C.

Microwave Cavity Plasma Reactor Design Principles

Several design principles that may be incorporated (e.g., alone or in combination) into the various disclosed reactor embodiments are described below.

The reactors can employ single mode microwave cavity applicator excitation to focus the microwave energy and to create and maintain a microwave discharge above and in contact with the substrate over a wide pressure range. In the Reactor B, design the reactor is excited in the hybrid $TM_{013}/TEM_{001}$ mode. Because of the multiple cylindrical waveguide sections in Reactor C, a new and quite different hybrid mode is excited. As is observed in the numerical simulation for Reactor C, the EM field forms a standing wave field pattern in an empty resonant metallic cylindrical structure, but the observed EM fields patterns are not easily related to simple resonant empty cylindrical cavity field patterns as in Reactor B. The resonant length Ls~16.2 cm is not closely related to an empty cylindrical cavity or a empty coaxial cavity resonance. However the EM field patterns do exhibit the unfocusing and refocusing of the EM energy as a function of axial position z as described above.

The reactors can employ internal cavity impedance matching. That is, it employs a moveable (variable) sliding short 140 (e.g., a continuously variable $L_s$) and an adjustable, coupling probe 150 (e.g., continuously variable $L_p$) for impedance matching. These adjustments allow efficient microwave power coupling into the variable microwave discharge load. Thus, as the input variables such as pressure, power, gas mixture, and gas flow rate are varied, the reactor is readily tuned to a good impedance match. The impedance matching adjustments take place at the top of the applicator 40 away from the discharge 184 and the substrate 163A. The discharge 184 and substrate 163A are located at least two half wave lengths away from the near fields associated with the coaxial coupling probe/sliding short sections. The tuning adjustments (e.g., $L_s$ and/or $L_p$) selected for applicator 40 impedance matching and the associated the changes in EM near fields in the coaxial coupling section are separated from the EM focus near the substrate 163A. Thus, impedance matching of the cavity applicator 40 does not change the spatial EM focus around the discharge/substrate 184/163A region. Then as the cavity applicator 40 is matched, the special shape of the EM focus (without the discharge) does not change, only the electric field intensity varies.

The disclosed reactors are readily scalable. The EM features of the design can be directly scaled up in size by changing the excitation frequency from 2.45 GHz to 915 MHz. This principle was identified in early in the development in MCPR technologies. Specifically it was identified as an important principle in U.S. Pat. Nos. 4,507,588 and 4,585,688 concerned with MPCR ion and plasma sources. The direct increase of the MPCR reactor size, i.e. the size scalability, versus a decrease in the EM excitation frequency is a property of all the MCPR designs and also remains valid for Reactor C. While the MCPR design is directly scalable with respect to the EM properties, the discharge 184 (plasma) has a different set of scaling laws and thus the reactor performance CVD does scale versus size and frequency the same way as the EM performance does.

The substrate holder 163 can be located on a movable stage 160 that is an integral part of the microwave applicator 40. The stage 160 is located inside the applicator 40 so that the electromagnetic field is intense and is focused at the stage/substrate 160/163A location. The reactor tunability, and the ability to adjust the position of the stage 160 allows additional adjustment and local fine tuning/focusing of the electromagnetic fields around and directly above the substrate 163A. This feature enables the positioning of the microwave discharge 184 above and in good contact with the substrate 163A while operating in the high pressure and power density regime. It also appears to counter the buoyant forces that the discharge is subjected to as the operating pressure is increased—thereby keeping the discharge in good contact with the substrate as the pressure is increased. In particular, at high pressures and high power densities, the discharge 184 is buoyant and tends to float away from the substrate 163A. This limits the ability of active plasma species to be deposited on the substrate 163 for continued diamond or other component growth. Thus, this tunable feature of the disclosed reactors helps to maintain the plasma discharge 184 above and in contact with the substrate 163A for efficient mass transfer of active plasma species to the deposition substrate 163A.

External tuning adjustments can be incorporated into the reactor designs. In the case of Reactors B and C, there are four independent tuning variables: $L_p$, $L_s$, L1, and L2. This experimental tuning versatility enables the nonlinear optimization of discharge positioning, discharge size adjustment, growth rate enhancement, reactor microwave impedance matching (i.e., process optimization), thereby allowing for robust and efficient processes development and an adaptable and versatile overall system operation.

The generalized improved reactor design concept incorporates specific dimensions that allow the coupling/transfer of large amounts of microwave power into the discharge 180 at high pressure. Specifically the dimensions of the reactor are adjusted to enable the transfer/impedance matching of high power fluxes densities of microwave energy that are desirable for high pressure operation from the external waveguides into the small intense high pressure discharge. It does this by unfocusing the EM field in the regions of the quartz dome 180 and then refocusing the microwave energy on the substrate holder/powered electrode 163 without creating any high EM fields (standing waves) elsewhere in the cavity applicator 40.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

Throughout the specification, where the compositions, processes, or apparatus are described as including components, steps, or materials, it is contemplated that the compositions, processes, or apparatus can also comprise, consist essentially of, or consist of, any combination of the recited components or materials, unless described otherwise. Combinations of components are contemplated to include homogeneous and/or heterogeneous mixtures, as would be understood by a person of ordinary skill in the art in view of the foregoing disclosure. Disclosed limits and ranges are understood to encompass both precise and approximate boundaries.

REFERENCES

[1] M. Kamo, H. Yurimuto, Y. Sato, Appl. Surf. Sci. 33/44, 553 (1988).
[2] T. Teraji, Phys. Stat. Sol. (a) 203, 3324-3357 (2006).
[3] T. S. McCauley and Y. K. Vohra, Appl. Physics. Lett. 66, 1486 (1995).

[4] D. King, M. K. Yaran, T. Schuelke, T. A. Grotjohn, D. K. Reinhard and J. Asmussen, Diamond and Related Materials 17 (2008) 520-524.

[5] C.-S. Yan, Y. K. Vohra, H.-K. Mao, and R. L. Hemley, Proc. Natl. Acad. Sci. U.S.A. 99, 12523 (2002).

[6] K. P. Kuo and J. Asmussen, Diamond Relat. Mater. 6 (1997) 1097.

[7] Uwe Kahler, Microwave Plasma Diamond Film Growth, Diplomarbeit Thesis, Michigan State University and Gesamthochschule Wuppertal, 1997.

[8] Y. Mokuno, A. Chayahara, Y. Soda, Y. Horino, N. Fujimori, Diamond Relat. Mater. 14 (2005) 1743.

[9] A. Tallaire, J. Acharda, F. Silvaa, R. S. Sussmanna, A. Gicquel, Diamond Relat. Mater. 14, (2005) 249.

[10] H. Sternschulte, T. Bauer, M. Schreck, B. Stritzker, Diamond Relat. Mater. 15 (2006) 542.

[11] H. Yamada, A. Chayahara, Y. Mokuno, S. Shikata, Diamond Relat. Mater. (2007).

[12] H. Yamada, A. Chayahara, Y. Mokuno, S. Shikata, Diamond Relat. Mater. 17 (2008) 1062.

[13] H. Yamada, A. Chayahara, Y. Mokuno, Y. Horino, S. Shikata, Diamond Relat. Mater. (2006).

[14] H. Yamada, A. Chayahara, Y. Mokuno, Y. Horino, S. Shikata, Diamond Relat. Mater. 15, (2006) 1389.

[15] J. Asmussen, Keynote paper 11, presented at the 2nd Conference on New Diamond and Nano Carbons 2008 May 26-29, Taipei, Taiwan; K. W. Hemawan, T. A. Grotjohn, D. K. Reinhard, J. Asmussen, invited paper presented at ICOPS 2008, Karlsruhe Germany June 2008; T Grotjohn, J. Asmussen invited paper presented at the International Workshop on Strong Microwaves, Russia, August 2008.

[16] F. Silva, K. Hassouni, A. Gicquel, X. Bonnin, invited paper presented at the International Workshop on Strong Microwaves, August 2008.

[17] J. Asmussen, R. Mallavarpu, J. R. Hamann, and H. C. Park, Proceed. IEEE, 62, (1974), 109.

[18] R. Mallavarpu, M. C. Hawley and J. Asmussen, IEEE Trans. On Plasma Sci., PS-6, (1978), 341.

[19] P. L. Kapitza, Soviet Physics JETP, 30 (1970) 973.

[20] K. P. Kuo, Ph.D. Dissertation, Michigan State University, 1997.

[21] S. S. Zuo et al. Diamond Relat. Mater. 17 (2008) 300.

[22] S. Whitehair, and J. Asmussen, J. Propulsion and Power, 3, (1987), 136-144.

[23] S. Offermans, Electrodeless High-power Microwave Discharges, J Appl Phys. 67, 115 (1990).

[24] J Asmussen and D. K. Reinhard, Diamond Films Handbook, Chapter 7, Marcel Dekker, New York, 2002.

[25] J. E Brandenburg, J. Kline, D. Sulliven, IEEE Trans. On Plasma Science 33, 2, 776-782, pt 2 April 2005.

[26] K. D. Diament, B. L. Ziegler, R. B. Cohen, J. of Propulsion and Power, 23, 27-34, January-February 2007.

[27] T. A. Grotjohn, J. Asmussen, J. Sivagnaname, D. Story, A. L. Vikharev, A. Gorbachev, A, Kolysko, Diamond Relat. Mater. 9 (2000) 322.

[28] A. L. Vikharev, A. M. Gorbachev, A. V. Kolysko, D. B. Radishev, and A. B. Muchnikov, Diamond Relat. Mater. 17 (2008) 1055.

[29] K. W. Hemawan, T. A. Grotjohn, D. K. Reinhard, and J. Asmussen, Diamond and Related Materials 19, (2010) 1446-1452.

What is claimed is:

1. A microwave plasma assisted reactor comprising:
    (a) a first microwave chamber having a reference plane at a reference axial location Zo and extending in an axial direction z>Zo, wherein the first microwave chamber comprises:
        (i) a first cylindrical waveguide section positioned adjacent the reference axial location Zo, extending in the axial direction z>Zo away from the reference axial location Zo, and having a radius of R1$a$;
        (ii) a second cylindrical waveguide section positioned adjacent the first cylindrical waveguide section, extending in the axial direction z>Zo away from the first cylindrical waveguide section, and having a radius of R1$b$ such that R1$b$/R1$a$ is greater than 1; and
        iii) an electromagnetic wave source;
    (b) a plasma chamber having an outer wall defining a cylindrical cross section with radius of R2, the plasma chamber extending into the first cylindrical waveguide section of the first microwave chamber such that at least a portion of the plasma chamber is located at z>Zo;
    (c) a conductive stage defining a cylindrical cross section with radius of R3 and having a reference surface extending into the plasma chamber and defining a second microwave chamber in the plasma chamber (i) at z<Z.sub.0 and (ii) between the plasma chamber outer wall and the conductive stage; and
    (d) a conducting short adjustably disposed in the second microwave chamber below Zo and in electrical contact with and movable with respect to the plasma chamber outer wall and the conductive stage, the axial distance between the conducting short and Zo being L2, and the axial distance between the conducting short and the reference surface of the conductive stage being L1;
    wherein:
    R3/R2 is 0.5 or less; and
    geometric scales of the reactor are configured such that, during operation of the reactor, electromagnetic fields are produced in the vicinity of Zo and in the plasma chamber, the electromagnetic fields comprising one or more of a TM01 mode, a TEM001 mode, and evanescent modes.

2. A reactor kit comprising a microwave plasma assisted reactor according to claim 1, wherein the first microwave chamber comprises a plurality of separate, interconnected chamber sections each having a different radius and corresponding to a waveguide section of the first microwave chamber.

3. The microwave plasma assisted reactor of claim 1, wherein R3/R2 is in a range from 0.05 to 0.4.

4. The microwave plasma assisted reactor of claim 1, wherein R3/R2 is in a range from 0.05 to 0.3.

5. The microwave plasma assisted reactor of claim 1, wherein L2 and L1 are capable of adjustment in the reactor by moving the conducting short.

6. The microwave plasma assisted reactor of claim 5, wherein the conductive stage is movable such that both L1 and L2 are capable of independent adjustment during operation of the reactor by moving one or both of the conducting short and the conductive stage.

7. The microwave plasma assisted reactor of claim 1, wherein the conducting short is slidable in an axial direction.

8. The microwave plasma assisted reactor of claim 7, wherein the conductive stage is movable and slidable in the axial direction.

9. A process for depositing a component on a substrate, the process comprising:

(a) providing a microwave plasma assisted reactor according to claim 1, the reactor further comprising a deposition substrate mounted above an upper surface of the conductive stage;
(b) operating the reactor at a pressure ranging from about 10 Torr to about 760 Torr to generate a plasma discharge in the plasma chamber; and
(c) depositing a component on the substrate.

10. The process of claim 9, wherein:
(i) operating the reactor comprises feeding a source gas comprising a hydrogen source gas and a methane source gas to the plasma chamber; and
(ii) the component is selected from the group consisting of single-crystal diamond, microcrystalline polycrystalline diamond, nanocrystalline polycrystalline diamond, and combinations thereof.

11. The process of claim 9, wherein, during parts (b) and (c) of operating the reactor and depositing the component on the substrate, electromagnetic fields are produced in the vicinity of $Z_0$ and the deposition substrate in the plasma chamber, the electromagnetic fields comprising one or more of a $TM_{01}$ mode, a $TEM_{001}$ mode, and evanescent modes.

* * * * *